United States Patent
Kring et al.

(10) Patent No.: US 11,661,025 B2
(45) Date of Patent: May 30, 2023

(54) COMPONENT FOR A VEHICLE INTERIOR

(71) Applicant: Shanghai Yanfeng Jinqiao Automotive Trim Systems Co. Ltd., Novi, MI (US)

(72) Inventors: Christopher Kring, Zeeland, MI (US); Dale Todd Glynn, Allendale, MI (US); Scott Allen Hansen, Holland, MI (US); James Bradley Price, Holland, MI (US); Bryan Todd Jones, Holland, MI (US); Tyler Lacroix, Zeeland, MI (US); Liu Cheng, Shanghai (CN); Wang Bin, Shanghai (CN); Qiongxia Duan, Shanghai (CN)

(73) Assignee: Shanghai Yanfeng Jinqiao Automotive Trim Systems Co. Ltd., Novi, MI (US)

(*) Notice: Subject to any disclaimer, the term of this patent is extended or adjusted under 35 U.S.C. 154(b) by 0 days.

(21) Appl. No.: 17/704,279

(22) Filed: Mar. 25, 2022

(65) Prior Publication Data

US 2022/0212541 A1 Jul. 7, 2022
US 2022/0212541 A1 Jul. 7, 2022

Related U.S. Application Data

(63) Continuation of application No. PCT/US2021/027365, filed on Apr. 14, 2021.

(Continued)

(51) Int. Cl.
*B60R 21/2165* (2011.01)
*B60K 37/06* (2006.01)
(Continued)

(52) U.S. Cl.
CPC ........ *B60R 21/21658* (2013.01); *B60K 35/00* (2013.01); *B60K 37/06* (2013.01);
(Continued)

(58) Field of Classification Search
CPC .............. B60Q 3/54; B60Q 3/14; B60Q 3/20; B60Q 3/70; B60Q 3/283; B60Q 3/80;
(Continued)

(56) References Cited

U.S. PATENT DOCUMENTS 2,147,599 A 2/1939 Becker
3,876,977 A 4/1975 Ladewig
(Continued)

FOREIGN PATENT DOCUMENTS

CN 206383880 U 8/2017
CN 109278846 A 1/2019
(Continued)

OTHER PUBLICATIONS

International Search Report and Written Opinion received for PCT Application Serial No. PCT/US2021/027365 dated Jul. 19, 2021, 25 pages.

(Continued)

*Primary Examiner* — Charles L Beard
(74) *Attorney, Agent, or Firm* — Amin, Turocy & Watson, LLP

(57) ABSTRACT

A vehicle interior component configured to present a user interface for a vehicle occupant with vehicle systems may comprise a housing, cover structure and user interface system to present the user interface at a cover surface. The user interface may comprise a light display to transmit light from a light source and/or an input device comprising a mechanical coupling to interface with a sensor arrangement. The user interface may comprise output from the light display and/or input by interaction with the input device at the cover surface. The component may comprise a module comprising the light display and the input device. The module may comprise an absorber. The light display may comprise a light guide and/or display panel. The light guide (Continued)

may comprise a projection and/or icon to transmit light through an aperture and/or recess of the cover structure.

20 Claims, 38 Drawing Sheets

Related U.S. Application Data

(60) Provisional application No. 63/164,001, filed on Mar. 22, 2021, provisional application No. 63/088,589, filed on Oct. 7, 2020, provisional application No. 63/088,606, filed on Oct. 7, 2020, provisional application No. 63/058,827, filed on Jul. 30, 2020, provisional application No. 63/010,236, filed on Apr. 15, 2020.

(51) Int. Cl.
  B60R 21/203 (2006.01)
  B60R 21/205 (2011.01)
  B62D 1/04 (2006.01)
  B60K 35/00 (2006.01)

(52) U.S. Cl.
  CPC .......... *B60R 21/203* (2013.01); *B60R 21/205* (2013.01); *B62D 1/046* (2013.01); *B60K 2370/119* (2019.05); *B60K 2370/1446* (2019.05); *B60K 2370/157* (2019.05); *B60K 2370/158* (2019.05); *B60K 2370/33* (2019.05); *B60K 2370/336* (2019.05); *B60K 2370/52* (2019.05); *H03K 2217/96015* (2013.01); *H03K 2217/9651* (2013.01)

(58) Field of Classification Search
  CPC .... B60Q 9/00; B60Q 3/233; B60R 21/21658; B60R 21/203; B60R 21/205; B60R 16/023; B60R 13/02; B60R 16/027; B60R 2013/0287; B60R 16/03; B60K 35/00; B60K 37/06; B60K 2370/1446; B60K 2370/158; B60K 2370/336; B60K 2370/119; B60K 2370/33; B60K 2370/52; B60K 2370/157; B60K 37/02; B60K 37/04; B60K 2370/16; B60K 2370/332; B60K 2370/339; B60K 2370/782; B62D 1/046; B62D 1/06; H03K 2217/96015; H03K 2217/9651; H05K 1/0274; H05K 1/189; H05K 3/12; H05K 3/285; H05K 3/303; H05K 2201/10053; H05K 2201/10106; H05K 2201/10151; H05K 1/165; H05K 2201/10098; B60N 2/58
  See application file for complete search history.

(56) References Cited

U.S. PATENT DOCUMENTS

| | | | |
|---|---|---|---|
| 4,835,512 A | 5/1989 | Bratton | |
| 5,062,604 A | 11/1991 | Monnier | |
| 5,303,952 A | 4/1994 | Shermetaro et al. | |
| 5,423,569 A | 6/1995 | Reighard et al. | |
| 5,438,314 A | 8/1995 | Evans | |
| 5,666,102 A * | 9/1997 | Lahiff | B60K 35/00 |
| | | | 340/461 |
| 5,942,815 A | 8/1999 | Neuman et al. | |
| 6,135,494 A | 10/2000 | Lotito et al. | |
| 6,236,309 B1 | 5/2001 | Haag et al. | |
| 6,296,380 B1 | 10/2001 | Dawli | |
| 7,100,959 B1 | 9/2006 | Herrera, Jr. | |
| 8,093,520 B2 * | 1/2012 | Bayley | H01H 13/83 |
| | | | 200/313 |
| 8,094,127 B2 * | 1/2012 | Young | B60K 35/00 |
| | | | 345/173 |
| 8,207,872 B2 | 6/2012 | Huang et al. | |
| 8,317,247 B2 | 11/2012 | Beau et al. | |
| 8,376,596 B2 | 2/2013 | Beau et al. | |
| 8,596,803 B2 * | 12/2013 | Schultz | B60Q 3/78 |
| | | | 362/489 |
| 8,641,251 B2 | 2/2014 | Oeuvrard et al. | |
| 8,777,290 B1 | 7/2014 | Boese | |
| 8,777,466 B2 | 7/2014 | Oeuvrard et al. | |
| 8,909,419 B2 | 12/2014 | Park | |
| 9,007,190 B2 | 4/2015 | Bosch et al. | |
| 9,308,857 B2 | 4/2016 | Lisseman et al. | |
| 9,308,930 B2 | 4/2016 | Bostick et al. | |
| 9,513,707 B2 * | 12/2016 | Lisseman | G06F 3/0414 |
| 9,523,593 B2 | 12/2016 | Kunitachi et al. | |
| 9,767,942 B2 | 9/2017 | Oeuvrard et al. | |
| 9,815,406 B2 | 11/2017 | Lisseman et al. | |
| 9,829,980 B2 | 11/2017 | Lisseman et al. | |
| 9,898,087 B2 | 2/2018 | Lisseman et al. | |
| 9,975,469 B2 | 5/2018 | Guerreiro | |
| 10,007,342 B2 | 6/2018 | Lisseman et al. | |
| 10,053,132 B2 | 8/2018 | Pitzer | |
| 10,086,753 B2 | 10/2018 | Ebina | |
| 10,179,541 B2 | 1/2019 | Lisseman et al. | |
| 10,180,723 B2 | 1/2019 | Lisseman et al. | |
| 10,220,775 B2 | 3/2019 | Ebina | |
| 10,241,579 B2 | 3/2019 | Lisseman et al. | |
| 10,272,836 B2 | 4/2019 | Ali et al. | |
| 10,414,439 B2 | 9/2019 | Spencer et al. | |
| 10,464,476 B1 * | 11/2019 | Mazuir | F21V 33/006 |
| 10,545,498 B2 * | 1/2020 | Christiansen | G05D 1/021 |
| 10,569,703 B2 | 2/2020 | Kamei et al. | |
| 10,696,217 B2 | 6/2020 | Lisseman et al. | |
| 10,696,218 B1 * | 6/2020 | Kontani | B60Q 3/283 |
| 10,780,909 B2 | 9/2020 | Aerts | G06F 3/016 |
| 10,821,889 B2 * | 11/2020 | DeGrote | B60Q 3/64 |
| 11,061,475 B2 * | 7/2021 | Galan Garcia | B60R 16/037 |
| 11,104,229 B2 * | 8/2021 | Galan Garcia | B60Q 3/745 |
| 11,157,114 B1 * | 10/2021 | Herman | G06F 3/016 |
| 11,225,191 B2 * | 1/2022 | Ali | B62D 1/06 |
| 11,238,760 B2 * | 2/2022 | Thompson | G09F 13/044 |
| 11,325,290 B2 * | 5/2022 | Stroebe | B29C 43/203 |
| 11,345,303 B2 * | 5/2022 | Kring | G06F 3/03547 |
| 11,383,639 B1 * | 7/2022 | Kwon | B60Q 3/64 |
| 11,407,150 B2 * | 8/2022 | Thielhorn | B29C 44/1261 |
| 2005/0021190 A1 | 1/2005 | Worrell et al. | |
| 2005/0134559 A1 | 6/2005 | Hein et al. | |
| 2007/0062753 A1 * | 3/2007 | Yoshida | G08B 21/06 |
| | | | 180/333 |
| 2008/0143505 A1 * | 6/2008 | Maruyama | B60K 35/00 |
| | | | 701/532 |
| 2008/0157605 A1 * | 7/2008 | Bowden | H03K 17/96 |
| | | | 280/751 |
| 2008/0203755 A1 | 8/2008 | Bourgeois-Jacquet et al. | |
| 2009/0121459 A1 * | 5/2009 | Bostick | B60Q 3/16 |
| | | | 280/728.3 |
| 2009/0189373 A1 * | 7/2009 | Schramm | B60R 11/0264 |
| | | | 280/731 |
| 2009/0301852 A1 * | 12/2009 | Keist | H01H 13/14 |
| | | | 200/341 |
| 2010/0102538 A1 * | 4/2010 | Paxton | B60Q 3/283 |
| | | | 428/31 |
| 2010/0154261 A1 * | 6/2010 | Bozlo | G09F 21/049 |
| | | | 156/247 |
| 2010/0250071 A1 * | 9/2010 | Pala | G06F 3/016 |
| | | | 341/20 |
| 2010/0268426 A1 * | 10/2010 | Pathak | G06F 3/04886 |
| | | | 345/173 |
| 2011/0032715 A1 | 2/2011 | Beau et al. | |
| 2011/0057465 A1 | 3/2011 | Beau et al. | |
| 2011/0157906 A1 | 6/2011 | Oeuvrard et al. | |
| 2011/0182081 A1 | 7/2011 | Oeuvrard et al. | |
| 2012/0051067 A1 * | 3/2012 | Murray | G09F 13/22 |
| | | | 29/592.1 |

(56) References Cited

U.S. PATENT DOCUMENTS

| | | | |
|---|---|---|---|
| 2012/0074674 A1 | 3/2012 | Ohoka et al. | |
| 2012/0074725 A1* | 3/2012 | Jeon | B60R 13/02 362/509 |
| 2012/0188779 A1* | 7/2012 | Schultz | B60Q 3/64 29/592.1 |
| 2012/0235935 A1* | 9/2012 | Ciesla | G06F 3/047 345/173 |
| 2012/0305377 A1* | 12/2012 | Hou | H04M 1/0266 200/534 |
| 2012/0313392 A1* | 12/2012 | Bingle | B60Q 1/323 29/428 |
| 2012/0320615 A1* | 12/2012 | Englert | B60Q 1/323 362/511 |
| 2013/0128587 A1* | 5/2013 | Lisseman | G06F 3/016 362/276 |
| 2013/0319171 A1* | 12/2013 | Momen | B62D 1/04 74/552 |
| 2013/0336004 A1* | 12/2013 | Mulder | B60Q 3/217 362/609 |
| 2014/0008999 A1* | 1/2014 | Prest | G01L 1/22 307/119 |
| 2014/0136013 A1 | 5/2014 | Wolverton et al. | |
| 2014/0145840 A1 | 5/2014 | Guerreiro | |
| 2014/0210190 A1* | 7/2014 | Bosch | B60R 21/203 280/728.3 |
| 2014/0307179 A1* | 10/2014 | Zhao | G06F 1/1643 349/12 |
| 2014/0376204 A1 | 12/2014 | Kunitachi et al. | |
| 2015/0002404 A1* | 1/2015 | Hooton | B62D 1/046 345/184 |
| 2015/0043193 A1* | 2/2015 | Chiba | H01H 9/182 362/23.05 |
| 2015/0108742 A1* | 4/2015 | Bosch | B60R 21/215 280/728.3 |
| 2015/0279523 A1* | 10/2015 | Oeuvrard | H01C 10/12 338/47 |
| 2015/0291032 A1* | 10/2015 | Kim | G06F 3/04883 280/779 |
| 2015/0294540 A1* | 10/2015 | Hori | G09F 13/0409 340/815.45 |
| 2015/0375678 A1* | 12/2015 | Salter | B60Q 3/283 362/464 |
| 2016/0001807 A1 | 1/2016 | Hans et al. | |
| 2016/0004362 A1* | 1/2016 | Kring | H05K 1/0298 345/174 |
| 2016/0055991 A1* | 2/2016 | Kropf | G07C 9/00944 200/5 A |
| 2016/0103541 A1* | 4/2016 | Andrews | G06F 3/03547 345/173 |
| 2016/0124623 A1* | 5/2016 | Chang | B60K 35/00 345/173 |
| 2016/0144785 A1* | 5/2016 | Shimizu | B60R 11/02 340/435 |
| 2016/0272111 A1* | 9/2016 | Teng | F21V 3/02 |
| 2016/0280128 A1* | 9/2016 | Cannon | B60Q 3/225 |
| 2016/0325674 A1* | 11/2016 | Krull | B60Q 3/14 |
| 2017/0151906 A1 | 6/2017 | Sakuma | |
| 2017/0212633 A1* | 7/2017 | You | G06F 3/0412 |
| 2017/0291493 A1* | 10/2017 | Bostick | B60Q 9/00 |
| 2018/0015826 A1 | 1/2018 | Ahmad et al. | |
| 2018/0018023 A1* | 1/2018 | Nakamura | G06F 1/1626 |
| 2018/0065547 A1* | 3/2018 | Kirilenko | F16H 65/42 |
| 2018/0119922 A1* | 5/2018 | Yamaguchi | B60Q 3/14 |
| 2018/0197460 A1* | 7/2018 | Johnson | G09F 23/00 |
| 2018/0208111 A1 | 7/2018 | Lisseman et al. | |
| 2018/0208212 A1* | 7/2018 | Suessenguth | B60W 30/12 |
| 2018/0339938 A1* | 11/2018 | Bellman | C04B 41/5025 |
| 2019/0001870 A1* | 1/2019 | Laluet | B60K 35/00 |
| 2019/0009716 A1 | 1/2019 | Scalea et al. | |
| 2019/0056794 A1 | 2/2019 | Goldberg et al. | |
| 2019/0135199 A1* | 5/2019 | Galan Garcia | B60K 35/00 |
| 2019/0149607 A1* | 5/2019 | Shim | B60Q 3/16 307/10.1 |
| 2019/0202290 A1* | 7/2019 | Havemann | B60Q 3/54 |
| 2019/0210519 A1* | 7/2019 | Kim | B60Q 3/18 |
| 2019/0210520 A1* | 7/2019 | Marc | B60Q 3/66 |
| 2019/0248284 A1 | 8/2019 | Ali et al. | |
| 2019/0275935 A1* | 9/2019 | Lisseman | B60Q 3/62 |
| 2019/0283690 A1* | 9/2019 | Hansen | B32B 27/06 |
| 2019/0285878 A1* | 9/2019 | Hansen | G02F 1/133502 |
| 2019/0326908 A1* | 10/2019 | Salter | H03K 17/962 |
| 2019/0337566 A1* | 11/2019 | Weidig | B62D 15/02 |
| 2019/0344689 A1* | 11/2019 | Bailey | B60R 16/027 |
| 2020/0001782 A1* | 1/2020 | Kamei | B62D 1/06 |
| 2020/0016807 A1* | 1/2020 | Hairer | B29C 45/1671 |
| 2020/0039559 A1* | 2/2020 | Aerts | H03K 17/962 |
| 2020/0083886 A1* | 3/2020 | Vemulapati | H03K 17/955 |
| 2020/0089226 A1* | 3/2020 | Breisinger | B62D 1/06 |
| 2020/0108768 A1* | 4/2020 | Ali | H05K 3/303 |
| 2020/0122672 A1* | 4/2020 | Murai | B60R 11/04 |
| 2020/0139814 A1* | 5/2020 | Galan Garcia | B32B 5/022 |
| 2020/0164795 A1* | 5/2020 | DeGrote | B60Q 3/64 |
| 2020/0198535 A1* | 6/2020 | Kontani | F21V 7/00 |
| 2020/0210003 A1* | 7/2020 | Hong | H10N 30/80 |
| 2020/0238824 A1* | 7/2020 | Park | G06F 3/03547 |
| 2020/0273429 A1* | 8/2020 | Broy | B60K 35/00 |
| 2020/0369007 A1* | 11/2020 | Bau | B32B 17/10293 |
| 2021/0023586 A1* | 1/2021 | Kondou | B60K 37/02 |
| 2021/0070014 A1 | 3/2021 | Sun et al. | |
| 2021/0086617 A1* | 3/2021 | Jeon | B60K 37/06 |
| 2021/0159032 A1 | 5/2021 | Kuo et al. | |
| 2021/0188091 A1* | 6/2021 | Whitehead | B60K 37/06 |
| 2021/0201355 A1* | 7/2021 | van den Berg | B60W 60/001 |
| 2021/0284063 A1* | 9/2021 | Wang | F21V 9/40 |
| 2021/0309106 A1* | 10/2021 | Bachmeier | B60Q 3/62 |
| 2021/0331732 A1* | 10/2021 | Justinger | G01S 17/06 |
| 2021/0347260 A1* | 11/2021 | Lambright | G06F 3/0488 |
| 2021/0362594 A1 | 11/2021 | Mohana et al. | |
| 2022/0001827 A1* | 1/2022 | Kring | B60R 21/21658 |
| 2022/0024378 A1* | 1/2022 | Yang | B60Q 3/14 |
| 2022/0212541 A1* | 7/2022 | Kring | B60K 35/00 |
| 2022/0238497 A1* | 7/2022 | Brandl | B32B 17/10788 |
| 2022/0306189 A1* | 9/2022 | Ojima | B60K 35/00 |

FOREIGN PATENT DOCUMENTS

| | | |
|---|---|---|
| CN | 109703453 A | 5/2019 |
| CN | 109720271 A | 5/2019 |
| CN | 209581302 U | 11/2019 |
| CN | 110539691 A | 12/2019 |
| DE | 103 46 691 B4 | 2/2013 |
| DE | 10 2016 116 595 A1 | 3/2017 |
| DE | 10 2016 116 596 A1 | 3/2017 |
| DE | 10 2018 200 591 A1 | 7/2019 |
| EP | 2 236 342 A1 | 10/2010 |
| EP | 2 318 235 A1 | 2/2012 |
| EP | 2 318 236 A1 | 2/2012 |
| EP | 2 426 012 A1 | 3/2012 |
| EP | 2 268 499 B1 | 9/2013 |
| EP | 2 841 302 A1 | 3/2015 |
| EP | 2 834 130 B1 | 7/2018 |
| EP | 2 271 518 B1 | 9/2018 |
| EP | 3 124 352 B1 | 9/2018 |
| EP | 3 127 776 B1 | 12/2018 |
| EP | 3 180 225 B1 | 3/2019 |
| EP | 2 731 817 B1 | 5/2019 |
| FR | 2 824 510 B1 | 8/2003 |
| FR | 2 911 555 B1 | 4/2009 |
| FR | 2 917 350 B1 | 12/2009 |
| FR | 2 920 119 B1 | 2/2010 |
| FR | 2 920 120 B1 | 3/2010 |
| FR | 2 930 918 B1 | 6/2010 |
| FR | 2 937 928 B1 | 12/2010 |
| FR | 2 937 929 B1 | 1/2011 |
| FR | 2 937 604 B1 | 3/2011 |
| FR | 3 056 767 B1 | 7/2019 |
| WO | 2009/151253 A3 | 3/2010 |

(56) References Cited

FOREIGN PATENT DOCUMENTS

| WO | 2013/160588 A1 | 10/2013 |
| WO | 2019/233983 A1 | 12/2019 |
| WO | 2020/028625 A1 | 2/2020 |

OTHER PUBLICATIONS

Non-Final Office Action received for U.S. Appl. No. 17/481,022 dated Jan. 3, 2022, 45 pages.

* cited by examiner

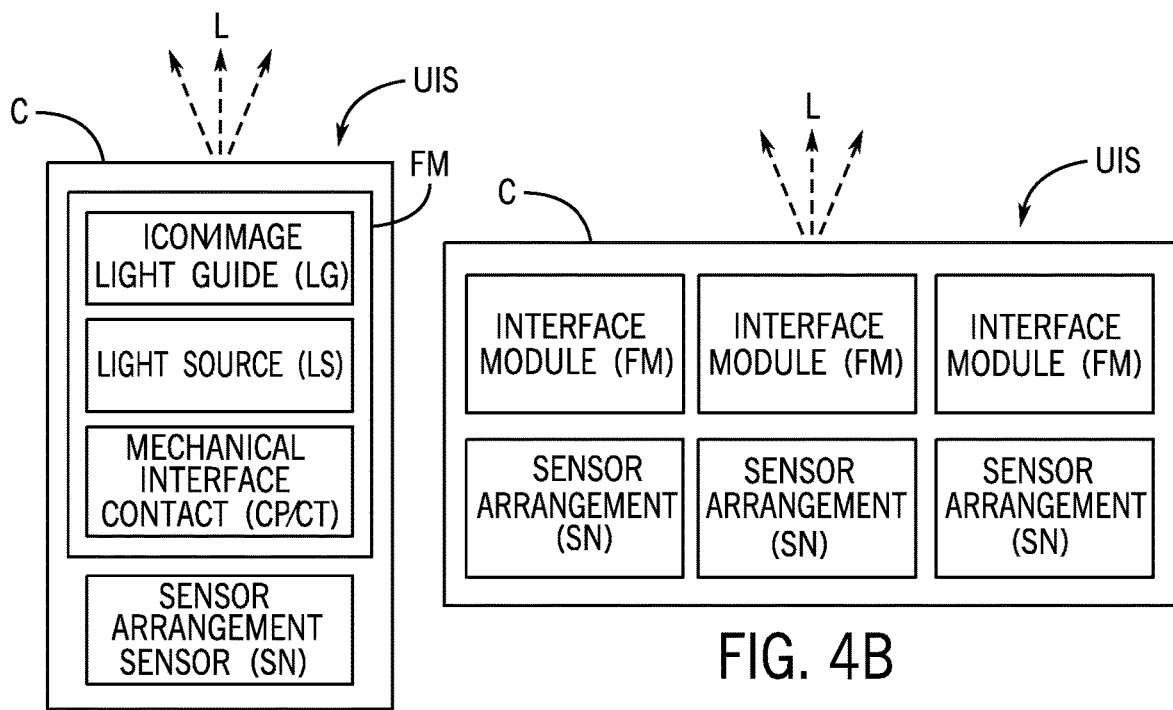
FIG. 4A
FIG. 4B
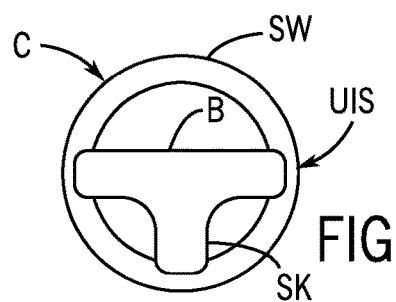
FIG. 5A
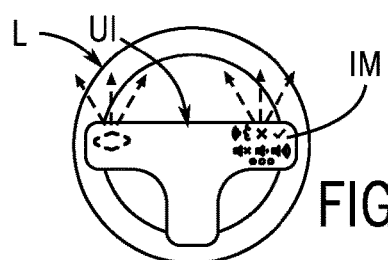
FIG. 5B
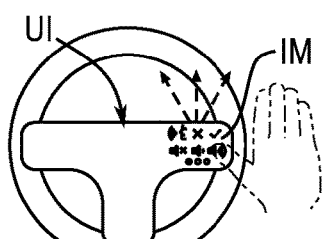
FIG. 5C
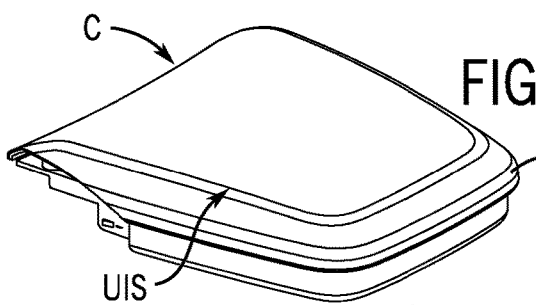
FIG. 6A
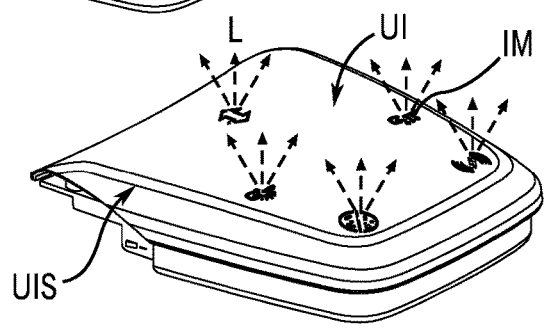
FIG. 6B
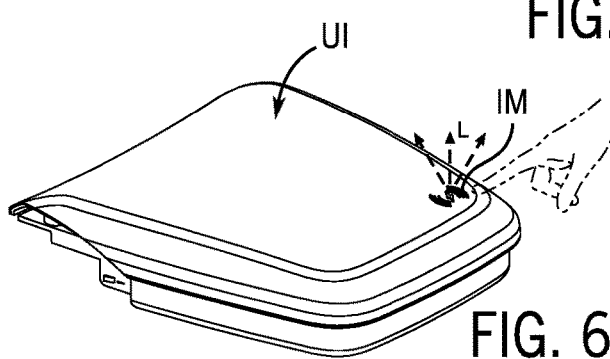
FIG. 6C

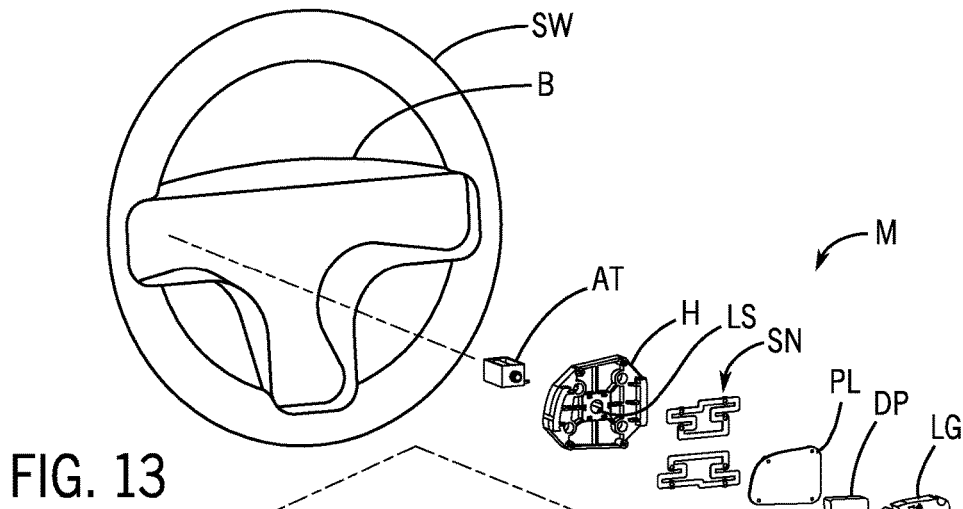
FIG. 13
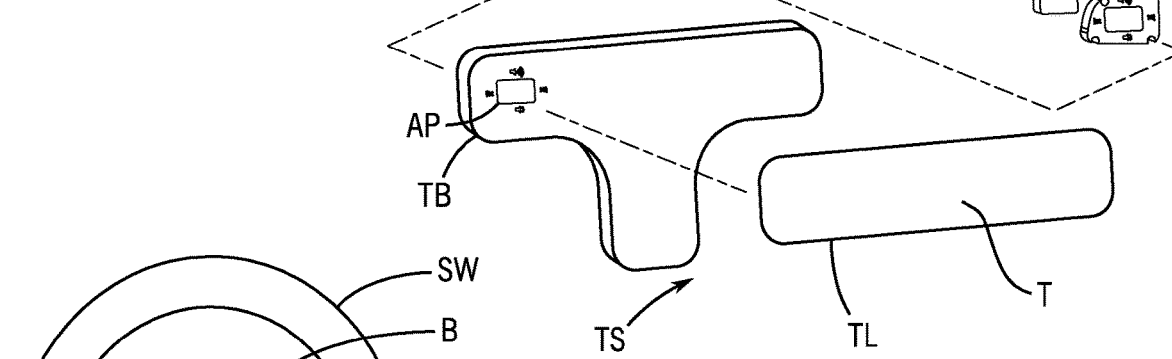
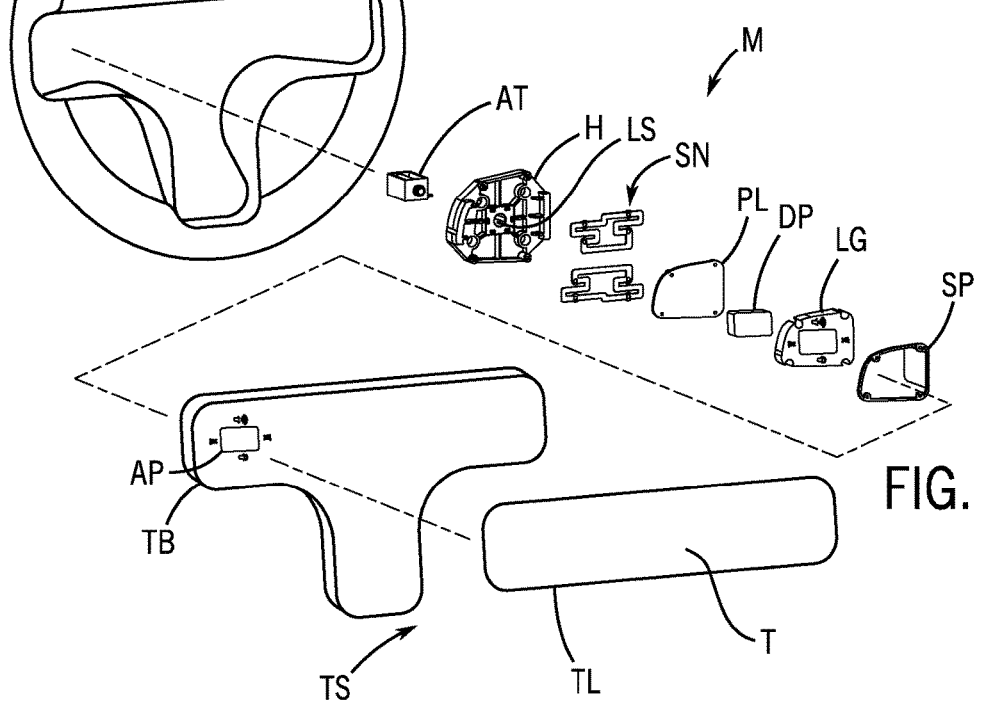
FIG. 14

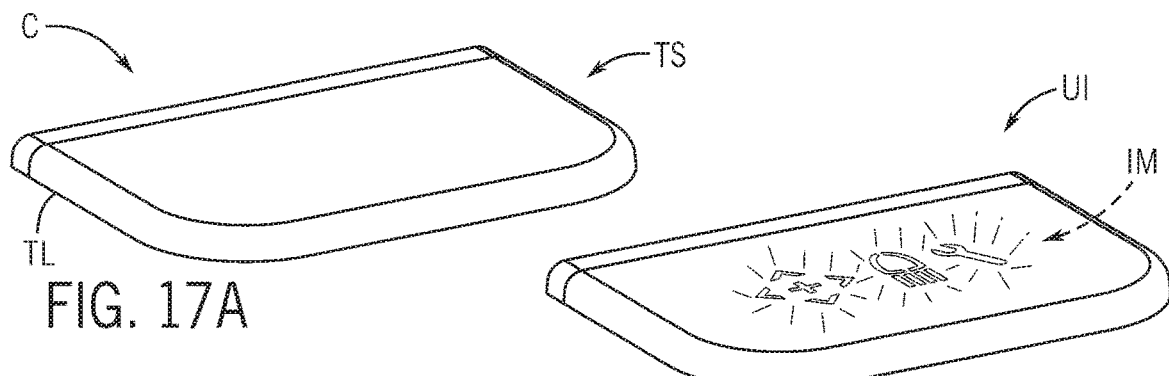
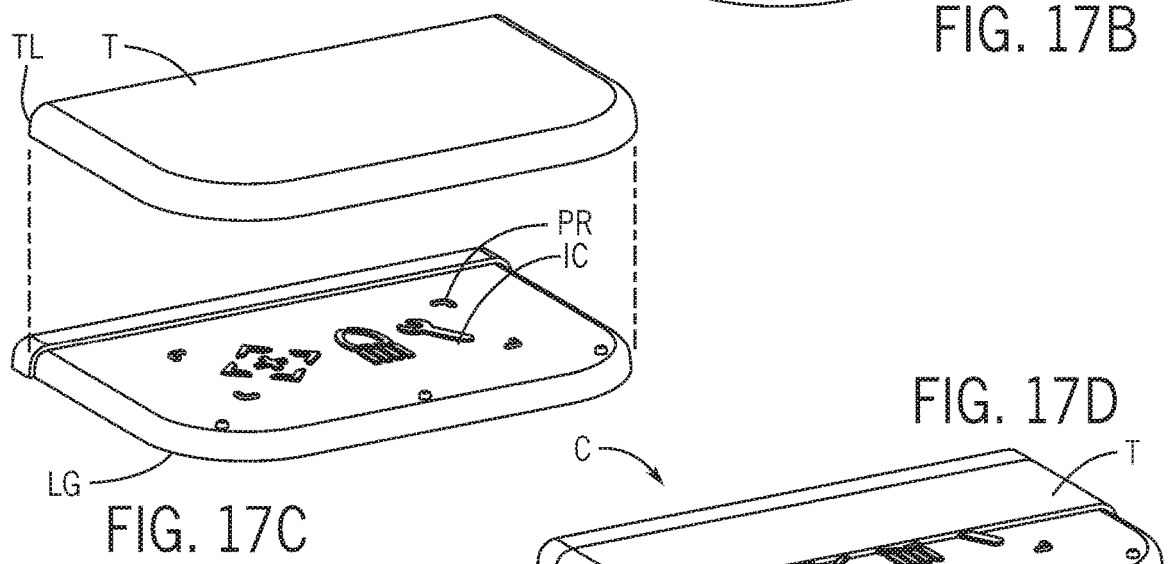
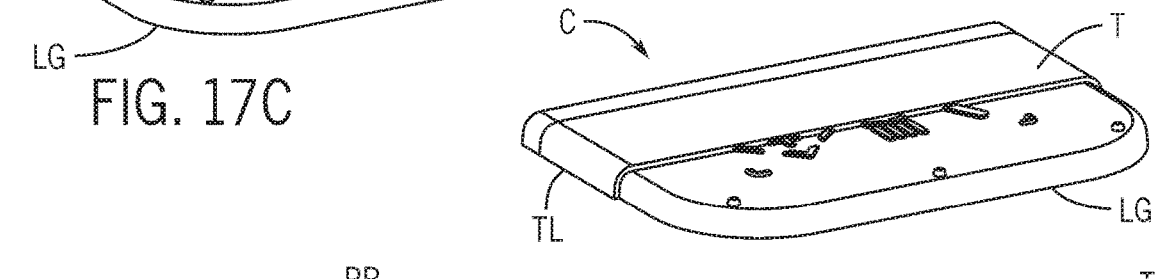
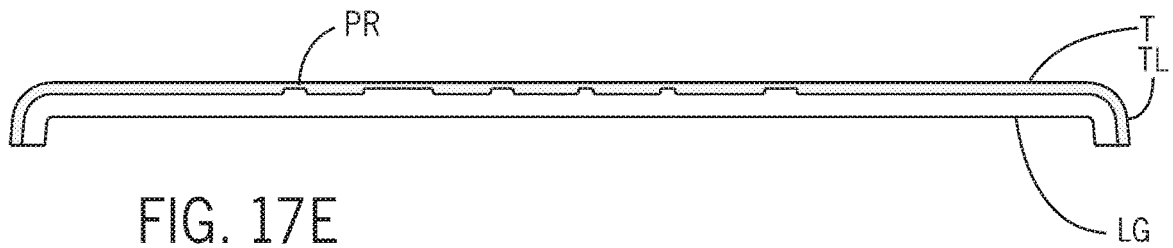

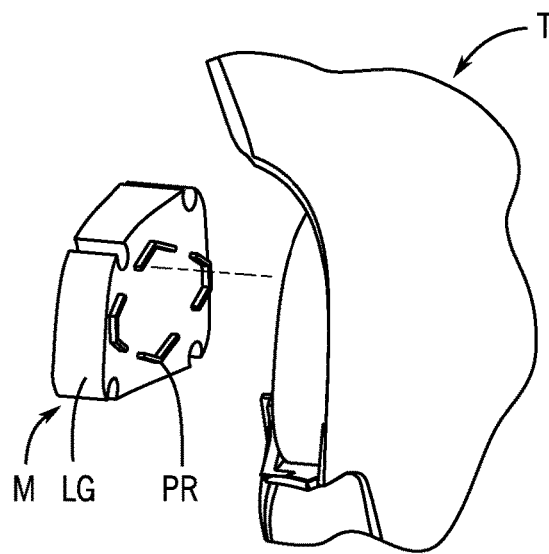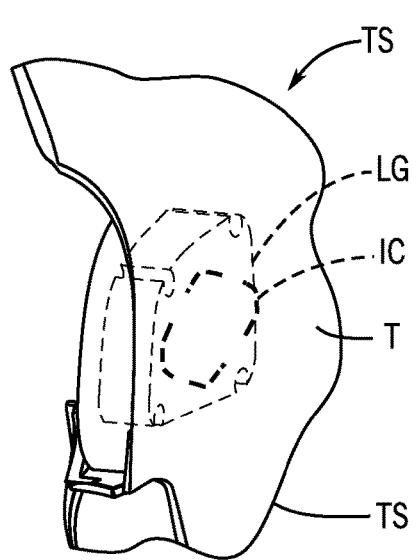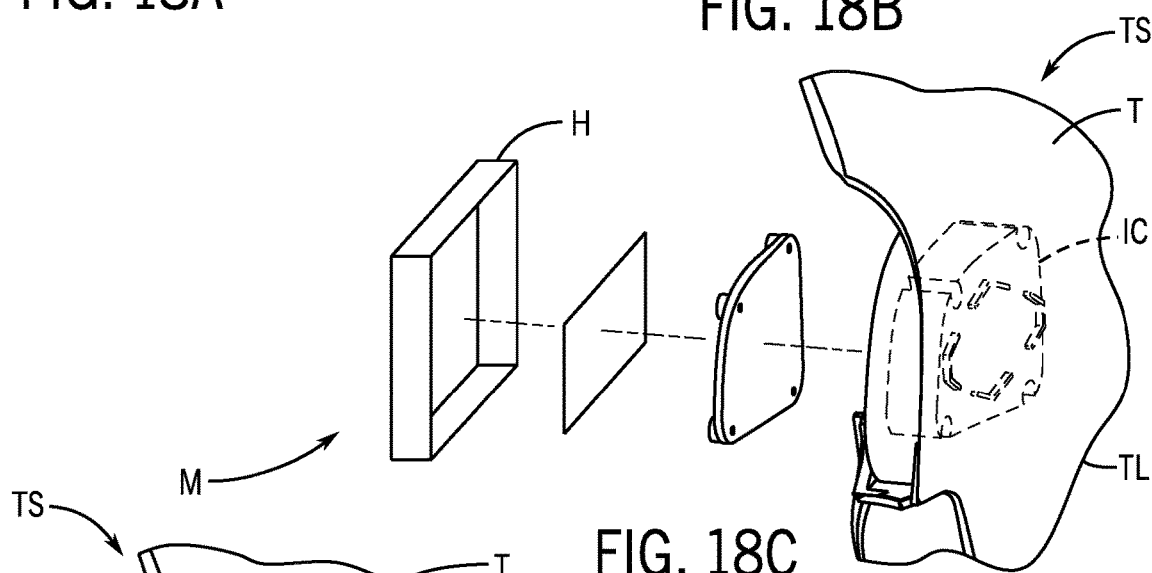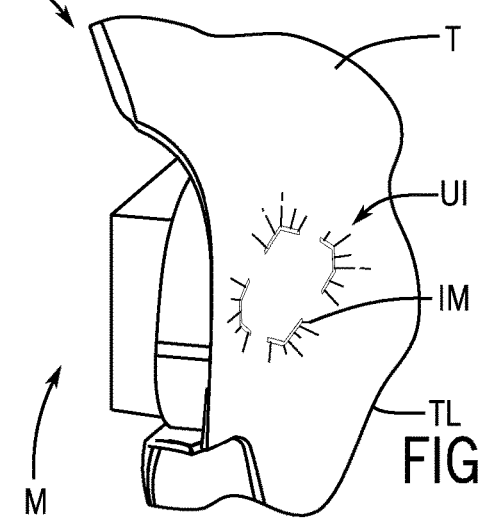
FIG. 18A
FIG. 18B
FIG. 18C
FIG. 18D

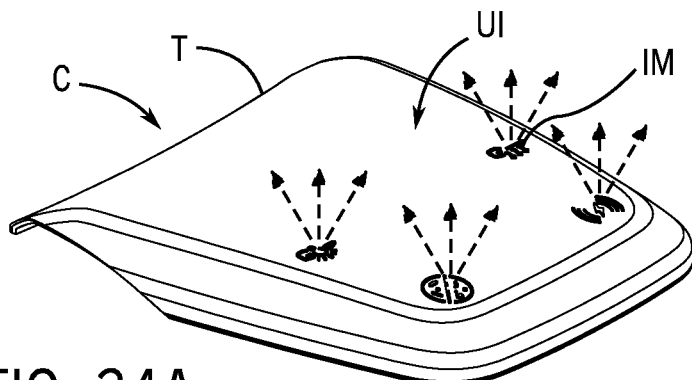
FIG. 34A
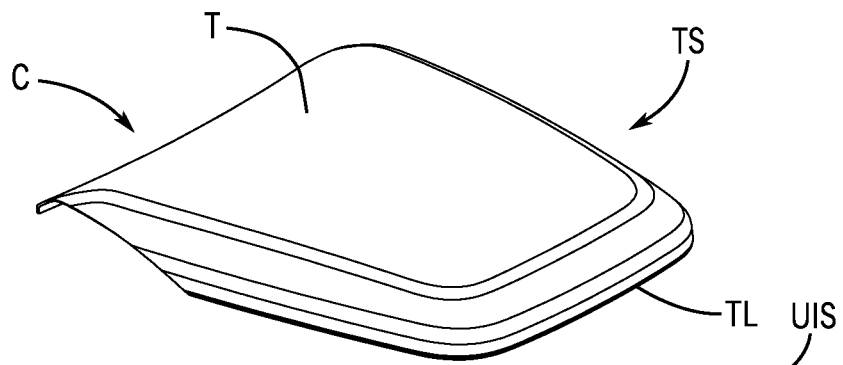
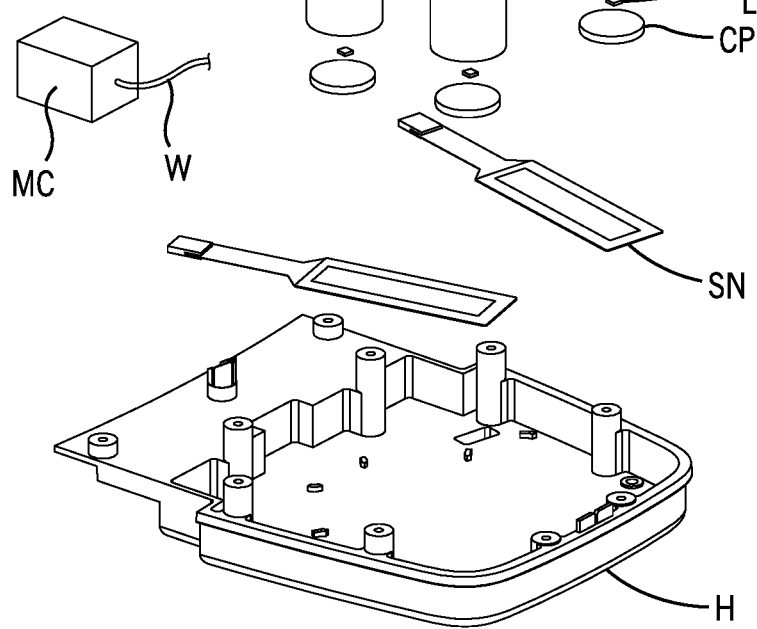
FIG. 34B

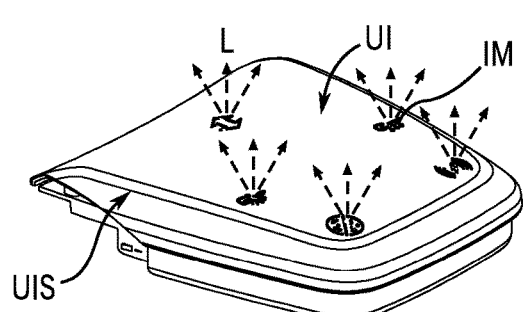
FIG. 35A
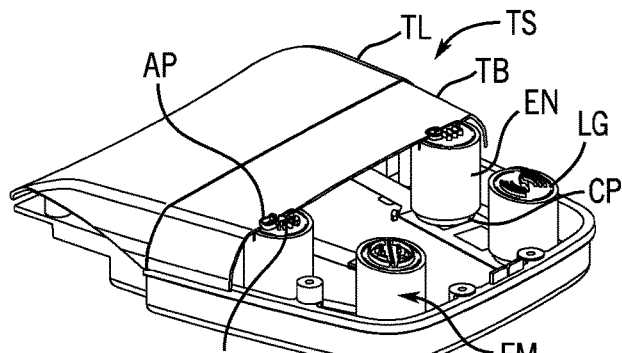
FIG. 35B
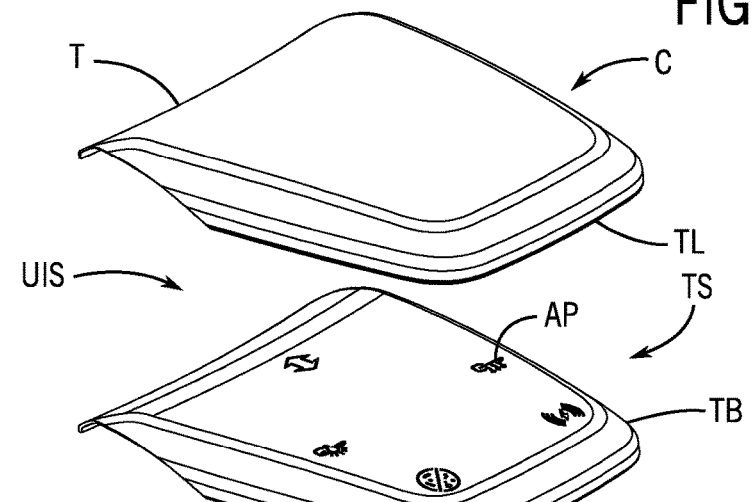
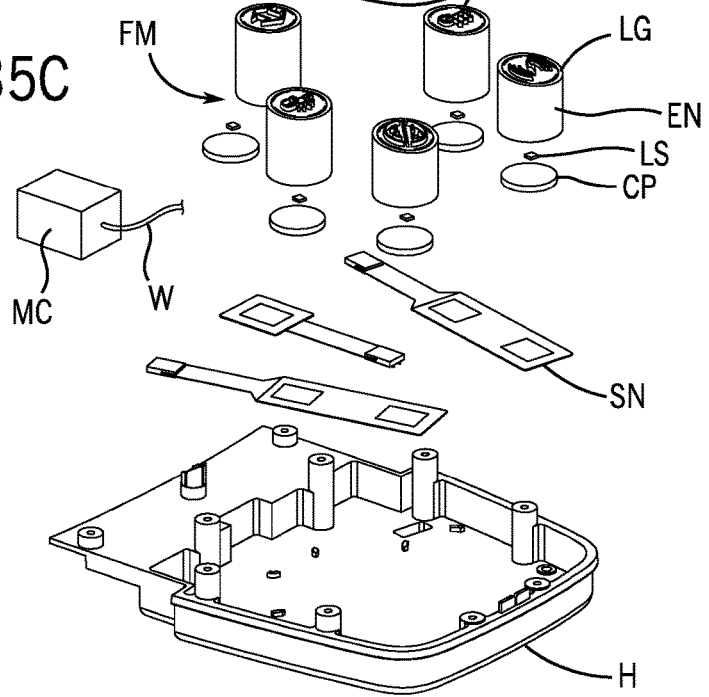
FIG. 35C

COMPONENT FOR A VEHICLE INTERIOR

CROSS-REFERENCE TO RELATED APPLICATIONS

The present application is a continuation of PCT/International Patent Application No. PCT/US21/27365 titled "VEHICLE INTERIOR COMPONENT" filed Apr. 14, 2021, which claims the benefit of U.S. Provisional Patent Application No. 63/164,001 titled "VEHICLE INTERIOR COMPONENT" filed Mar. 22, 2021 and U.S. Provisional Patent Application No. 63/088,606 titled "VEHICLE INTERIOR COMPONENT" filed Oct. 7, 2020 and U.S. Provisional Patent Application No. 63/088,589 titled "VEHICLE INTERIOR COMPONENT" filed Oct. 7, 2020 and U.S. Provisional Patent Application No. 63/058,827 titled "VEHICLE INTERIOR COMPONENT" filed Jul. 30, 2020 and U.S. Provisional Patent Application No. 63/010,236 titled "VEHICLE INTERIOR COMPONENT" filed Apr. 15, 2020.

The present application claims priority to and incorporates by reference in full the following patent applications: (a) U.S. Provisional Patent Application No. 63/010,236 titled "VEHICLE INTERIOR COMPONENT" filed Apr. 15, 2020; (b) U.S. Provisional Patent Application No. 63/058,827 titled "VEHICLE INTERIOR COMPONENT" filed Jul. 30, 2020; (c) U.S. Provisional Patent Application No. 63/088,589 titled "VEHICLE INTERIOR COMPONENT" filed Oct. 7, 2020; (d) U.S. Provisional Patent Application No. 63/088,606 titled "VEHICLE INTERIOR COMPONENT" filed Oct. 7, 2020; (e) U.S. Provisional Patent Application No. 63/164,001 titled "VEHICLE INTERIOR COMPONENT" filed Mar. 22, 2021; (f) PCT/International Patent Application No. PCT/US21/27365 titled "VEHICLE INTERIOR COMPONENT" filed Apr. 14, 2021.

FIELD

The present invention relates to a vehicle interior component.

The present invention also relates to a vehicle interior component configured to present a user interface.

BACKGROUND

It is known to It is known to provide a vehicle interior component providing a user interface.

It would be advantageous to an improved vehicle interior component with a cover and comprising a user interface system configured to provide a light display and/or an input device presenting a user interface for a vehicle occupant.

SUMMARY

The present invention relates to a vehicle interior component configured to provide a user interface system comprising at least one sensor and at least one light source and configured to provide a user interface for interaction with a vehicle occupant in a vehicle providing at least one vehicle system comprising a cover configured to present the user interface for the vehicle occupant, a sensor configured to detect input from the vehicle occupant at or adjacent to the cover, a mechanical coupling, and an interface module comprising an enclosure. The enclosure may be configured to enclose and support a light source for the user interface. The mechanical coupling may be configured to transmit force at the user interface to the sensor. The user interface for the vehicle occupant may comprise a light display from at least one light source of the user interface system and an input device connected to at least one sensor of the user interface system. The mechanical coupling may be configured to compress in response to force at the user interface. The component may comprise a light guide formed from a resin material. The component may comprise an interface configured to move from a default position to a depressed position to compress the mechanical coupling. The mechanical coupling may comprise at least one of (a) urethane; (b) silicone; (c) foam. The mechanical coupling may comprise a top layer and a bottom layer.

The present invention relates to a vehicle interior component configured to provide a user interface system comprising at least one light source and configured to provide a user interface for interaction with a vehicle occupant in a vehicle providing at least one vehicle system comprising a cover configured to present the user interface for the vehicle occupant, and a light guide configured to allow transmission of light from the at least one light source to the light display for the user interface. The user interface for the vehicle occupant may comprise a light display from at least one light source of the user interface system and an input device connected to at least one sensor of the user interface system. The cover may be configured to cover the light guide. The light guide may comprise a projection and the cover may comprise a recess. The projection may extend into the recess. The cover may be molded on the light guide. An inner surface of the cover may be coupled to the projection of the light guide. The projection may comprise an angled surface. The cover may comprise an injection molded thermoplastic elastomer. The component may comprise a button; the cover may be configured to prevent visibility of the button when the at least one light source is off. The light guide with the projection may be formed from a resin material.

The present invention relates to a component for a vehicle interior configured to present a user interface for interaction with an occupant of the vehicle comprising at illumination from at least one light source comprising a composite structure comprising a cover and a module. The cover may comprise a surface. The module may comprise a light guide. The module may be integrated with the light guide of the module and may be configured to allow transmission of light from the at least one light source to the surface of the cover to present the user interface. The light guide of the module may be configured to present a light display for the user interface. The light source may be configured to provide illumination to the light display for the user interface. The module may comprise a projection and the cover may comprise a recess; the projection may extend into the recess. The light guide may be formed from a resin material. The cover may be configured to cover the light guide. The component may comprise a cover assembly comprising the cover. The projection may comprise a height and the cover may comprise a thickness; the thickness may be generally greater than the height. The module may comprise a light module. The module may be integrally formed with the light guide. The module may comprise an absorber configured to at least one of (a) absorb sound; (b) absorb vibration; (c) absorb assembly tolerance.

The present invention relates to a component for a vehicle interior configured to present a user interface for an occupant of the vehicle interior with at least one vehicle system comprising a housing, a cover structure comprising a cover surface, a user interface system configured to present the user interface at the cover surface comprising a light display configured to transmit light from at least one light source and an input device configured to provide an interface with at least one sensor in the housing, and an interface module comprising the input device. The user interface may be configured to comprise output from the light display at the cover surface transmitted by the light source. The user interface may be configured to comprise input by interaction of the occupant with the input device at the cover surface through the interface with at least one sensor. The interface with at least one sensor may comprise a feature on the interface module. The feature may comprise at least one projection. The light source may be oriented to output light perpendicular to the cover surface. The feature may comprise at least one indentation. The input device may comprise a pressure-sensitive device; input may comprise pressure at the cover surface of the cover structure. The interface with at least one sensor may comprise contact by the input device through a coupling layer; contact may comprise contact by the feature on the interface module with the coupling layer. The interface with at least one sensor may comprise a coupling layer; the interface with at least one sensor may comprise contact by the input device through the coupling layer. The coupling layer may comprise a first layer of a first material and a second layer of a second material. The coupling layer may comprise a compressible material; input by interaction of the occupant with the input device may comprise contact by the feature on the interface module through the compressible material of the coupling layer. The component may comprise a set of light displays and a set of input devices; the interface module may comprise a set of interface modules. The input device may comprise a button; the cover surface may be configured to prevent visibility of the button when the at least one light source is off. Output may be configured to comprise light from the light display at the cover surface; light may comprise an image illuminated for the light display at the cover surface.

The present invention relates to a component for a vehicle interior configured to present a user interface for an occupant of the vehicle interior with at least one vehicle system comprising a housing, a cover structure comprising a cover surface, and a user interface system configured to present the user interface at the cover surface comprising a light display configured to transmit light from at least one light source and an input device configured to provide an interface with at least one sensor in the housing. The user interface may be configured to comprise output from the light display at the cover surface transmitted by the light source. The user interface may be configured to comprise input by interaction of the occupant with the input device at the cover surface through the interface with at least one sensor. The light display may comprise a light guide comprising at least one projection. The light guide with the at least one projection may be formed from a resin material. The at least one projection may be configured to transmit light from the light guide through at least one of (a) recesses in an inner surface of the cover structure or (b) apertures in an inner surface of the cover structure. The light display may comprise at least one icon configured to be illuminated by the light source; the at least one projection may comprise the at least one icon. The cover structure may comprise at least one of (a) apertures for the at least one projection and/or (b) recesses for the at least one projection. The light guide and the at least one projection may comprise a light-transmissive resin material.

The present invention relates to a component for a vehicle interior configured to present a user interface for an occupant of the vehicle interior with at least one vehicle system comprising a housing, a cover structure comprising a cover surface, and a user interface system configured to present the user interface at the cover surface comprising a light display configured to transmit light from at least one light source and an input device configured to provide an interface with at least one sensor in the housing. The user interface may be configured to comprise output from the light display at the cover surface transmitted by the light source. The user interface may be configured to comprise input by interaction of the occupant with the input device at the cover surface through the interface with at least one sensor. The cover structure may comprise at least one of (a) apertures for a light guide and/or (b) recesses for a light guide. The light guide may be configured to fit within at least one of (a) apertures for the light guide and/or (b) recesses for the light guide. The light guide may be formed from a resin material. Input may comprise interaction at the cover surface through an interface module and with a sensor arrangement. The user interface system may be coupled to at least one vehicle system; the user interface may be configured to facilitate interaction by the occupant of the vehicle with at least one vehicle system. The component may comprise an actuator; the actuator may comprise at least one of (a) a haptic actuator; (b) a transducer; (c) a speaker. The component may comprise an absorber; the absorber may be configured to at least one of (a) absorb sound; (b) absorb vibration; (c) absorb assembly tolerance. The component may comprise an airbag; the cover structure may comprise a cover base and a cover layer; the cover base may be configured to cover the airbag; the cover layer may be configured to facilitate deployment of the airbag and the cover base may be configured to facilitate deployment of the airbag.

The present invention relates to a component for a vehicle interior configured to present a user interface for an occupant of the vehicle interior with at least one vehicle system comprising a housing, a cover structure comprising a cover surface, a user interface system configured to present the user interface at the cover surface comprising a light display configured to transmit light from at least one light source and an input device configured to provide an interface with at least one sensor in the housing, and an interface module comprising the input device and a light source and a light guide for the light display. The user interface may be configured to comprise output from the light display at the cover surface transmitted by the light source of the interface module. The user interface may be configured to comprise input by interaction of the occupant with the input device at the cover surface through the interface with at least one sensor. The interface with at least one sensor may comprise a feature on the interface module. The feature may comprise at least one projection. The light guide of the interface module may comprise the at least one projection configured to fit into the cover structure and to be illuminated by the light source of the interface module. The light source may be within the interface module; the at least one projection of the light guide may be configured to be illuminated by the light source. The light guide with the at least one projection may be formed from a light-transmissive resin material.

The present invention relates to a component for a vehicle interior configured to present a user interface for an occupant of the vehicle interior with at least one vehicle system comprising a housing, a cover structure comprising a cover surface, a user interface system configured to present the user interface at the cover surface comprising a light display configured to transmit light from at least one light source and an input device configured to provide an interface with at least one sensor in the housing, and an interface module comprising the input device. The user interface may be configured to comprise output from the light display at the cover surface transmitted by the light source. The user interface may be configured to comprise input by interaction of the occupant with the input device at the cover surface through the interface with at least one sensor. The interface with at least one sensor may comprise a feature on the interface module. The feature may comprise at least one projection. The feature may comprise at least one indentation. The input device may comprise a pressure-sensitive device; input may comprise pressure at the cover surface of the cover structure. The interface with at least one sensor may comprise contact by the input device through a coupling layer; contact may comprise contact by the feature on the interface module with the coupling layer. The interface with at least one sensor may comprise a coupling layer; the interface with at least one sensor may comprise contact by the input device through the coupling layer. The coupling layer may comprise a first layer of a first material and a second layer of a second material. The coupling layer may comprise a compressible material; input by interaction of the occupant with the input device may comprise contact by the feature on the interface module through the compressible material of the coupling layer. The component may comprise a set of light displays and a set of input devices; the interface module may comprise a set of interface modules. The input device may comprise a button; the cover surface may be configured to prevent visibility of the button when the at least one light source is off. Output may be configured to comprise light from the light display at the cover surface; light may comprise an image illuminated for the light display at the cover surface.

The present invention relates to a component for a vehicle interior configured to present a user interface for an occupant of the vehicle interior with at least one vehicle system comprising a housing, a cover structure comprising a cover surface, and a user interface system configured to present the user interface at the cover surface comprising a light display configured to transmit light from at least one light source and an input device configured to provide an interface with at least one sensor in the housing. The user interface may be configured to comprise output from the light display at the cover surface transmitted by the light source. The user interface may be configured to comprise input by interaction of the occupant with the input device at the cover surface through the interface with at least one sensor. The light display may comprise a light guide comprising at least one projection. The at least one projection may be configured to transmit light from the light guide through at least one of (a) recesses in an inner surface of the cover structure or (b) apertures in an inner surface of the cover structure. The light display may comprise at least one icon configured to be illuminated by the light source; the at least one projection may comprise the at least one icon. The cover structure may comprise at least one of (a) apertures for the at least one projection and/or (b) recesses for the at least one projection.

The present invention relates to a component for a vehicle interior configured to present a user interface for an occupant of the vehicle interior with at least one vehicle system comprising a housing, a cover structure comprising a cover surface, and a user interface system configured to present the user interface at the cover surface comprising a light display configured to transmit light from at least one light source and an input device configured to provide an interface with at least one sensor in the housing. The user interface may be configured to comprise output from the light display at the cover surface transmitted by the light source. The user interface may be configured to comprise input by interaction of the occupant with the input device at the cover surface through the interface with at least one sensor. The cover structure may comprise at least one of (a) apertures for a light guide and/or (b) recesses for a light guide. Input may comprise interaction at the cover surface through an interface module and with a sensor arrangement. The user interface system may be coupled to at least one vehicle system; the user interface may be configured to facilitate interaction by the occupant of the vehicle with at least one vehicle system. The component may comprise an actuator; the actuator may comprise at least one of (a) a haptic actuator; (b) a transducer; (c) a speaker. The component may comprise an absorber; the absorber may be configured to at least one of (a) absorb sound; (b) absorb vibration; (c) absorb assembly tolerance. The component may comprise an airbag; the cover structure may comprise a cover base and a cover layer; the cover base may be configured to cover the airbag; the cover layer may be configured to facilitate deployment of the airbag and the cover base may be configured to facilitate deployment of the airbag.

The present invention relates to a component for a vehicle interior configured to present a user interface for an occupant of the vehicle interior with at least one vehicle system comprising a housing, a cover structure comprising a cover surface and a user interface system configured to present the user interface at the cover surface comprising a light display configured to transmit light from at least one light source and an input device configured to provide an interface with at least one sensor in the housing. The user interface may be configured to comprise output from the light display at the cover surface transmitted by the light source. The user interface may be configured to comprise input by interaction of the occupant with the input device at the cover surface through the interface with at least one sensor. The component may comprise a base comprising the housing. The component may comprise an interface module comprising the light display and the input device. The interface module may comprise a set of interface modules. The component may comprise a set of light displays and a set of input devices. Input may comprise interaction at the cover surface of the cover structure. The input device may comprise a button. The cover surface may be configured to prevent visibility of the button when the at least one light source is off. The input device may comprise a pressure-sensitive device. Input may comprise pressure at the cover surface of the cover structure. The component may comprise an interface module comprising the input device. The component may comprise an interface module comprising the input device. The interface module may comprise the interface with at least one sensor. The interface with at least one sensor may comprise a feature on the interface module. The feature may comprise at least one projection. The feature may comprise at least one indentation. The interface with at least one sensor may comprise a coupling layer; the interface with at least one sensor may comprise contact by the input device; contact by the input device may comprise contact through the coupling layer. The interface with at least one sensor may comprise contact by the input device. Contact may comprise contact by a feature on an interface module with a coupling layer. Input by interaction of the occupant with the input device may comprise contact at the interface with at least one sensor by a feature of a coupling layer to at least one sensor. The interface with at least one sensor may comprise contact by the input device; contact by the input device may comprise contact through a coupling layer. The interface with at least one sensor may comprise a coupling layer; the coupling layer may comprise a mechanical coupling. The coupling layer may comprise a first layer of a first material and a second layer of a second material. The coupling layer may comprise a compressible material. Input by interaction of the occupant with the input device may comprise contact by a feature on an interface module through the compressible material of the coupling layer. The interface module may comprise the light source. Output may be configured to comprise light from the light display at the cover surface. Light may comprise an image illuminated for the light display at the cover surface. The image may comprise an icon. The light display may comprise at least one of (a) a light guide, (b) a light module, (c) a display panel. The light display may comprise a light guide comprising at least one projection. The at least one projection may be configured to transmit light from the light guide through at least one of (a) recesses in an inner surface of the cover structure or (b) apertures in an inner surface of the cover structure. The at least one projection may be configured to fit at least one aperture in an inner surface of the cover structure so that the light display may comprise light transmitted to the external surface of the cover structure from the light guide through the at least one projection. The at least one projection may comprise an angled surface. The at least one projection may be configured to reduce perceptible distortion of an image presented by illumination at the user interface. The light display may comprise at least one icon configured to be illuminated by the light source; the at least one projection may comprise the at least one icon. The cover structure may comprise at least one of (a) apertures for the at least one projection and/or (b) recesses for the at least one projection. The cover structure may comprise at least one of (a) apertures for a light guide and/or (b) recesses for a light guide. Input may comprise interaction at the cover surface through an interface module and with a sensor arrangement. The user interface system may be coupled to at least one vehicle system; the user interface may be configured to facilitate interaction by the occupant of the vehicle with at least one vehicle system. The user interface system may be configured to connect to at least one vehicle system through a control module. The component may comprise a proximity sensor configured to activate the user interface. The component may comprise an actuator. The actuator may comprise at least one of (a) a haptic actuator, (b) a transducer, (c) a speaker. The actuator may be configured to provide feedback to the vehicle occupant. The component may comprise an absorber. The absorber may be configured to at least one of (a) absorb sound, (b) absorb vibration, (c) absorb assembly tolerance. The absorber may comprise at least one of (a) silicone, (b) TPU. The light source may comprise at least one of (a) an array, (b) a grid, (c) a panel, (d) a display panel, (e) a flexible panel, (f) a lighting array, (g) a lighting device array, (h) a light-emitting device array, (i) an LED, (j) an LED array, (k) an OLED array, (l) a flexible LED array, (m) a flexible sheet, (n) a light source directed through a light guide, (o) an LED mat, (p) a flexible LED mat. The light source may be configured to display at least one of (a) data, (b) information, (c) vehicle system information, (d) an input panel, (e) a menu system, (f) a button, (g) an image, (h) an animation effect. The cover structure may comprise a cover base and a cover layer; the component may comprise an airbag; the cover base may be configured to cover the airbag; the cover layer may be configured to facilitate deployment of the airbag and the cover base may be configured to facilitate deployment of the airbag. The input device may comprise a sensor, the sensor may comprise at least one of (a) an array, (b) a grid, (c) a foil, (d) a panel, (e) a touch panel, (f) a flexible panel, (g) a detector, (h) a proximity detector, (i) a capacitive touch panel, (j) a pressure sensitive panel, (k) a sensor grid, (l) a sensor foil, (m) a capacitive sensor foil, (n) a camera/detector, (o) a camera, (p) a switch connector, (q) a resistive sensor, (r) a touch sensor, (s) a proximity sensor, (t) a switch, (u) a virtual switch, (v) a button, (w) a virtual button, (x) an electronic control. The component may comprise at least one of (a) a steering wheel assembly, (b) a console, (c) a floor console, (d) a center console, (e) an instrument panel, (f) a door panel, (g) a dashboard, (h) a display, (i) an arm rest, (j) a cockpit.

The present invention relates to a vehicle interior component configured to provide a user interface system comprising at least one sensor and at least one light source and configured to provide a user interface for interaction with a vehicle occupant in a vehicle providing at least one vehicle system comprising a cover structure comprising a cover layer and a cover base. The user interface for the vehicle occupant may comprise (1) a light display from at least one light source of the user interface system and (2) an input device connected to at least one sensor of the user interface system; the cover structure may comprise a composite cover; the cover layer may be configured to cover at least a portion of the cover base. The component may comprise a light guide; the light guide may be configured to allow transmission of light from the at least one light source to the light display for the user interface. The cover base may be molded on the light guide. The light guide may comprise at least one of (a) an injection molded polypropylene, (b) a generally transparent resin material. The cover layer may be molded on the cover base and the light guide. The light guide may comprise a projection and the cover base may comprise an aperture; the projection may extend through the aperture. The cover layer may comprise a recess; the projection of the light guide may be coupled to the recess of the cover layer. The projection may comprise an angled surface. The projection may comprise a height and the cover base may comprise a thickness; the thickness may be generally less than the height. The light guide may comprise a body; the projection may comprise a generally uniform height above the body. The component may comprise a mask configured to block light from the at least one light source. The mask may be applied on the light guide by at least one of (a) printing, (b) ink-jet printing, (c) pad printing, (d) screen printing, (e) spraying, (f) spray depositing, (g) painting, (h) applying and ablation. The mask may be provided on an inner layer of the cover base. The mask on the inner layer may be provided by at least one of (a) printing, (b) ink-jet printing, (c) pad printing, (d) screen printing, (e) spraying, (f) spray depositing, (g) painting, (h) applying and ablation. The cover layer may comprise an inner surface; the inner surface of the cover layer may be coupled to an outer surface of the cover base. The cover base may comprise at least one of (a) an injection molded thermoplastic elastomer, (b) a generally opaque material. The component may comprise a sensor configured to detect input from the vehicle occupant at or adjacent to the cover layer. The component may comprise a mechanical coupling configured to transmit force at the user interface to the sensor. The mechanical coupling may be configured to compress in response to force at the user interface. The mechanical coupling may comprise a top layer and a bottom layer; the top layer may comprise a different material than a material of the bottom layer. The component may comprise a light guide and an enclosure. The light guide may be coupled to the cover base; the enclosure may be configured to guide light from a light source toward the light guide. The enclosure may be configured to transmit force at the user interface to a mechanical coupling; the enclosure may be configured to move from a default position to a depressed position to compress the mechanical coupling. At least one of (a) the cover base may be configured to flex in response to force at the user interface, (b) the cover layer may be configured to flex in response to force at the user interface. The component may comprise a button; the cover layer may be configured to prevent visibility of the button when the at least one light source is off. The cover layer may comprise an outer cover configured to present the user interface for the vehicle occupant. The cover base may comprise an inner cover providing an exterior surface.

The present invention relates to a vehicle interior component configured to provide a user interface system comprising at least one sensor and at least one light source and configured to provide a user interface for interaction with a vehicle occupant in a vehicle providing at least one vehicle system comprising a cover configured to present the user interface for the vehicle occupant, a sensor configured to detect input from the vehicle occupant at or adjacent to the cover and a mechanical coupling. The mechanical coupling may be configured to transmit force at the user interface to the sensor; the user interface for the vehicle occupant may comprise (1) a light display from at least one light source of the user interface system and (2) an input device connected to at least one sensor of the user interface system; the mechanical coupling may be configured to compress in response to force at the user interface. The mechanical coupling may comprise at least one of (a) urethane, (b) silicone, (c) foam. The mechanical coupling may comprise a top layer and a bottom layer; the top layer may comprise a material of a lower durometer than a material of the bottom layer. The component may comprise a light guide and an enclosure configured to guide light from a light source toward the light guide. The component may comprise an interface configured to move from a default position to a depressed position to compress the mechanical coupling. The component may comprise an interface module comprising an enclosure; the enclosure may be configured to enclose and support a light source for the user interface.

The present invention relates to a vehicle interior component configured to provide a user interface system comprising at least one light source and configured to provide a user interface for interaction with a vehicle occupant in a vehicle providing at least one vehicle system comprising a cover configured to present the user interface for the vehicle occupant and a light guide configured to allow transmission of light from the at least one light source to the light display for the user interface. The user interface for the vehicle occupant may comprise (1) a light display from at least one light source of the user interface system and (2) an input device connected to at least one sensor of the user interface system; the cover may be configured to cover the light guide. The cover may be molded on the light guide. The light guide may comprise a projection and the cover may comprise a recess; the projection may extend into the recess. An inner surface of the cover may be coupled to the projection of the light guide. The projection may comprise an angled surface. The projection may comprise a height and the cover may comprise a thickness; the thickness may be generally greater than the height. The light guide may comprise a body comprising a generally uniform thickness of between 1.5 mm and 2.5 mm; the projection may comprise a generally uniform height above the body of between 0.40 mm and 0.60 mm; the cover may comprise a thickness generally between 0.75 mm and 1.25 mm. The cover may comprise an injection molded thermoplastic elastomer. The component may comprise a sensor configured to detect input from the vehicle occupant at or adjacent to the cover. The component may comprise a button; the cover may be configured to prevent visibility of the button when the at least one light source is off.

The present invention relates to a component for an interior of a vehicle configured to provide a user interface with illumination and configured for interaction with an occupant of the vehicle and/or with at least one vehicle system comprising a cover and a light module comprising at least one light source configured to provide illumination at the cover. The user interface may comprise an image presented as a light display from at least one light source. The light module may comprise a set of light segments. The light module may comprise a display panel. The at least one light source may comprise at least one of (a) an LED arrangement, (b) a display panel. The light module may comprise a display panel formed into the cover. The light module may comprise light segments formed into the cover. The light module may comprise light segments projecting in an angled section into a surface of the cover. The light module may comprise light segments projecting in an angled section into a surface of the cover and configured to reduce perceptible distortion of an image presented by illumination at the user interface.

The present invention relates to a component for a vehicle interior configured to present a user interface for interaction with an occupant of the vehicle comprising at illumination from at least one light source comprising a composite structure comprising a cover and a module. The cover may comprise a surface; the module may comprise a light guide; the module may be integrated with the light guide of the module and configured to allow transmission of light from the at least one light source to the surface of the cover to present the user interface; the light guide of the module may be configured to present a light display for the user interface; the light source may be configured to provide illumination to the light display for the user interface. The user interface may comprise (1) a light display from at least one light source and (2) an input device connected to at least one sensor. The cover may be configured to cover the light guide. The module may comprise a light module formed from a generally transparent resin material. The module may comprise a projection and the cover may comprise a recess; the projection may extend into the recess. The projection may comprise a height and the cover may comprise a thickness; the thickness may be generally greater than the height. The module may be integrally formed with the light guide. The component may comprise a cover assembly comprising the cover.

The present invention relates to a vehicle interior component configured to provide a user interface system comprising at least one sensor and at least one light source and configured to provide a user interface for interaction with a vehicle occupant in a vehicle providing at least one vehicle system comprising a composite structure comprising a cover layer comprising an outer cover configured to present the user interface for the vehicle occupant and a cover base comprising an inner cover providing an exterior surface. The user interface for the vehicle occupant may comprise (1) a light display from at least one light source of the user interface system and (2) an input device connected to at least one sensor of the user interface system; the outer cover may be configured to cover at least a portion of the inner cover. The component may comprise a light guide; the light guide may be configured to allow transmission of light from the at least one light source to the light display for the user interface. The inner cover may be molded on the light guide. The outer cover may be molded on the inner cover and the light guide. The light guide may comprise a projection and the inner cover may comprise an aperture; the projection may extend through the aperture. The outer cover may comprise an inner surface; the inner surface of the outer cover may be coupled to an outer surface of the inner cover. The outer cover may be configured to provide a translucent effect.

The present invention relates to a component for an interior of a vehicle configured to provide a user interface with illumination and configured for interaction with an occupant of the vehicle and/or with at least one vehicle system comprising a composite structure comprising a cover assembly comprising a cover base and a cover layer and a light module configured to provide illumination at the cover layer of the cover assembly. The user interface may comprise an image presented as (1) a light display from at least one light source and (2) an input device connected to at least one sensor of the user interface system. The component may comprise an actuator configured to provide feedback to the vehicle occupant. The component may comprise a steering wheel assembly.

The present invention relates to a vehicle interior component configured to provide a user interface system comprising at least one sensor and at least one light source and configured to provide a user interface for interaction with a vehicle occupant in a vehicle providing at least one vehicle system comprising a cover structure (TS) comprising a cover base (TB), a cover layer (TL) configured to cover at least a portion of the cover base (TB) and a cover surface (T) configured to cover at least a portion of the cover layer (TL) and to present the user interface (UI). The user interface system (UIS) may be configured to present the user interface (UI) for the vehicle occupant comprising a light display from at least one light source (LS) and an input device coupled to at least one sensor (SN); the cover structure (TS) may comprise a composite structure of the cover base (TB) and the cover layer (TL).

The present invention relates to a component for a vehicle interior configured to present a user interface for an occupant of the vehicle interior with at least one vehicle system comprising a base comprising a housing (H), a cover structure (TS) comprising a cover surface (T), a user interface system (UIS) configured to present the user interface (UI) at the cover surface comprising a light display configured to transmit light (L) from at least one light source (LS) and an input device configured to provide an interface (CP) with at least one sensor (SN) in the housing (H). The user interface (UI) may be configured to comprise output from the light display at the cover surface (T) transmitted by the light source (LS); the user interface (UI) may be configured to comprise input by interaction of the occupant with the input device at the cover surface (T) through the interface (CP) with at least one sensor (SN).

The present invention relates to a vehicle interior component configured to provide a user interface system comprising at least one sensor and configured to provide a user interface for interaction with a vehicle occupant in a vehicle providing at least one vehicle system comprising a cover structure (TS) comprising a cover base (TB), a cover layer (TL) configured to cover at least a portion of the cover base (TB) and a cover surface (T) configured to cover at least a portion of the cover layer (TL) and to present the user interface (UI). The user interface system (UIS) may be configured to present the user interface (UI) for the vehicle occupant comprising an input device coupled to at least one sensor (SN); the cover structure (TS) may comprise a composite structure of the cover base (TB) and the cover layer (TL).

FIGURES

FIGS. 4A and 4B are schematic block diagrams of a vehicle interior component with a user interface system according to an exemplary embodiment.

FIGS. 5A through 5C are schematic plan views of a vehicle interior component according to an exemplary embodiment.

FIGS. 6A through 6C are schematic perspective views of a vehicle interior component according to an exemplary embodiment.

FIG. 13 is a schematic exploded perspective view of a vehicle interior component according to an exemplary embodiment.

FIG. 14 is a schematic exploded perspective view of a vehicle interior component according to an exemplary embodiment.

FIGS. 17A and 17B are schematic perspective views of a vehicle interior component according to an exemplary embodiment.

FIG. 17C is a schematic exploded perspective view of a vehicle interior component according to an exemplary embodiment.

FIG. 17D is a schematic perspective cutaway view of a vehicle interior component according to an exemplary embodiment.

FIG. 17E is a schematic partial section view of a vehicle interior component according to an exemplary embodiment.

FIG. 17F is a schematic partial cutaway section view of a vehicle interior component according to an exemplary embodiment.

FIGS. 18A-18C are schematic exploded partial perspective views of a method for forming a vehicle interior component according to an exemplary embodiment.

FIG. 18D is a schematic partial perspective view of a vehicle interior component according to an exemplary embodiment.

FIG. 34A is schematic partial perspective view of a vehicle interior component according to an exemplary embodiment.

FIG. 34B is a schematic exploded perspective view of a vehicle interior according to an exemplary embodiment.

FIG. 35A is a schematic perspective view of a vehicle interior component according to an exemplary embodiment.

FIG. 35B is a schematic cutaway perspective view of a vehicle interior component according to an exemplary embodiment.

FIG. 35C is a schematic exploded perspective view of a vehicle interior according to an exemplary embodiment.

DESCRIPTION

Figure 1A:
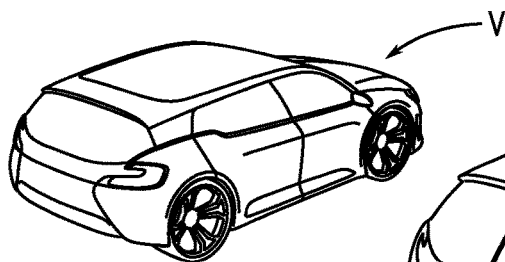
FIG. 1A is a schematic perspective view of a vehicle according to an exemplary embodiment.
Figure 1B:
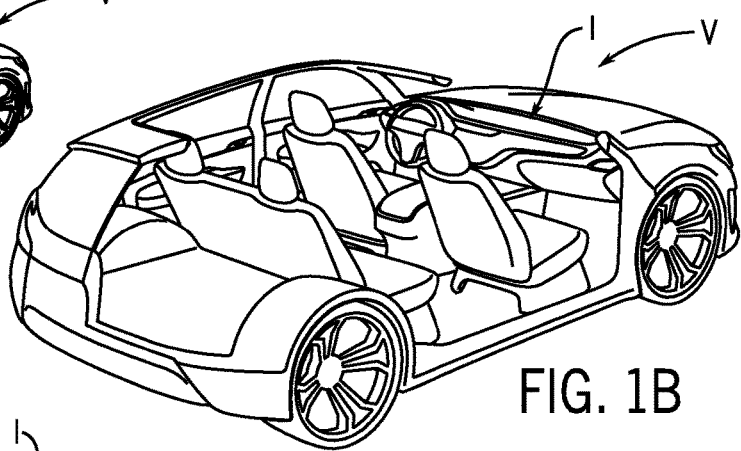
FIG. 1B through 1D are schematic partial perspective views of a vehicle interior according to an exemplary embodiment.
Figure 1C:
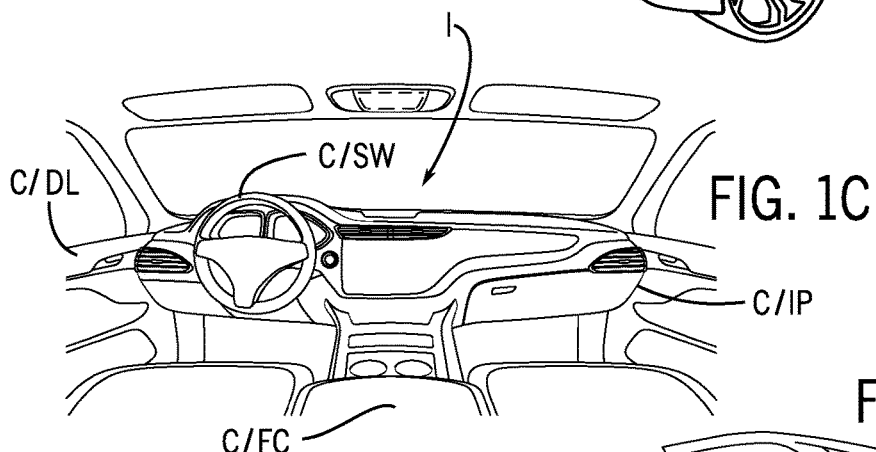
Figure 1D:
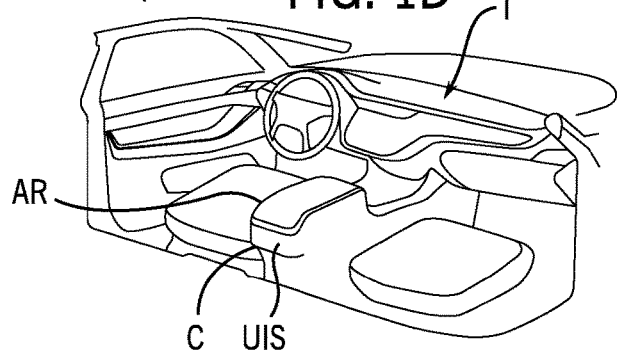
Figure 2:
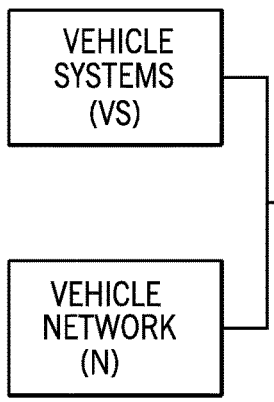
FIG. 2 is a schematic block diagram of a user interface system for a vehicle interior component according to an exemplary embodiment.
Figure 3:
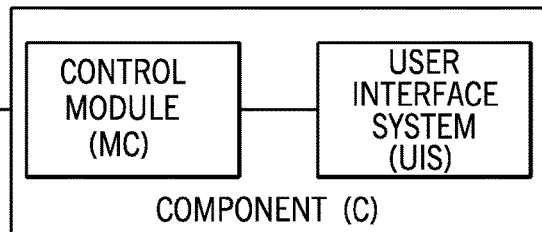
FIG. 3 is a schematic block diagram of connection of a vehicle interior component with a user interface system to vehicle systems according to an exemplary embodiment.

Referring to FIGS. 1A and 1B, a vehicle V is shown schematically with an interior I. As indicated schematically according to an exemplary embodiment in FIGS. 1B, 1C and 1D, the vehicle interior may comprise vehicle interior components C shown (for example) as an instrument panel IP, a console such as floor console FC, a door panel DL, an armrest AR and a steering wheel SW. As indicated schematically according to an exemplary embodiment in FIGS. 1C-1D, 2 and 3, component C may comprise a user interface system UIS configured to present a user interface for an occupant of the vehicle; the user interface system UIS may be configured with an input device and/or a light display and may be operated by a control module MC and coupled to one or more vehicle systems VS and/or to one or more networks including a vehicle network N (e.g. user interface system operation may include connectivity to vehicle systems/networks).

As indicated schematically in FIGS. 1C-1D, 2, 3 and 4A-4B, the user interface system UIS for the component C may be configured to present a user interface UI comprising a light display comprising light L shown as from a light source LS and a light guide LG (e.g. configured to provide a visual effect such as an image IM perceptible by a vehicle occupant) and comprising an input device comprising an interface shown as comprising a mechanical interface/contact CP/CT with a sensor/sensor arrangement SN (e.g. configured to provide a contact surface, switch, etc. for actuation by a vehicle occupant); the user interface system UIS with user interface UI presented may be configured and operated (e.g. by a control program/control module) to facilitate information interchange between vehicle systems/networks and a vehicle occupant at the component C (e.g. interactive information/data interchange such as information/data display at a light display and instruction/response input at an input device). As indicated schematically in FIGS. 4A and 4B, the component C with user interface system UIS may comprise an interface module FM (FIG. 4A) or a set of interface modules FM (FIG. 4B) facilitate interactive information interchange such as through the light display (configured to present light L) and/or input device (configured to interact with a sensor arrangement SN) of the user interface UI at the cover surface of the component C. See also FIGS. 5A-5C (component providing user interface UI shown as steering wheel SW with image IM shown as an illuminated icon) and FIGS. 6A-6C (component providing user interface UI shown as armrest AR with image IM shown as an illuminated icon).

As indicated schematically according to an exemplary embodiment in FIGS. 5A-5C and 6A-6C, the component C with user interface system UIS may be configured to for a default or off/inactive (ready) state (see FIGS. 5A and 6A) and for an active state of the user interface UI with the light display comprising light L shown as an image IM to provide data/information or visual effect by illumination for a vehicle occupant (see FIGS. 5B and 6B) and for an active state of the user interface UI with the input device comprising a switch (e.g. detection and/or contact area) shown as at the surface on or near image IM for interaction with a vehicle occupant (see FIGS. 5C and 6C). As indicated schematically according to an exemplary embodiment in FIGS. 1C-1D, 4A-4B, 5A-5C and 6A-6C, the user interface UI may be provided at or adjacent to the cover/surface of the component; the user interface system UIS may comprise a proximity sensor configured to activate the user interface for the vehicle occupant when in proximity (e.g. from "off" to "on" state when proximity detected such as by movement, touch, sound, etc.). See also FIGS. 7A-7D, 8A-8D, 17B, 18D, 19D, 20D, 21D, 22D, 23D, 34A and 35A. As indicated schematically in FIGS. 1C-1D, 11, 12, 13, 14, 16C, 19C and 23C, the user interface system may comprise an actuator/transducer (e.g. mechanism, speaker, etc.) configured to provide a haptic signal/feedback at the user interface for the vehicle occupant (e.g. vibration, vibration-sound, etc. perceptible at the component and/or cover surface).

As shown schematically according to an exemplary embodiment in FIGS. 7A-7D and 8A-8D, component C shown as steering wheel SW may comprise a base B and a cover surface presenting the user interface UI with an information region IR (configured to provide an image IM shown as illuminated indicators, icons, forms, etc.) and a decorative region DR (configured to provide an image IM shown as an illuminated form); as indicated schematically, the user interface UI may be illuminated by a light source configured to present light to the cover surface such as by a light guide, light guide with projections/icons, display panel, etc. See also FIGS. 5A-5C, 9, 10, 11, 12, 13 and 14.

As indicated schematically in FIGS. 9, 10, 11, 12, 13, 14 and 15A-15B and 16A-16C, component C may comprise the base B with the cover surface T and a module M configured to provide the user interface system with input device and/or light source; module M may comprise a housing H configured for an assembly comprising a sensor SN (for an input device) and a light source shown as light guide LG (configured to be coupled to a light source for the light display); housing H may comprise a plate PL (such as a light-transmissive, translucent and/or transparent sheet) for mounting/securing of the assembly. As indicated schematically in FIG. 10, the module M may comprise a light source shown as a display panel DP configured to fit within a mounting structure shown as light guide LG (shown with an aperture for installation of the display panel) to provide the light display of the user interface. As indicated schematically in FIGS. 11, 12 and 13, the module M may comprise a light source LS (e.g. an LED, LED array, etc.) configured to illuminate the light guide LG; the light guide LG may comprise projections such as icons configured to project into apertures AP in a cover base TB of a cover structure TS; cover structure TS may comprise a composite structure with a cover layer TL providing a cover surface T (where the light display of the user interface is presented). As indicated schematically in FIGS. 12, 13, 14 and 16A-16C, the component shown as steering wheel SW may comprise an actuator AT (e.g. motor, mechanism, transducer, etc.) configured to provide feedback such as haptic feedback at the user interface UI (e.g. vibration, vibration-sound, etc. transmitted through module M/housing H to the cover surface/component). As indicated schematically in FIGS. 13 and 14, a set of apertures AP in the cover base TB may be configured for fit of projections of the light guide LG. As indicated schematically in FIG. 14, an aperture AP in the cover base TB may be configured for installation of a display panel DP; the module M may further comprise an absorber SP configured to provide a functional effect (e.g. absorption of sound, diffusion, etc.). As indicated schematically in FIGS. 9, 10, 11, 12, 13 and 14, the module may be configured and assembled to provide the user interface UI with light display and input device at the cover surface T of the component. As indicated schematically in FIGS. 15A-15B and 16A-16C, the module M with housing H configured to present a user interface at the cover surface T of the component may comprise a light guide LG comprising a set of projections PR configured to fit within a set of apertures AP in the cover layer TL (see FIGS. 15A-15B) and/or within recesses RS in the cover layer TL and apertures AP in the cover base TB (see FIGS. 16A-16C) of the cover structure TS.

As shown schematically according to an exemplary embodiment in FIGS. 17A-17F, the component C may comprise a cover structure TS comprising a cover layer TL providing a cover surface T for the user interface UI configured to present the light display as an illuminated image IM from a light guide LG (configured to transmit light from a light source); the light guide LG may comprise a set of projections PR provided as icons IC (configured to present the image when illuminated) that fit within recesses RS in the cover layer TL (e.g. recesses RS formed or configured in size/shape for fit of projections PR of the light guide LG). As indicated schematically in FIG. 17F, the relative thickness/depth of the recess RS corresponding for the projection PR (shown as dimension t2) may be selected and fit relative to the thickness of the cover layer (shown as dimension t3) and the thickness of the light guide (shown as dimension t1) in the design of the component; the relative dimensions (t2 and t3) can be selected so that the icon IC is not readily visible when the light display is "off" (see FIG. 17A) but is readily visible when the light display is "on" (see FIG. 17B) based on considerations such as anticipated ambient conditions, environment, selection of materials, etc.

As indicated schematically in FIGS. 18A-18D, 19A-19D, 20A-20D, 21A-21D, 22A-22D and 23A-23D, the component may comprise a module configured to present a user interface UI comprising an image display and/or input device at a cover surface T of a cover structure TS; the image display may comprise an illuminated image IM; the input device may be configured to provide input to a sensor arrangement SN.

As shown schematically in FIGS. 18A-18D, the component may comprise a module M assembled with a housing H and a light module/guide LG with projections PR configured as icons IC to fit with the cover layer TL of the cover structure TS to present an image IM for the user interface UI when illuminated by a light source.

As shown schematically in FIGS. 19A-19D, the component may comprise a module M and a cover structure TS comprising a cover base TB and a cover layer TL; the module M may be assembled with a housing H and a light module/guide LG with projections PR configured as icons IC to fit with the cover base TB of the cover structure TS to present an image IM for the user interface UI when illuminated by a light source; the module M may comprise an actuator AT configured to provide haptic feedback.

As shown schematically in FIGS. 20A-20D, the component may comprise a cover structure TS and module M assembled with a housing H and a light module/guide LG with a display panel DP configured to fit with the cover layer TL of the cover structure TS to present an image IM for the user interface UI when illuminated by a light source.

As shown schematically in FIGS. 21A-21D, the component may comprise a module M and a cover structure TS comprising a cover base TB and a cover layer TL; the module M may be assembled with a housing H and a light module/guide LG with a display panel DP configured to fit in an aperture AP of the cover base TB and with the cover layer TL of the cover structure TS to present an image IM for the user interface UI when operated/illuminated by a light source.

As shown schematically in FIGS. 22A-22D, the component may comprise a cover structure TS and module M assembled with a housing H and a light module/guide LG with projections PR configured as icons IC and a display panel DP configured to fit with the cover layer TL of the cover structure TS to present an image IM for the user interface UI when operated/illuminated by a light source and/or data source (e.g. image comprising illuminated icons and/or visual display at display panel).

As shown schematically in FIGS. 23A-23D, the component may comprise a module M and a cover structure TS comprising a cover base TB and a cover layer TL; the module M may be assembled with a housing H and a light module/guide LG with projections PR configured as icons IC and a display panel DP configured to fit within apertures AP in the cover base TB and with the cover layer TL of the cover structure TS to present an image IM for the user interface UI when operated/illuminated by a light source and/or data source (e.g. image comprising illuminated icons and/or visual display at display panel); the module M may comprise an actuator AT configured to provide haptic feedback.

As indicated schematically according to an exemplary embodiment in FIGS. 24A-24D, 25A-25D, 26A-26C and 27A-27C, the component may be formed with a cover structure TS comprising a cover layer TL (FIGS. 24A-24D and 26A-26C) or with a cover structure comprising a cover base TB and a cover layer TL (FIGS. 25A-25D and 27A-27C). See also FIGS. 28A-28B and 29A-29B (representations of light display of image IM by illuminated icon IC at user interface of component).

Figure 28A:
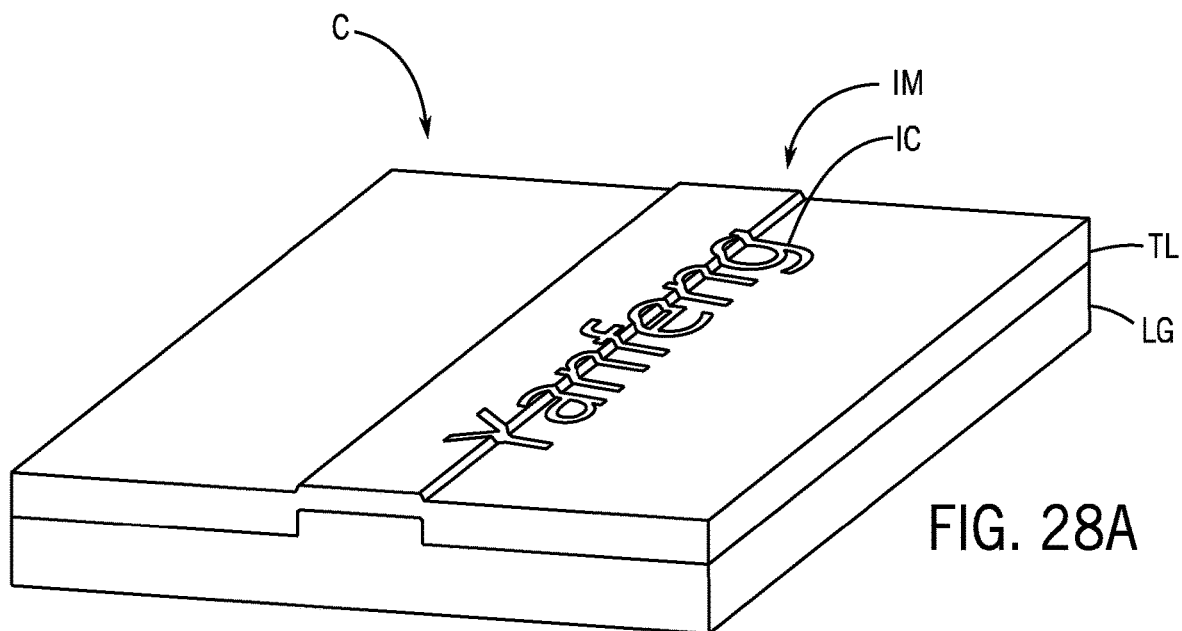
FIG. 28A is a schematic partial section perspective view of a vehicle interior component according to an exemplary embodiment.
Figure 28B:
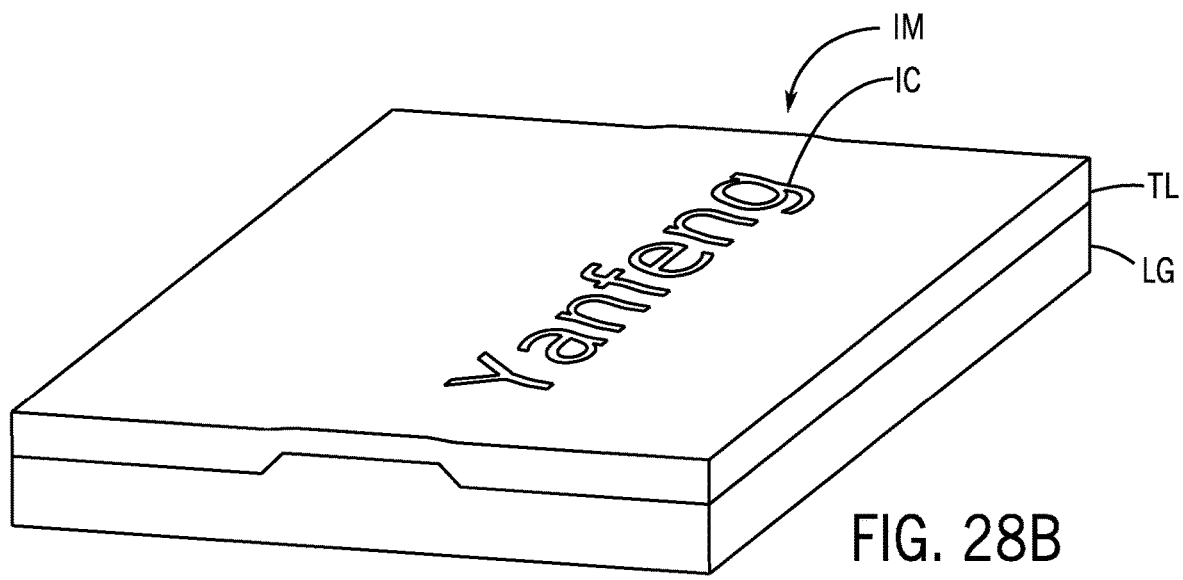
FIG. 28B is a schematic partial section perspective view of a vehicle interior component according to an exemplary embodiment.

As indicated schematically in FIGS. 24A-24D, 26A-26C and 28A-28B, the light module/guide LG may comprise projections PR; cover layer TL may be fit/formed onto light module/guide LG with recesses fit/formed onto projections PR; as shown, the projections and recesses may be provided in a variety of shapes, including angled orientations indented to present an intended visual effect for the image IM at the light display of the user interface when light guide LG is illuminated by a light source LS (shown as LED array). As shown in FIG. 28B (representational view), an angled orientation of the projection of light guide LG and recess of cover layer TL may produce an image IM for the light display of the user interface at the cover surface with reduced perceptible distortion (e.g. with improved fidelity to the intended presentation of icon IC formed by projections PR when illuminated by a light source). Compare FIG. 28A (representational view indicating distortion of image IM at cover surface with non-angled orientation).

Figure 29A:
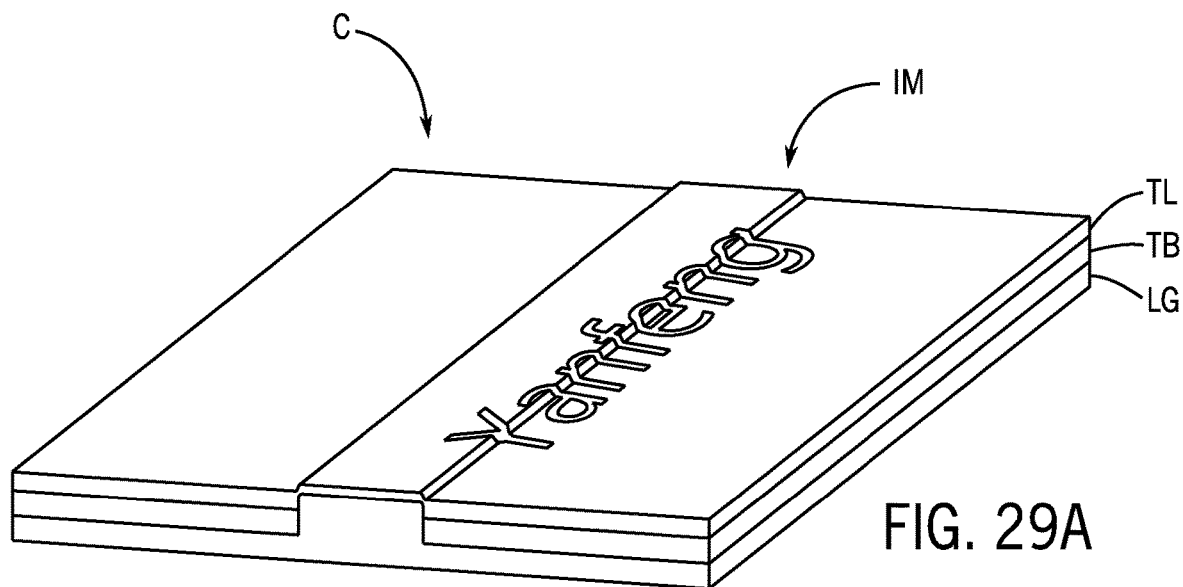
FIG. 29A is a schematic partial section perspective view of a vehicle interior component according to an exemplary embodiment.
Figure 29B:
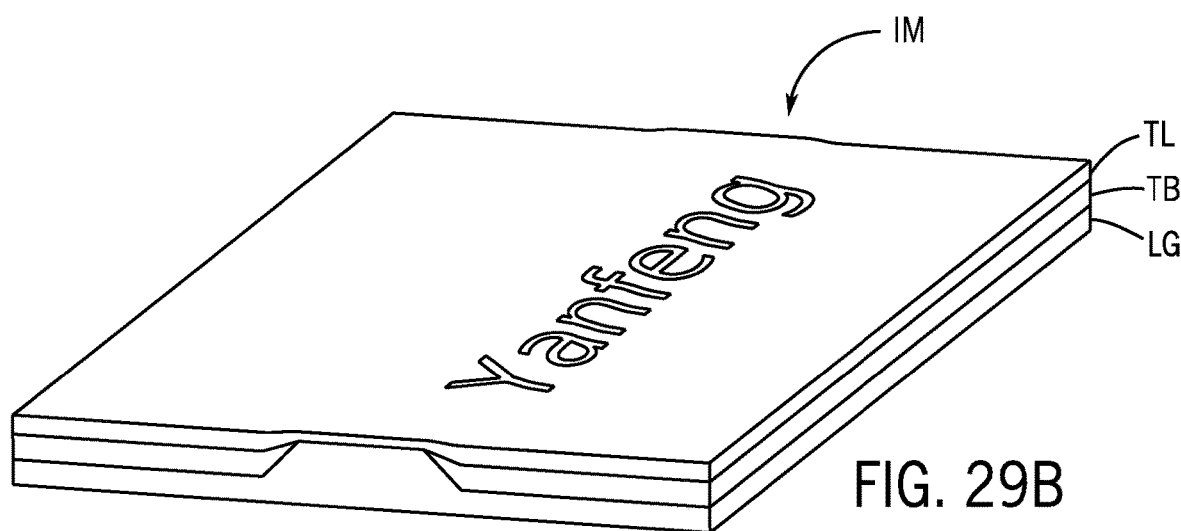
FIG. 29B is a schematic partial section perspective view of a vehicle interior component according to an exemplary embodiment.
Figures 30A, 30B:
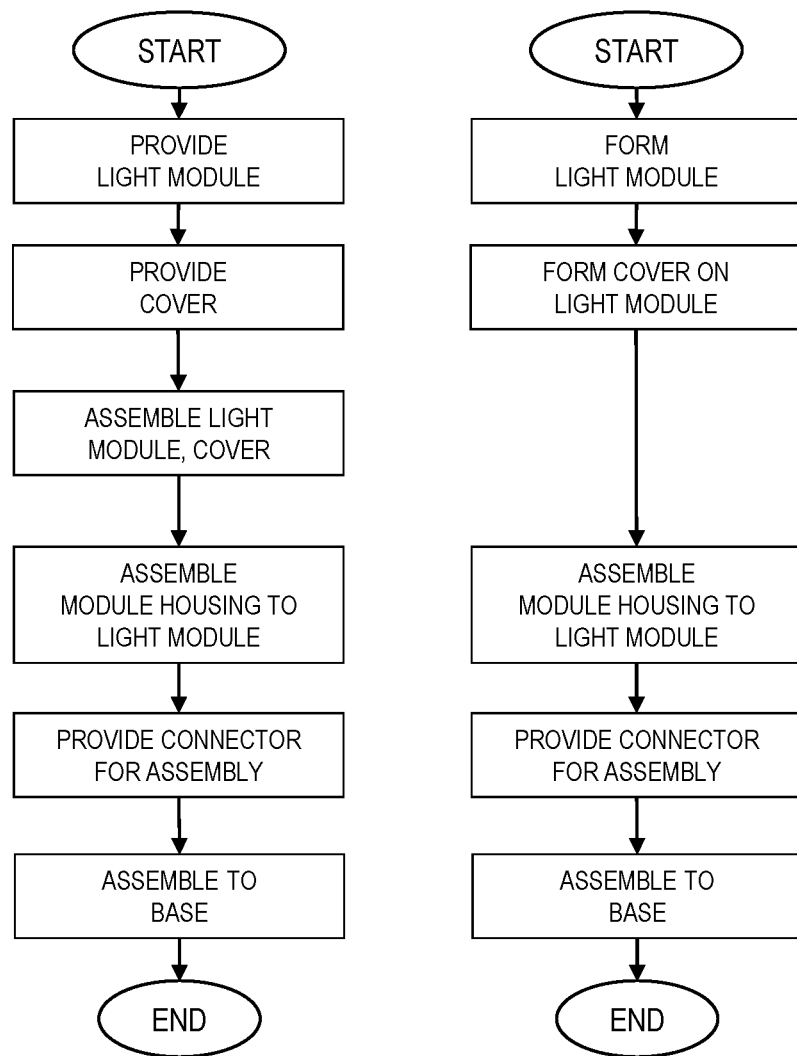
FIGS. 30A and 30B are schematic flow diagrams of a method of constructing/assembling a vehicle interior component according to an exemplary embodiment.
Figure 31A:
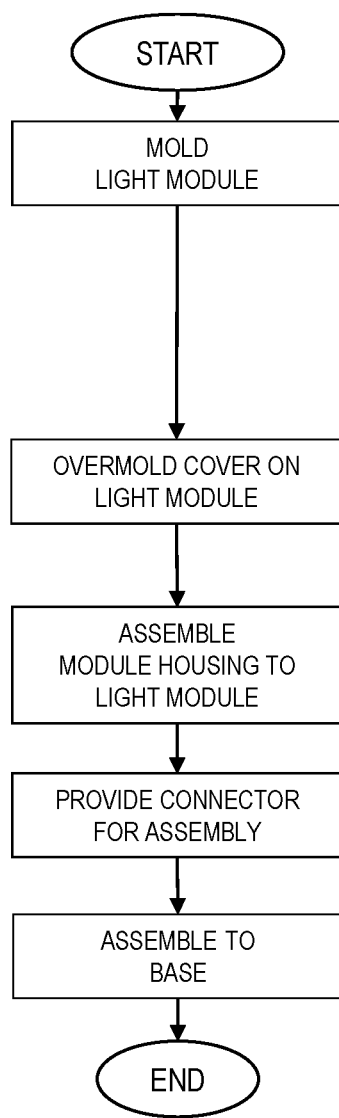
FIGS. 31A and 31B are schematic flow diagrams of a method of constructing/assembling a vehicle interior component according to an exemplary embodiment.
Figure 31B:
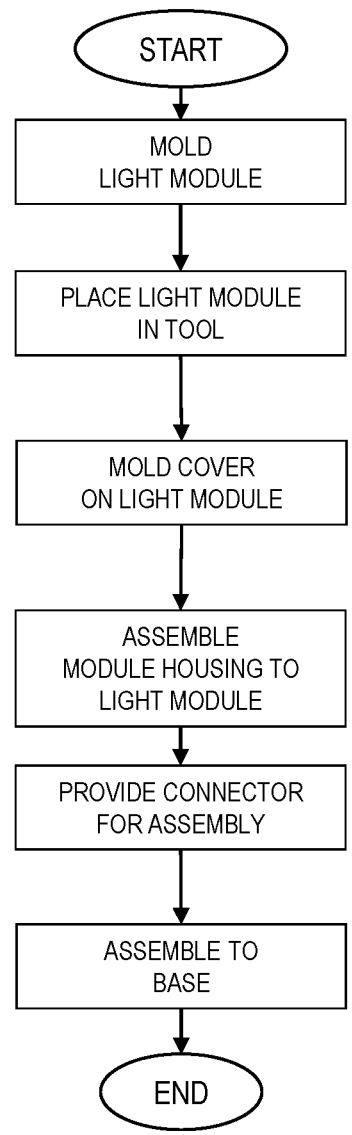

As indicated schematically in FIGS. 25A-25D, 27A-27C and 29A-29B, the light module/guide LG may comprise projections PR; cover base TB may be fit/formed onto light module/guide LG with apertures fit/formed onto projections PR; cover layer TL may be applied/formed onto cover base TB; as shown, the projections and apertures may be provided in a variety of shapes, including angled orientations indented to present an intended visual effect for the image IM at the light display of the user interface when light guide LG is illuminated by a light source LS (shown as LED array). As shown in FIG. 29B (representational view), an angled orientation of the projection of light guide LG and aperture of cover base TB may produce an image IM for the light display of the user interface at the cover surface with reduced perceptible distortion (e.g. with improved fidelity to the intended presentation of icon IC formed by projections PR when illuminated by the light source). Compare FIG. 29A (representational view indicating distortion of image IM at cover surface with non-angled orientation).

As shown schematically in FIGS. 1C-1D, 2, 3, 5A-5C and 6A-6C, the user interface system UIS may be configured to provide a user interface UI at cover surface T comprising at least one light display presented in a display region (e.g. for output shown as comprising an image IM configured to be illuminated by light L from a light source LS) and at least one input device (for input shown as comprising an operator control/contact such as a switch/button function facilitating interaction through an interface module FN with a contact CT and interface shown as coupling CP with a sensor arrangement with sensor SN); user interface system UIS may be configured to connect to vehicle systems VS and/or a vehicle network N through a control module MC (e.g. powered and connected through connectors shown schematically as wires W). See FIGS. 3, 4A-4B, 5A-5C, 34B and 35C. As indicated schematically in FIGS. 1C, 3, 4A-4B, 5A-5C, 6A-6C and 34A, user interface system UIS of the component may connect or comprise electronics/control such as a control module MC configured for interface with vehicle systems and/or for operation of the user interface (e.g. including presentation of image/display, illumination, display, data connectivity, network connection, function of an operator control/interaction, connection to sensors, sensor data, etc.).

As indicated schematically according to an exemplary embodiment in FIGS. 1C, 3, 4A-4B, 5A-5C and 6A-6C, component C with user interface system UIS may be configured to present user interface UI with the light display (e.g. display, illuminated sections and/or regions, etc.) integrated with vehicle systems VS and/or or otherwise to a controller and/or data source or network N (e.g. vehicle network, internet, other networks, etc.) to provide information, indicators, instrumentation, etc. (in a region configured to be illuminated by a light source); in operation the light display may be operated/controlled to present an image IM (such as instrumentation, data, information, etc. presented through an illuminated icon IC) for the occupant of the vehicle at the user interface on the cover surface T of the cover structure TS. See FIGS. 1C, 5A-5C, 6A-6C, 35A, 35B, 37A-37C and 38B.

As indicated schematically according to an exemplary embodiment in FIGS. 5A-5C, 6B-6C and 36A, component C with user interface system UIS may be configured to present user interface UI with the input device such as an operator control (e.g. arrangement providing a button, touch pad, sensor contact, other functionality, etc.) to facilitate operation/interaction by the occupant of the vehicle with one or more systems (e.g. vehicle systems, vehicle network, etc. and other networks, devices, systems, etc.); in operation the input device may be operated/controlled for interaction through transmit a signal (such as instrumentation, data, information, haptics, etc.) from the occupant of the vehicle at the user interface on the cover surface T of the cover structure TS. See also FIGS. 1C-1D, 2, 3, 5A-5C, 6A-6C, 35A, 35B, 37A-37C and 38B.

As indicated schematically in FIGS. 2, 3, 5A-5C, 6A-6C, 7A-7D, 8A-8D, and 34A, the component C with user interface system UIS may be configured with a user interface on the cover surface T with the light display as an illuminated section with light L providing a display/illuminated image IM (e.g. a light segment/display arrangement of indicators shown as illuminated icons/symbols) and with the input device as a contact area/button (e.g. a section with a mechanical coupling through interface CP with sensor SN).

Referring to FIGS. 30A-30B, 31A-31B, 32A-32B and 33A-33C, a method/process for constructing/assembling the vehicle interior component with module (light module/guide), cover structure (cover layer) and base is shown according to an exemplary embodiment.

As indicated schematically in FIGS. 30A-30B, 31A-31B, 32A-32B and 33A-33C, the cover structure (e.g. composite structure, cover assembly, etc.) of the component may be formed by a molding process (e.g. injection molding, overmolding, etc.) with the light module formed (with projected light guide/segments) and the cover layer formed/assembled with the module/connectivity in a production sequence (e.g. multi-shot molding process, overmold process); a cover base may be formed onto the light module. As indicated schematically, the light module may comprise a light-transmissive material (such as polypropylene, etc. that may be formulated to provide a selected level of transparency/transmissibility, color, etc.); the outer cover/cover layer may comprise a polymer material (such as thermoplastic olefin/TPO, molded material, film/foil, etc.); the cover may comprise a polymer material (such as a thermoplastic elastomer/TPE, resin material, etc.); the housing/sections may comprise a material such as a polymer (e.g. acrylonitrile butadiene styrene/ABS, polycarbonate/PC, resin material, etc.). According to an exemplary embodiment the materials of the cover structure and other parts of the component may be selected for formation/assembly including by injection molding, etc.; according to an exemplary embodiment, a surface treatment (e.g. printing, painting, etc.) or other finishing/assembly steps may be performed to produce and complete the component configured to provide the user interface for the vehicle interior.

Exemplary Embodiments—A

According to an exemplary embodiment as shown schematically in FIGS. 1B-1D, 6A-6C, 34A-34B, 35A-35C, 36A-36C, 37A-37C, 38A-38B, 39A-39B, 40A-40B, 41A-41B, 42A-42B, 43A-43B, 44A-44B, 45A-45B, 46A-46B, 47A-47C, 48A-48C, 49A-49B, 50A-50C and 51A-MB, a component C for a vehicle interior configured to present a user interface UI for an occupant of the vehicle interior with at least one vehicle system may comprise a base comprising a housing H, a cover comprising a cover surface T and a cover structure TS and a user interface system UIS configured to present the user interface at the exterior surface comprising a light display configured to transmit light L from at least one light source LS and an input device configured to provide an interface with at least one sensor SN in housing H. See also FIGS. 3 and 4A-4B. As shown schematically in FIGS. 1C, 4A-4B, 6A-6C, 34B and 35C, the user interface may be configured to comprise output from the light display at the exterior/cover surface transmitted by the light source; the user interface may be configured to comprise input by interaction of the occupant with the input device through the interface with at least one sensor; the component C may comprise an interface module FN comprising the input device; the interface module FN may be installed within housing H.

As shown schematically according to an exemplary embodiment in FIGS. 4A-4B, 6A-6C, 34B and 35C, the component C may comprise an interface module FN comprising the light display and the input device; the component C may comprise at least one interface module FN; the component C may comprise a set of interface modules; the component C may comprise a set of light displays and a set of input devices. See also FIGS. 35B and 38A. As shown schematically in FIGS. 6B-6C, input at the input device of the user interface system may comprise interaction at the exterior surface of the cover; the input device may comprise a button; the input device may comprise a pressure-sensitive device; input may comprise pressure at the exterior surface of the cover. See also FIGS. 45A-45B, 46A-46B, 47A-47B and 48A-48B.

Figure 38A:
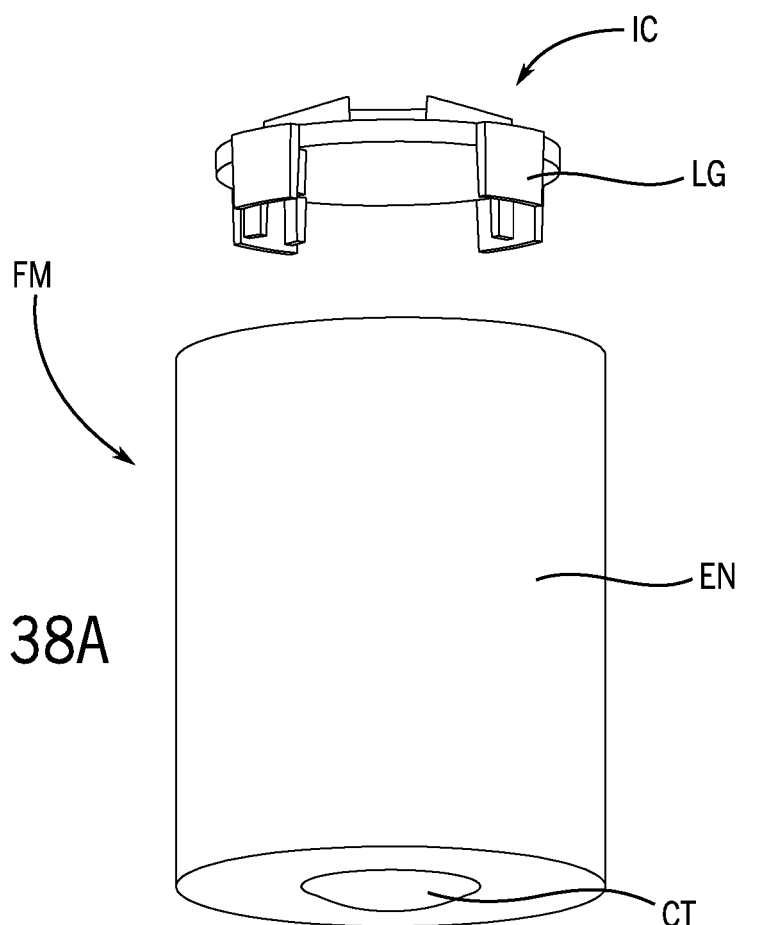
FIG. 38A is a schematic partial exploded perspective view of a vehicle interior according to an exemplary embodiment.
Figure 38B:
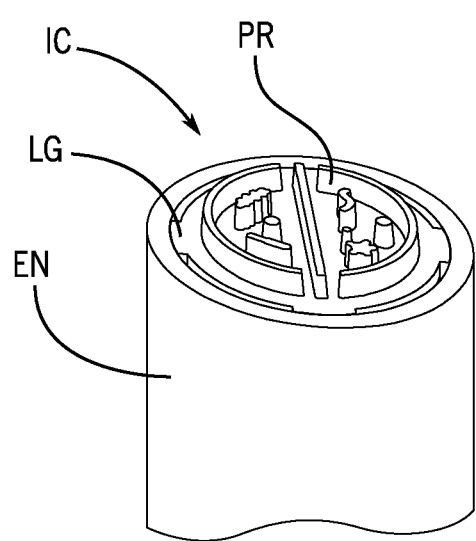
FIG. 38B is a schematic partial cutaway perspective view of an icon configured to be presented as a light display for a user interface of a vehicle interior component according to an exemplary embodiment.

As shown schematically according to an exemplary embodiment in FIGS. 4A-4B and 38A, the component C may comprise an interface module FN comprising the input device; the interface module FN may comprise the interface with at least one sensor SN; the interface with at least one sensor SN may comprise contact by the input device. See FIGS. 39A-39B, 40A-40B, 41A-41B, 42A-42B, 43A-43B and 44A-44B. As shown schematically in FIGS. 38A, 39A-39B, 40A-40B, 41A-41B, 42A-42B, 43A-43B and 44A-44B, the interface with at least one sensor SN may comprise a feature on the interface module FN; the feature may comprise a contact CT and/or an interface/coupling shown as a coupling layer CP at a bottom of the interface module FN; the feature may comprise at least one projection; the feature may comprise at least one indentation; the feature may be at a bottom of the interface module FN. As shown schematically in FIGS. 38A, 39A-39B, 40A-40B, 41A-41B, 42A-42B, 43A-43B and 44A-44B, the interface with at least one sensor SN may comprise a coupling layer CP; the interface with at least one sensor SN may comprise contact by the input device; contact by the input device may comprise contact through the coupling layer; contact may comprise contact by a feature on the interface module with the coupling layer; input by interaction of the occupant with the input device may comprise contact by the feature with the coupling layer to at least one sensor SN. See FIG. 6C. As shown schematically in FIGS. 38A, 39A-39B, 40A-40B, 41A-41B, 42A-42B, 43A-43B and 44A-44B, the interface with at least one sensor SN may comprise a coupling layer CP; the coupling layer may comprise a mechanical coupling. The interface with at least one sensor SN may comprise contact by the input device; contact by the input device may comprise contact through the coupling layer. As shown schematically in FIGS. 47A-47C and 48A-48C, the interface with at least on sensor SN may comprise a feature on the coupling layer CP; the feature may comprise at least one projection; the feature may comprise at least one indentation. See FIGS. 43A-43B and 44A-44B. As indicated schematically in FIGS. 47C and 48C, the coupling layer CP may comprise a compressible material; the coupling layer may comprise a first layer of a first material and a second layer of a second material; the coupling layer may comprise a first layer of a first material and a second layer of a second material. See FIG. 48C. The coupling layer may comprise a compressible material (see FIGS. 47A-47C and 48A-48C). The interface with at least one sensor SN may comprise the coupling layer; the interface with at least one sensor SN may comprise contact by the input device; contact by the input device may comprise contact through the coupling layer. Input by interaction of the occupant with the input device may comprise contact by a feature on an interface module through the compressible material of the coupling layer. See e.g., FIGS. 6C, 47C and 48C.

As shown schematically according to an exemplary embodiment in FIGS. 4A-4B, 6A-6B, 34B and 35C, the interface module FN may comprise the light source LS providing light L. Output for the user interface may be configured to comprise light from the light display at the exterior surface; light may comprise an image illuminated for the light display at the exterior surface; the image may comprise an icon; the light display may comprise a light guide LG; the light display may comprise a light module; the light module may comprise a light guide; the light guide may comprise projections; the cover may comprise apertures for the projections; the cover may comprise recesses for the light guide; the cover may comprise an inner surface comprising the recesses; the cover may comprise an inner surface. See FIGS. 6A-6C, 36A-36C, 39A-39B, 40A-40B, 41A-41B, 42A-42B, 43A-43B, 44A-44B, 45A-45B, 46A-46B, 47A-47B, 48A-48B, 49A-49B, 50A-50C and MA-51B. As shown schematically in FIGS. 34B and 35C, the light display may comprise a light guide; the light guide may comprise at least one projection; the at least one projection PR may be configured to transmit light from the light guide through at least one of recesses RS in the inner surface of the cover or apertures AP in the inner surface of the cover; the light guide may comprise at least one projection configured to fit at least one aperture in the inner surface of the cover so that the light display may comprise light transmitted to the external surface of the cover from the light guide through the at least one projection. See also FIGS. 6A-6C, 36A-36C, 39A-39B, 40A-40B, 41A-41B, 42A-42B, 43A-43B, 44A-44B, 45A-45B, 46A-46B, 47A-47B, 48A-48B, 49A-49B, 50A-50C and 51A-MB. As indicated schematically in FIGS. 6A-6C, 34A, 35B, 37A-37C and 38A-38B, the light guide LG for the light display may comprise at least one icon IC (e.g. as a projection) configured to be illuminated by the light source to present the image IM; the light source may comprise an LED. See also FIGS. 4A, 4B, 34B and 35C.

As shown schematically according to an exemplary embodiment in FIGS. 4A-4B and 6A-6C, input at the user interface may comprise interaction at the exterior surface through an interface module and with at least one sensor SN; the at least one sensor may comprise a sensor arrangement; the at least one sensor may be within housing H. See also FIGS. 34B, 35B and 35C. The at least one sensor may comprise a resistive sensor. As indicated schematically in FIGS. 1A-1C, 3, 4A and 4B, the user interface system may be coupled to at least one vehicle system; the user interface may be configured to facilitate interaction by the occupant of the vehicle with at least one vehicle system; the user interface system may be configured to connect to at least one vehicle system through a control module. The component C may comprise a proximity sensor.

According to an exemplary embodiment as shown schematically in FIGS. 1C, 6A-6C, 34A-34B, 35B-35C, 36A-36C, 37A-37C, 38A-38B, 39A-39B, 40A-40B, 41A-41B, 42A-42B, 43A-43B, 44A-44B, 45A-45B, 46A-46B, 47A-47C, 48A-48C, 49A-49B, 50A-50C and 51A-51B, a vehicle interior component C configured to provide a user interface system UIS comprising at least one sensor SN and at least one light source LS and configured to provide a user interface UI for interaction with a vehicle occupant in a vehicle providing at least one vehicle system may comprise a cover structure TS comprising a cover surface T configured to present the user interface for the vehicle occupant and an cover base providing an exterior surface. The user interface for the vehicle occupant may comprise a light display from at least one light source of the user interface system (e.g. for output) and an input device connected to at least one sensor SN of the user interface system (e.g. for input). As shown schematically in FIGS. 35B and 35C, the cover structure TS may comprise a composite cover structure with cover surface T and cover layer TL configured to cover at least a portion of the cover base TB. As shown schematically in FIGS. 34B and 34A, the cover structure TS may comprise cover layer TL with cover surface T. As shown schematically in FIGS. 4A-4B, 34B, 35B, 35C, 37A-37C, 38A and 38B, the component may comprise a light guide (e.g. a light-transmissive element/material); the light guide may be configured to allow transmission of light from the at least one light source to the light display for the user interface; the cover base may be molded on the light guide; the light guide may comprise an injection molded polypropylene; the light guide may be formed from a generally transparent resin material; the cover layer may be molded on the cover base and the light guide. As indicated schematically in FIGS. 34B, 35B, 35C, 37A-37C, 38A and 38B, the light guide LG may comprise a projection PR (e.g. presented in the form of an icon IC) and the cover base may comprise an aperture AP; the projection PR may extend through the aperture; the cover layer may comprise an inner surface; the inner surface of the cover layer may be coupled to an outer surface of the cover base; the cover layer may comprise a depression/recess RS; the projection PR of the light guide may be coupled to the depression/recess RS of the cover layer (e.g. may project into the recess); the projection may comprise an angled surface; the projection may comprise a height and the cover base may comprise a thickness; the thickness may be generally less than the height; the light guide may comprise a body; the projection may comprise a generally uniform height above the body. See FIGS. 34A, 36A-36C, 45A-45B, 46A-46B, 47A-47B, 48A-48B, 49A-49B, 50A-50C and 51A-51B. The light guide with projection and recess/aperture arrangement may be configured with the cover structure to facilitate the intended presentation of light for the light display for the user interface. See FIGS. 6A-6C and 34A.

As shown schematically according to an exemplary embodiment in FIGS. 49A-49B, 50A-50C and 51A-51B, the light guide LG may comprise a mask shown as a mask layer MK configured to block light from the at least one light source; the mask layer of the light guide may be provided by at least one of (a) printing; (b) ink-jet printing; (c) pad printing; (d) screen printing; (e) spraying; (f) spray depositing; (g) painting; (h) applying and ablation. The cover layer TL of the cover structure TS may comprise a mask such as a mask layer MK configured to block light from the at least one light source; the mask of the inner layer may be provided by at least one of (a) printing; (b) ink-jet printing; (c) pad printing; (d) screen printing; (e) spraying; (f) spray depositing; (g) painting; (h) applying and ablation. See FIGS. 49A-49B, 50A-50C and 51A-51B.

As shown schematically according to an exemplary embodiment in FIGS. 34B, 35B and 35C, the cover may comprise a cover structure TS shown as a composite structure comprising a cover base and a cover layer. The cover base may comprise a thickness generally between 1.5 mm and 2.5 mm; the cover layer may comprise a thickness generally between 0.75 mm and 1.25 mm. The cover base may comprise an injection molded thermoplastic elastomer; the cover base may comprise a generally opaque material. See also FIGS. 34A, 35B, 36A-36C, 37A-37C, 45A-45B, 46A-46B, 47A-47B and 48A-48B.

As shown schematically according to an exemplary embodiment in FIGS. 6C, 34B and 35C, the component may comprise a sensor SN configured to detect input from the vehicle occupant at or adjacent to the cover layer; the sensor may comprise a force sensitive resistor; the component may comprise a mechanical coupling such as mechanical interface comprising a coupling layer CP; the coupling may be configured to transmit force at the user interface to the sensor; the coupling may be configured to compress in response to force at the user interface. See also FIGS. 35B, 37A-37C, 45A-45B, 46A-46B, 47A-47B and 48A-48B. As indicated schematically in FIGS. 47A-47C and 48A-48C, the coupling may comprise at least one of (a) urethane; (b) silicone; (c) foam. The sensor may be configured to sense a change in resistance when the coupling is compressed. As indicated schematically in FIG. 48C, the coupling may comprise a top layer and a bottom layer; the top layer may comprise a material of a lower durometer than a material of the bottom layer. See also FIG. 47C (single layer compressible interface/coupling).

As shown schematically according to an exemplary embodiment in FIGS. 34B, 35B, 35C and 38A, the component may comprise a light guide LG and a structure shown as enclosure EN; the light guide may be coupled to the cover base and the enclosure may be coupled to the cover base; the structure shown as enclosure EN may be configured to guide light from a light source toward the light guide; the structure shown as enclosure EN may be configured to transmit force at the user interface to the coupling; the structure shown as enclosure EN may comprise a generally curved surface configured to compress the coupling; the sensor may comprise a generally curved surface configured to compress the coupling; the structure shown as enclosure EN may be configured to move from a default position to a depressed position to compress the coupling. See also FIGS. 4A-4B, 6A-6C, 45A-45B, 46A-46B, 47A-47B and 48A-48B.

As shown schematically according to an exemplary embodiment in FIGS. 6A-6B, 35B, 35C, 37A-37C and 38B, the structure shown as enclosure EN may be configured to enclose and support a light source for the user interface. See also FIGS. 34A-34B, 36A-36C, 45A-45B, 46A-46B, 47A-47B, 48A-48B, 49A-49B, 50A-50C and MA-MB. The cover structure with cover layer and/or cover base may be configured to flex in response to force at the user interface. See FIG. 6C. At least one light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) an LED mat; (p) a flexible LED mat. See FIGS. 4A-4B, 34B, 35C, 39A-39B, 40A-40B, 41A-41B, 42A-42B, 43A-43B and 44A-44B.

As indicated schematically according to an exemplary embodiment in FIGS. 3, 4A, 4B and 6A-6C, the light display of the user interface system with at least one light source may be configured to display data/information from vehicle systems VS and/or network connectivity N such as at least one of (a) data; (b) information; (c) vehicle system information; (d) an input panel; (e) a menu system; (f) a button; (g) an image; (h) an animation effect. The cover layer may be configured to provide a translucent effect. The component may comprise a button; the cover layer may be configured to prevent visibility of the button when the at least one light source is off. See FIGS. 6A-6C and 34A.

As shown schematically according to an exemplary embodiment in FIGS. 1A-1B, 3, 4A and 4B, the component may vehicle interior component such as a panel, trim panel, instrument panel, console, door panel, etc. (The panel/component may comprise an airbag; the cover base may be configured to cover the airbag. The cover layer may be configured to facilitate deployment of the airbag and the cover base may be configured to facilitate deployment of the airbag.) The component may comprise at least one of (a) a steering wheel assembly; (b) a console; (c) a floor console; (d) a center console; (e) an instrument panel; (f) a door panel; (g) a dashboard; (h) a display; (i) an arm rest; (j) a cockpit.

According to an exemplary embodiment as shown schematically in FIGS. 6A-6C, 34A-34B, 35A-35C, 36A-36C, 37A-37C, 38A-38B, 39A-39B, 40A-40B, 41A-41B, 42A-42B, 43A-43B, 44A-44B, 45A-45B, 46A-46B, 47A-47C, 48A-48C, 49A-49B, 50A-50C and MA-51B, a vehicle interior component C configured to provide a user interface system comprising at least one sensor SN and at least one light source and configured to provide a user interface for interaction with a vehicle occupant in a vehicle providing at least one vehicle system may comprise a cover configured to present the user interface for the vehicle occupant, a sensor configured to detect input from the vehicle occupant at or adjacent to the cover and a mechanical coupling.

As shown schematically according to an exemplary embodiment in FIGS. 3, 4A, 4B, 6C, 45A-45B, 46A-46B, 47A-47B, 48A-48B, the mechanical interface comprising coupling CP for the input device may be configured to transmit force at user interface UI to the sensor SN (e.g. such as input by touch/push from a vehicle occupant). As indicated schematically in FIGS. 4A-4B, 34B and 35C, the user interface for the vehicle occupant may comprise a light display from at least one light source of the user interface system and an input device connected to at least one sensor of the user interface system; the mechanical interface/coupling CP may be configured to compress in response to force at the user interface. See also FIGS. 6C, 45A-45B, 46A-46B, 47A-47B and 48A-48B. The sensor may comprise a force sensitive resistor. The coupling CP may comprise at least one of (a) urethane; (b) silicone; (c) foam. The sensor may be configured to sense a change in resistance when the coupling is compressed. The coupling may comprise a top layer and a bottom layer; the top layer may comprise a material of a lower durometer than a material of the bottom layer. See FIGS. 47A-47C and 48A-48C.

As indicated schematically in FIGS. 6A-6C, 34A-34B, 35B-35C, 36A-36C, 37A-37C, 38A-38B, 45A-45B, 46A-46B, 47A-47B, 48A-48B, 49A-49B, 50A-50C and MA-51B, the component C may comprise a light guide LG and a structure shown as enclosure EN; the light guide may be coupled to the cover structure TS of the cover; the enclosure may be configured to guide light from a light source LS toward the light guide; the light guide may comprise a mask shown as mask layer MK configured to block light from the at least one light source; a layer of the cover structure TS may be molded on the light guide; the light guide may comprise a projection PR and the cover layer may comprise a depression/recess RS; the projection of the light guide may be coupled to the depression/recess RS of the cover layer; the projection may comprise an angled surface; the projection may comprise a height and the cover layer may comprise a thickness; the thickness may be generally greater than the height.

As indicated schematically in FIGS. 6C, 38A, 45A-45B, 46A-46B, 47A-47B and 48A-48B, the structure shown as enclosure EN may be configured to transmit force at the user interface to the coupling; the enclosure may comprise a generally curved surface configured to compress the coupling; the sensor may comprise a generally curved surface configured to compress the coupling; the enclosure may be configured to move from a default position to a depressed position to compress the coupling; the enclosure may be configured to enclose and support a light source for the user interface. See also FIGS. 4A-4B, 34B and 35C.

According to an exemplary embodiment as shown schematically in FIGS. 38A, 40A-40B and 41A-41B, the sensor and/or base may comprise a generally curved surface configured to tune a relationship between applied force on the enclosure and resistance at the sensor. According to an exemplary embodiment as shown schematically in FIGS. 41A-41B, a radius of the generally curved surface of the structure shown as enclosure EN may be configured to tune a relationship between applied force on the enclosure and resistance at the sensor.

Figure 48A:
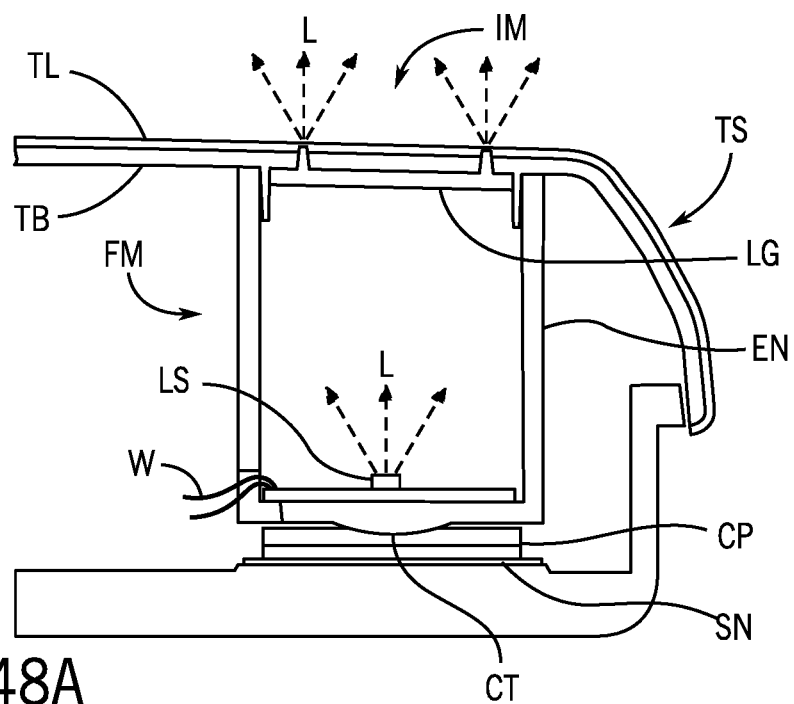
FIGS. 48A and 48B are schematic cutaway section views of a vehicle interior component according to an exemplary embodiment.
Figure 48C:
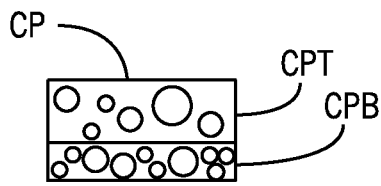
FIG. 48C is a schematic partial cutaway section view of a vehicle interior component according to an exemplary embodiment.
Figure 48B:
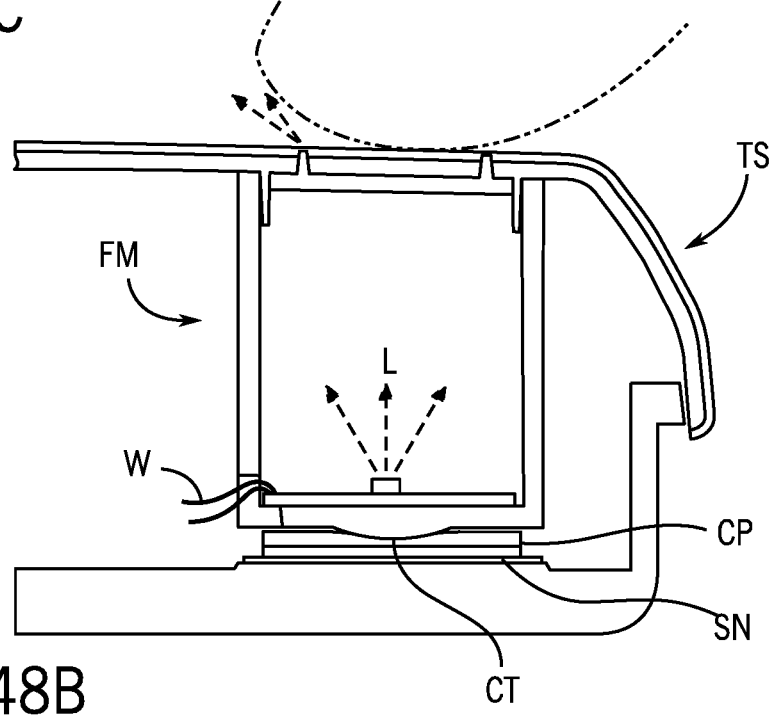
Figure 49A:
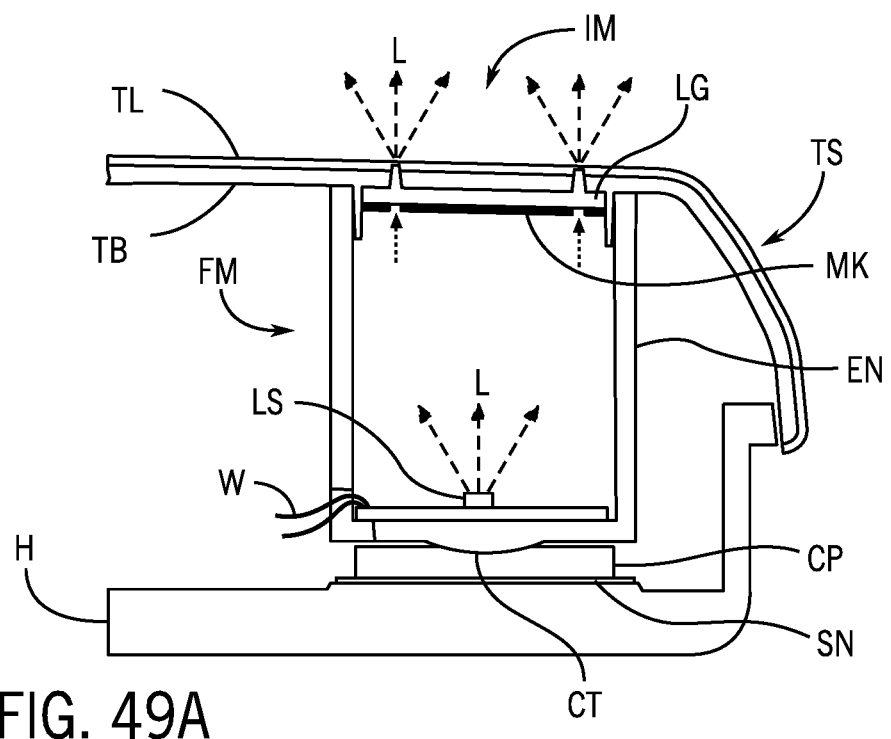
FIGS. 49A and 49B are schematic cutaway section views of a vehicle interior component according to an exemplary embodiment.
Figure 49B:
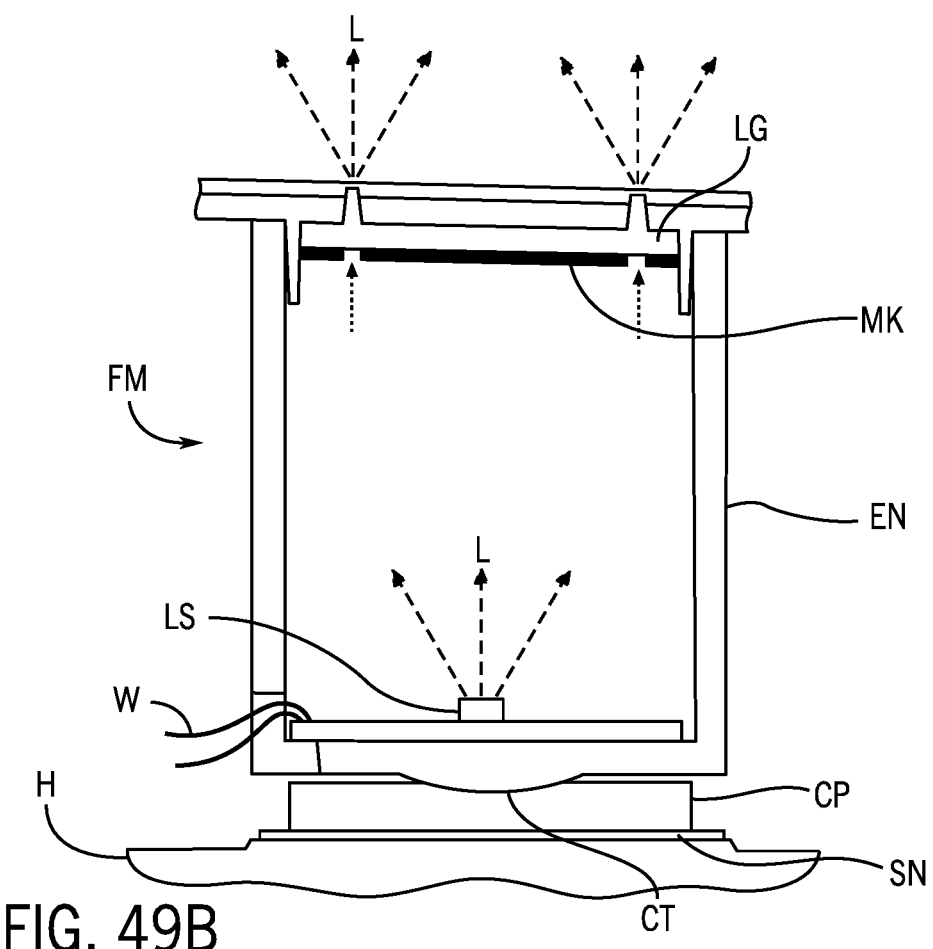
Figure 50A:
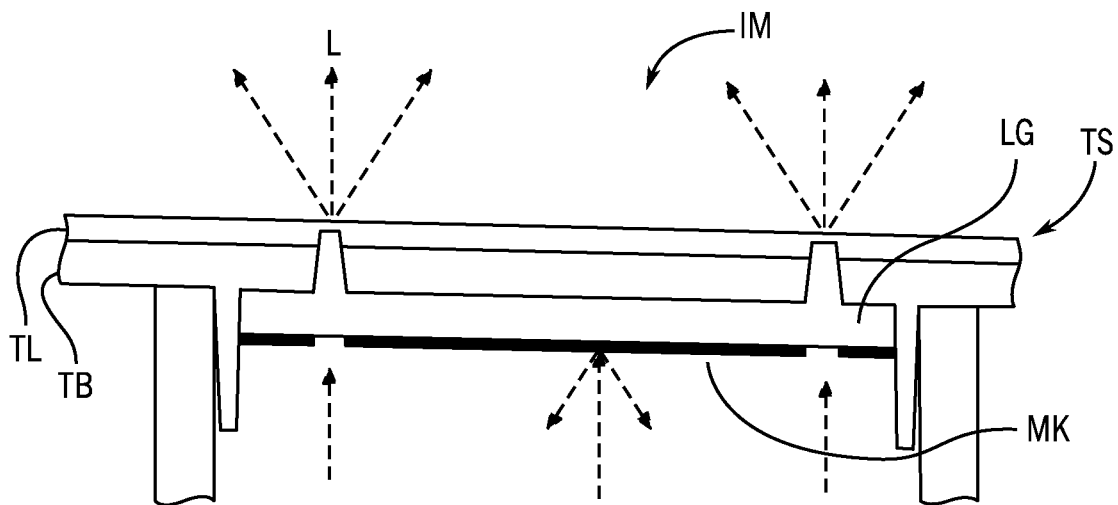
FIGS. 50A through 50C are schematic partial cutaway section views of a vehicle interior component according to an exemplary embodiment.
Figure 50B:
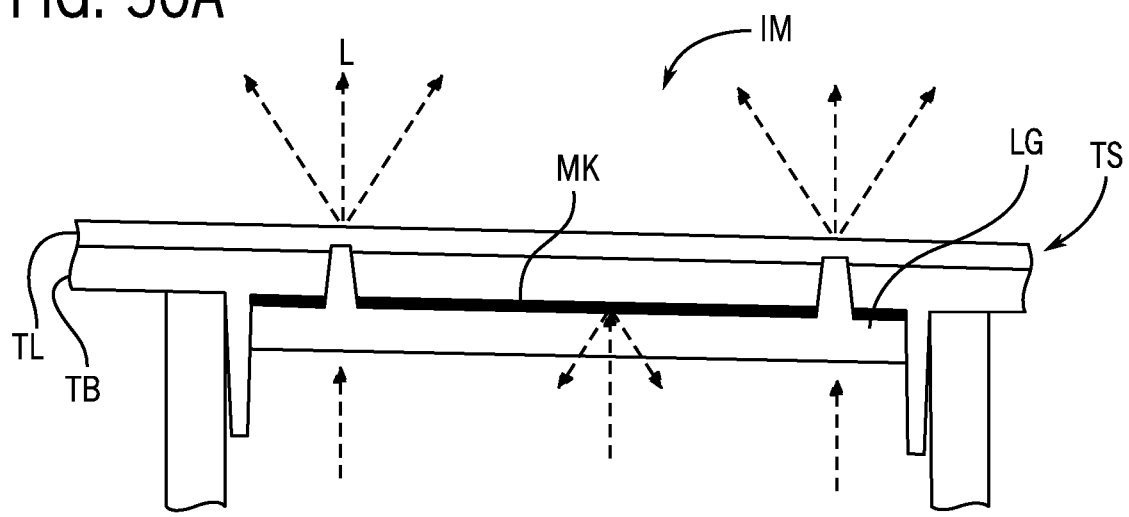
Figure 50C:
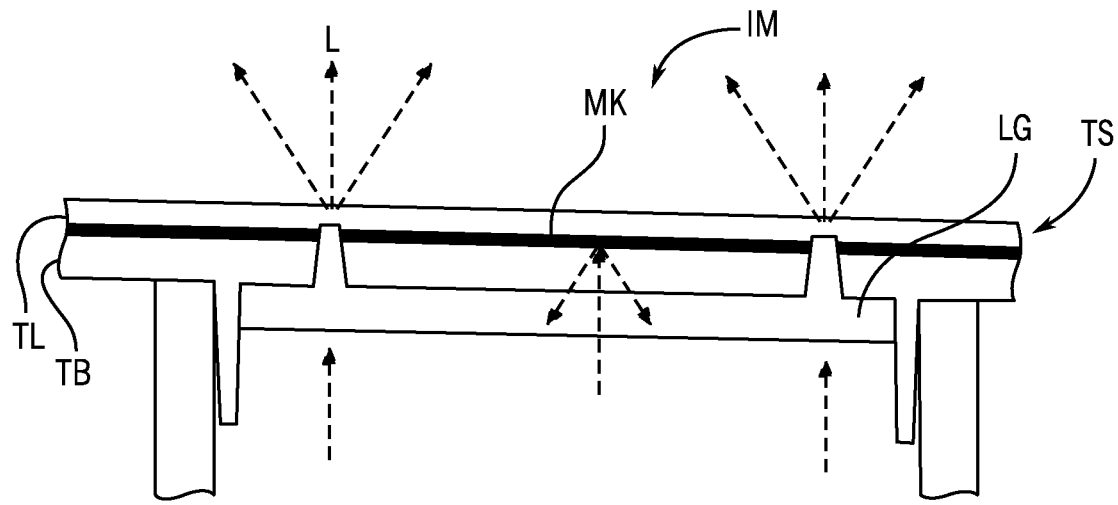
Figure 51A:
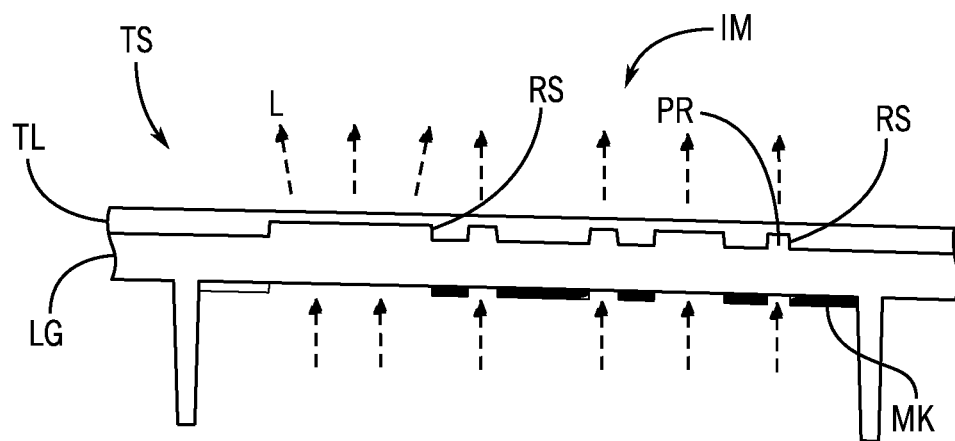
FIGS. 51A and 51B are schematic partial cutaway section views of a vehicle interior component according to an exemplary embodiment.
Figure 51B:
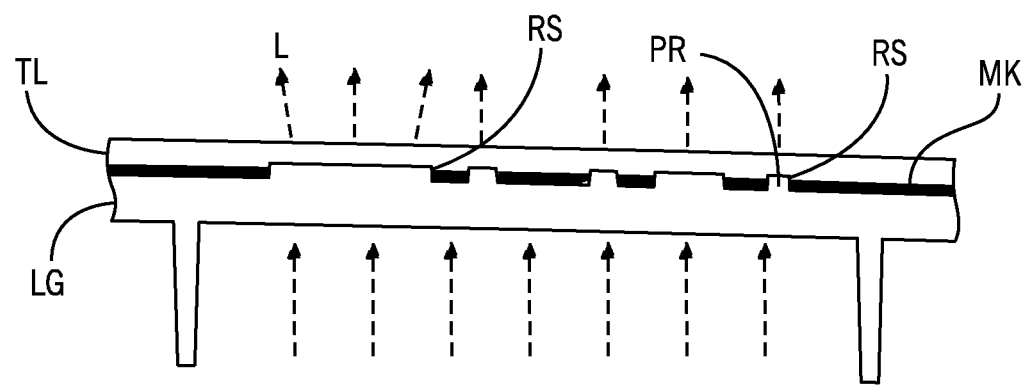

According to an exemplary embodiment as shown schematically in FIGS. 48A-48C, mechanical coupling CP may comprise a top layer CPT and a bottom layer CPB. The top layer may comprise a material of a lower durometer than a material of the bottom layer; the top layer and the bottom layer may be configured to tune a relationship between applied force on the enclosure and resistance at the sensor.

According to an exemplary embodiment as shown schematically in FIGS. 49A-49B and 50A-50B, light guide LG may comprise a mask layer MK. According to an exemplary embodiment as shown schematically in FIG. 50C, cover layer TL of the cover structure TS may comprise the mask layer MK.

As shown schematically according to an exemplary embodiment in FIGS. 1C, 3, 4A, 4B, 6A-6C, 34A, 34B, 35B and 35C, 37A-37C and 38B, a vehicle interior component C may be configured to provide a user interface system UIS comprising at least one sensor SN and at least one light source LS and configured to provide a user interface UI for interaction with a vehicle occupant in a vehicle providing at least one vehicle system VS. As shown schematically in FIGS. 34B, 35B and 35C, the component C may comprise a cover with a cover structure TS; the cover structure TS may comprise a cover base TB and a cover layer TL configured to cover at least a portion of the cover base TB and a cover surface T configured to cover at least a portion of the cover layer TL and to present the user interface UI. As indicates schematically in FIGS. 1B-1C, 3, 4A, 4B, 34A, 34B, 35B and 35C, 37A-37C and 38B, the user interface system UIS may be configured to present user interface UI for the vehicle occupant comprising a light display from at least one light source LS and an input device coupled to at least one sensor SN; the cover structure TS may comprise a composite structure of the cover base TB and the cover layer TL. See FIG. 35C.

Exemplary Embodiments—B

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a component C for a vehicle interior configured to present a user interface UI for an occupant of the vehicle interior with at least one vehicle system may comprise a housing H, a cover structure TS comprising a cover surface T and a user interface system UIS configured to present user interface UI at cover surface T comprising a light display configured to transmit light from at least one light source LS and an input device configured to provide an interface with at least one sensor in housing H. User interface UI may be configured to comprise output from the light display at cover surface T transmitted by the light source. User interface UI may be configured to comprise input by interaction of the occupant with the input device at cover surface T through the interface with at least one sensor. Component C may comprise a base B comprising housing H. Component C may comprise an interface module FM comprising the light display and the input device. Interface module FM may comprise a set of interface modules. Component C may comprise a set of light displays and a set of input devices. Input may comprise interaction at cover surface T of cover structure TS. The input device may comprise a button. Cover surface T may be configured to prevent visibility of the button when the at least one light source LS is off. The input device may comprise a pressure-sensitive device. Input may comprise pressure at cover surface T of cover structure TS. Component C may comprise an interface module FM comprising the input device. Component C may comprise an interface module FM comprising the input device. Interface module FM may comprise the interface with at least one sensor. The interface with at least one sensor may comprise a feature on interface module FM. The feature may comprise at least one projection PR. The feature may comprise at least one indentation. The interface with at least one sensor may comprise a coupling layer CP; the interface with at least one sensor may comprise contact by the input device; contact by the input device may comprise contact through coupling layer CP. The interface with at least one sensor may comprise contact by the input device. Contact may comprise contact by a feature on an interface module FM with a coupling layer CP. Input by interaction of the occupant with the input device may comprise contact at the interface with at least one sensor by a feature of a coupling layer CP to at least one sensor SN. The interface with at least one sensor may comprise contact by the input device; contact by the input device may comprise contact through a coupling layer CP. The interface with at least one sensor may comprise a coupling layer CP; coupling layer CP may comprise a mechanical coupling. Coupling layer CP may comprise a first layer of a first material and a second layer of a second material. Coupling layer CP may comprise a compressible material. Input by interaction of the occupant with the input device may comprise contact by a feature on an interface module FM through the compressible material of coupling layer CP. Interface module FM may comprise the light source. Output may be configured to comprise light from the light display at cover surface T. Light may comprise an image illuminated for the light display at cover surface T. The image may comprise an icon IC. The light display may comprise at least one of (a) a light guide LG, (b) a light module, (c) a display panel DP. The light display may comprise a light guide LG comprising at least one projection PR. The at least one projection PR may be configured to transmit light from light guide LG through at least one of (a) recesses RS in an inner surface of cover structure TS or (b) apertures AP in an inner surface of cover structure TS. The at least one projection PR may be configured to fit at least one aperture AP in an inner surface of cover structure TS so that the light display may comprise light transmitted to the external surface of cover structure TS from light guide LG through the at least one projection PR. The at least one projection PR may comprise an angled surface. The at least one projection PR may be configured to reduce perceptible distortion of an image presented by illumination at the user interface UI. The light display may comprise at least one icon configured to be illuminated by the light source; the at least one projection PR may comprise the at least one icon. Cover structure TS may comprise at least one of (a) apertures AP for the at least one projection PR and/or (b) recesses RS for the at least one projection PR. Cover structure TS may comprise at least one of (a) apertures AP for a light guide and/or (b) recesses RS for a light guide. Input may comprise interaction at cover surface T through an interface module FM and with a sensor arrangement. User interface system UIS may be coupled to at least one vehicle system; user interface UI may be configured to facilitate interaction by the occupant of the vehicle with at least one vehicle system. User interface system UIS may be configured to connect to at least one vehicle system through a control module. Component C may comprise a proximity sensor configured to activate the user interface UI. Component C may comprise an actuator AT. Actuator AT may comprise at least one of (a) a haptic actuator, (b) a transducer, (c) a speaker. Actuator AT may be configured to provide feedback to the vehicle occupant. Component C may comprise an absorber SP. Absorber SP may be configured to at least one of (a) absorb sound, (b) absorb vibration, (c) absorb assembly tolerance. Absorber SP may comprise at least one of (a) silicone, (b) TPU. The light source may comprise at least one of (a) an array, (b) a grid, (c) a panel, (d) a display panel, (e) a flexible panel, (f) a lighting array, (g) a lighting device array, (h) a light-emitting device array, (i) an LED, (j) an LED array, (k) an OLED array, (l) a flexible LED array, (m) a flexible sheet, (n) a light source directed through a light guide, (o) an LED mat, (p) a flexible LED mat. The light source may be configured to display at least one of (a) data, (b) information, (c) vehicle system information, (d) an input panel, (e) a menu system, (f) a button, (g) an image, (h) an animation effect. Cover structure TS may comprise a cover base TB and a cover layer TL; component C may comprise an airbag; cover base TB may be configured to cover the airbag; cover layer TL may be configured to facilitate deployment of the airbag and cover base TB may be configured to facilitate deployment of the airbag. The input device may comprise a sensor, the sensor may comprise at least one of (a) an array, (b) a grid, (c) a foil, (d) a panel, (e) a touch panel, (f) a flexible panel, (g) a detector, (h) a proximity detector, (i) a capacitive touch panel, (j) a pressure sensitive panel, (k) a sensor grid, (l) a sensor foil, (m) a capacitive sensor foil, (n) a camera/detector, (o) a camera, (p) a switch connector, (q) a resistive sensor, I a touch sensor, (s) a proximity sensor, (t) a switch, (u) a virtual switch, (v) a button, (w) a virtual button, (x) an electronic control. Component C may comprise at least one of (a) a steering wheel assembly, (b) a console, (c) a floor console, (d) a center console, (e) an instrument panel, (f) a door panel, (g) a dashboard, (h) a display, (i) an arm rest, (j) a cockpit.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a vehicle interior component configured to provide a user interface system UIS comprising at least one sensor SN and at least one light source LS and configured to provide a user interface UI for interaction with a vehicle occupant in a vehicle providing at least one vehicle system may comprise a cover structure TS comprising a cover layer TL and a cover base TB. User interface UI for the vehicle occupant may comprise (1) a light display from at least one light source LS of user interface system UIS and (2) an input device connected to at least one sensor SN of user interface system UIS; cover structure TS may comprise a composite cover; cover layer TL may be configured to cover at least a portion of cover base TB. Component C may comprise a light guide LG; light guide LG may be configured to allow transmission of light from the at least one light source LS to the light display for the user interface UI. Cover base TB may be molded on light guide LG. Light guide LG may comprise at least one of (a) an injection molded polypropylene, (b) a generally transparent resin material. Cover layer TL may be molded on cover base TB and light guide LG. Light guide LG may comprise a projection PR and cover base TB may comprise an aperture AP; projection PR may extend through the aperture. Cover layer TL may comprise a recess RS; projection PR of light guide LG may be coupled to recess RS of cover layer TL. Projection PR may comprise an angled surface. Projection PR may comprise a height and cover base TB may comprise a thickness; the thickness may be generally less than the height. Light guide LG may comprise a body; projection PR may comprise a generally uniform height above the body. Component C may comprise a mask MK configured to block light from the at least one light source LS. Mask MK may be applied on light guide LG by at least one of (a) printing, (b) ink-jet printing, (c) pad printing, (d) screen printing, (e) spraying, (f) spray depositing, (g) painting, (h) applying and ablation. Mask MK may be provided on an inner layer of cover base TB. Mask MK on the inner layer may be provided by at least one of (a) printing, (b) ink-jet printing, (c) pad printing, (d) screen printing, (e) spraying, (f) spray depositing, (g) painting, (h) applying and ablation. Cover layer TL may comprise an inner surface; the inner surface of cover layer TL may be coupled to an outer surface of cover base TB. Cover base TB may comprise at least one of (a) an injection molded thermoplastic elastomer, (b) a generally opaque material. Component C may comprise a sensor configured to detect input from the vehicle occupant at or adjacent to cover layer TL. Component C may comprise a mechanical coupling configured to transmit force at user interface UI to the sensor. The mechanical coupling may be configured to compress in response to force at the user interface UI. The mechanical coupling may comprise a top layer CPT and a bottom layer CPB; top layer CPT may comprise a different material than a material of bottom layer CPB. Component C may comprise a light guide LG and an enclosure. Light guide LG may be coupled to cover base TB; the enclosure may be configured to guide light from a light source toward light guide LG. The enclosure may be configured to transmit force at user interface UI to a mechanical coupling; the enclosure may be configured to move from a default position to a depressed position to compress the mechanical coupling. At least one of (a) cover base TB may be configured to flex in response to force at the user interface UI, (b) cover layer TL may be configured to flex in response to force at the user interface UI. Component C may comprise a button; cover layer TL may be configured to prevent visibility of the button when the at least one light source LS is off. Cover layer TL may comprise an outer cover configured to present user interface UI for the vehicle occupant. Cover base TB may comprise an inner cover providing an exterior surface.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a vehicle interior component configured to provide a user interface system UIS comprising at least one sensor SN and at least one light source LS and configured to provide a user interface UI for interaction with a vehicle occupant in a vehicle providing at least one vehicle system may comprise a cover configured to present user interface UI for the vehicle occupant, a sensor configured to detect input from the vehicle occupant at or adjacent to the cover and a mechanical coupling. The mechanical coupling may be configured to transmit force at user interface UI to the sensor; user interface UI for the vehicle occupant may comprise (1) a light display from at least one light source LS of user interface system UIS and (2) an input device connected to at least one sensor SN of user interface system UIS; the mechanical coupling may be configured to compress in response to force at the user interface UI. The mechanical coupling may comprise at least one of (a) urethane, (b) silicone, (c) foam. The mechanical coupling may comprise a top layer CPT and a bottom layer CPB; top layer CPT may comprise a material of a lower durometer than a material of bottom layer CPB. Component C may comprise a light guide LG and an enclosure configured to guide light from a light source toward light guide LG. Component C may comprise an interface configured to move from a default position to a depressed position to compress the mechanical coupling. Component C may comprise an interface module FM comprising an enclosure; the enclosure may be configured to enclose and support a light source for the user interface UI.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a vehicle interior component configured to provide a user interface system UIS comprising at least one light source LS and configured to provide a user interface UI for interaction with a vehicle occupant in a vehicle providing at least one vehicle system may comprise a cover configured to present user interface UI for the vehicle occupant and a light guide LG configured to allow transmission of light from the at least one light source LS to the light display for the user interface UI. User interface UI for the vehicle occupant may comprise (1) a light display from at least one light source LS of user interface system UIS and (2) an input device connected to at least one sensor SN of user interface system UIS; the cover may be configured to cover light guide LG. The cover may be molded on light guide LG. Light guide LG may comprise a projection PR and the cover may comprise a recess RS; projection PR may extend into recess RS. An inner surface of the cover may be coupled to projection PR of light guide LG. Projection PR may comprise an angled surface. Projection PR may comprise a height and the cover may comprise a thickness; the thickness may be generally greater than the height. Light guide LG may comprise a body comprising a generally uniform thickness of between 1.5 mm and 2.5 mm; projection PR may comprise a generally uniform height above the body of between 0.40 mm and 0.60 mm; the cover may comprise a thickness generally between 0.75 mm and 1.25 mm. The cover may comprise an injection molded thermoplastic elastomer. Component C may comprise a sensor configured to detect input from the vehicle occupant at or adjacent to the cover. Component C may comprise a button; the cover may be configured to prevent visibility of the button when the at least one light source LS is off.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a component C for an interior of a vehicle configured to provide a user interface UI with illumination and configured for interaction with an occupant of the vehicle and/or with at least one vehicle system may comprise a cover and a light module comprising at least one light source LS configured to provide illumination at the cover. User interface UI may comprise an image presented as a light display from at least one light source LS. The light module may comprise a set of light segments. The light module may comprise a display panel DP. The at least one light source LS may comprise at least one of (a) an LED arrangement, (b) a display panel DP. The light module may comprise a display panel DP formed into the cover. The light module may comprise light segments formed into the cover. The light module may comprise light segments projecting in an angled section into a surface of the cover. The light module may comprise a light guide and/or light segments projecting in an angled section into a surface of the cover and configured to reduce perceptible distortion of an image presented by illumination at the user interface UI.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a component C for a vehicle interior configured to present a user interface UI for interaction with an occupant of the vehicle comprising at illumination from at least one light source LS may comprise a composite structure comprising a cover and a module. The cover may comprise a surface; the module may comprise a light guide LG; the module may be integrated with light guide LG of the module and configured to allow transmission of light from the at least one light source LS to the surface of the cover to present the user interface UI; light guide LG of the module may be configured to present a light display for the user interface UI; the light source may be configured to provide illumination to the light display for the user interface UI. User interface UI may comprise (1) a light display from at least one light source LS and (2) an input device connected to at least one sensor SN. The cover may be configured to cover light guide LG. The module may comprise a light module/guide LG formed from a generally transparent resin material. The module may comprise a projection PR and the cover may comprise a recess RS; projection PR may extend into recess RS. Projection PR may comprise a height and the cover may comprise a thickness; the thickness may be generally greater than the height. The module may be integrally formed with light guide LG. Component C may comprise a cover assembly comprising the cover.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a vehicle interior component configured to provide a user interface system UIS comprising at least one sensor SN and at least one light source LS and configured to provide a user interface UI for interaction with a vehicle occupant in a vehicle providing at least one vehicle system may comprise a composite structure comprising a cover layer TL comprising an outer cover configured to present user interface UI for the vehicle occupant and a cover base TB comprising an inner cover providing an exterior surface. User interface UI for the vehicle occupant may comprise (1) a light display from at least one light source LS of user interface system UIS and (2) an input device connected to at least one sensor SN of user interface system UIS; the outer cover may be configured to cover at least a portion of the inner cover. Component C may comprise a light guide LG; light guide LG may be configured to allow transmission of light from the at least one light source LS to the light display for the user interface UI. The inner cover may be molded on light guide LG. The outer cover may be molded on the inner cover and light guide LG. Light guide LG may comprise a projection PR and the inner cover may comprise an aperture AP; projection PR may extend through the aperture. The outer cover may comprise an inner surface; the inner surface of the outer cover may be coupled to an outer surface of the inner cover. The outer cover may be configured to provide a translucent effect.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a component C for an interior of a vehicle configured to provide a user interface UI with illumination and configured for interaction with an occupant of the vehicle and/or with at least one vehicle system may comprise a composite structure comprising a cover assembly comprising a cover base TB and a cover layer TL and a light module/guide LG configured to provide illumination at cover layer TL of the cover assembly. User interface UI may comprise an image presented as (1) a light display from at least one light source LS and (2) an input device connected to at least one sensor SN of user interface system UIS. Component C may comprise an actuator AT configured to provide feedback to the vehicle occupant. Component C may comprise a steering wheel assembly.

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a vehicle interior component configured to provide a user interface system UIS comprising at least one sensor SN and at least one light source LS and configured to provide a user interface UI for interaction with a vehicle occupant in a vehicle providing at least one vehicle system may comprise a cover structure (TS) comprising a cover base (TB), a cover layer (TL) configured to cover at least a portion of the cover base (TB) and a cover surface (T) configured to cover at least a portion of the cover layer (TL) and to present the user interface (UI). The user interface system (UIS) may be configured to present the user interface (UI) for the vehicle occupant comprising a light display from at least one light source LS (LS) and an input device coupled to at least one sensor (SN); the cover structure (TS) may comprise a composite structure of the cover base (TB) and the cover layer (TL).

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a component C for a vehicle interior configured to present a user interface UI for an occupant of the vehicle interior with at least one vehicle system may comprise a base B comprising a housing (H), a cover structure (TS) comprising a cover surface (T), a user interface system (UIS) configured to present the user interface (UI) at cover surface T comprising a light display configured to transmit light (L) from at least one light source (LS) and an input device configured to provide an interface (CP) with at least one sensor (SN) in the housing (H). The user interface (UI) may be configured to comprise output from the light display at the cover surface (T) transmitted by the light source (LS); the user interface (UI) may be configured to comprise input by interaction of the occupant with the input device at the cover surface (T) through the interface (CP) with at least one sensor (SN).

According to an exemplary embodiment as shown schematically in FIGS. 1B-1D, 2, 3, 4A-4B, 5A-5C, 6A-6C, 7A-7D, 9, 10, 11, 12, 13, 15, 17A-17F, 34A-34B and 35A-35C, a vehicle interior component configured to provide a user interface system UIS comprising at least one sensor SN and configured to provide a user interface UI for interaction with a vehicle occupant in a vehicle providing at least one vehicle system may comprise a cover structure (TS) comprising a cover base (TB), a cover layer (TL) configured to cover at least a portion of the cover base (TB) and a cover surface (T) configured to cover at least a portion of the cover layer (TL) and to present the user interface (UI). The user interface system (UIS) may be configured to present the user interface (UI) for the vehicle occupant comprising an input device coupled to at least one sensor (SN); the cover structure (TS) may comprise a composite structure of the cover base (TB) and the cover layer (TL).

Exemplary Embodiments—C

Referring to FIGS. 1A and 1B, a vehicle V is shown schematically with an interior I comprising vehicle interior components C. See also FIGS. 1C-1D.

As indicated schematically in FIGS. 5A-5C and 7A-7D, a vehicle interior component C may comprise an operator control shown as steering wheel assembly SW providing members such as a base B and spokes SK. As indicated schematically in FIGS. 1C, 5A-5C, 7A-7D and 8A-8D, the steering wheel assembly SW may be configured with composite structure configured to provide a user interface UI (e.g. on members such as base B and/or spokes SK) such as comprising at least one image/display region (shown as comprising a decorative region DR and an instrumentation region IR configured to be illuminated by a light source).

As indicated schematically in FIGS. 7A-7D and 8A-8D, the steering wheel assembly may be configured to present the user interface (e.g. display/illuminated sections and/or regions) that may be integrated with vehicle systems and/or or otherwise to a controller and/or data source or network (e.g. vehicle network, internet, other networks, etc.); a decorative region DR (e.g. configured to be illuminated by a light module/source) may be operated/controlled to present an image/display (such as a decorative effect); an instrumentation region IR (e.g. configured to be illuminated by a light source) may be operated/controlled to present and image/display (such as instrumentation, data, information, etc.).

As indicated schematically in FIGS. 1C, 5A-5C, 7A-7D and 8A-8D, the user interface presented at the steering wheel assembly may be configured with or as an operator control (e.g. arrangement with sensor, button, touch pad, other functionality, etc.) to facilitate operation/interaction with one or more systems (e.g. vehicle systems, vehicle network, devices, systems, etc.). As indicated schematically in FIGS. 2, 3 5A-5C, the module for the steering wheel assembly may comprise electronics/control configured for interface with vehicle systems and/or for operation of the user interface (e.g. including presentation of image/display, illumination, display, data connectivity, network connection, sensors, etc.).

As indicated schematically in FIGS. 7A-7D and 8A-8D, the steering wheel assembly may be configured with a display/illuminated section providing a decorative region DR configured to present an image/display by illumination/lighting shown as through a light segment arrangement and/or a display/illuminated section providing an instrumentation region IR configured to present an image/display by illumination/lighting shown as through a light segment/display arrangement of indicators shown as illuminated icons/symbols.

According to an exemplary embodiment as shown schematically in FIGS. 1C, 2, 3, 5A-5C, 7A-7D, 8A-8D, 9, 10, 11, 12, 13, 14, 15A-15B, 16A-16C, 18A-18D, 19A-19D, 20A-20D, 21A-21D, 22A-22D and 23A-23D, a vehicle interior component C/SW configured to provide a user interface system comprising at least one light source and configured to provide a user interface UI for interaction with a vehicle occupant in a vehicle providing at least one vehicle system may comprise (a) a cover configured to present the user interface for the vehicle occupant and (b) a light guide LG configured to allow transmission of light from the at least one light source to the light display for the user interface. The user interface for the vehicle occupant may comprise (1) a light display from at least one light source of the user interface system and (2) an input device connected to at least one sensor of the user interface system. The cover may be configured to cover the light guide. The cover may be molded on the light guide. The light guide may comprise an injection molded polypropylene. The light guide may be formed from a generally transparent resin material. The light guide may comprise a projection PR and the cover may comprise a depression; the projection may extend into the depression. An inner surface of the cover may be coupled to the projection of the light guide. The projection may comprise an angled surface. The projection may comprise a height and the cover may comprise a thickness; the thickness may be generally greater than the height; the light guide may comprise a body comprising a generally uniform thickness of between 1.5 mm and 2.5 mm; the projection may comprise a generally uniform height above the body of between 0.40 mm and 0.60 mm; the cover may comprise a thickness generally between 0.75 mm and 1.25 mm See also FIGS. 17A-17F. The cover may comprise an injection molded thermoplastic elastomer. The component may comprise a sensor SN configured to detect input from the vehicle occupant at or adjacent to the cover. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil; (m) a capacitive sensor foil; (n) a camera/detector; (o) a camera; (p) a switch connector; (q) a resistive sensor; I a touch sensor; (s) a proximity sensor; (t) a switch; (u) a virtual switch; (v) a button; (w) a virtual button; (x) an electronic control. The at least one light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) an LED mat; (p) a flexible LED mat. The at least one light source may be configured to display at least one of (a) data; (b) information; (c) vehicle system information; (d) an input panel; (e) a menu system; (f) a button; (g) an image; (h) an animation effect. The cover may be configured to provide a translucent effect. The component may comprise a button; the cover may be configured to prevent visibility of the button when the at least one light source is off. The component may comprise an airbag; the cover may be configured to cover the airbag. The cover may be configured to facilitate deployment of the airbag.

According to an exemplary embodiment as shown schematically in FIGS. 1C, 2, 3, 5A-5C, 7A-7D, 8A-8D, 9, 10, 11, 12, 13, 14, 15A-15B, 16A-16C, 18A-18D, 19A-19D, 20A-20D, 21A-21D, 22A-22D and 23A-23D, a component C/SW for an interior of a vehicle configured to provide a user interface UI with illumination and configured for interaction with an occupant of the vehicle and/or with at least one vehicle system may comprise a cover and a module M configured to provide illumination at the cover. The component may comprise at least one of (a) a steering wheel assembly; (b) a console; (c) a floor console; (d) a center console; (e) an instrument panel; (f) a door panel; (g) a dashboard; (h) a display; (i) an arm rest; (j) a cockpit. The light module may comprise a light guide and/or a set of light segments. The light module may comprise a display panel. Illumination may be provided by a light source. The light source may comprise an LED arrangement. The light source may comprise a display panel. The user interface may comprise an image presented as (1) a light display from at least one light source and (2) an input device connected to at least one sensor of the user interface system. The light module may comprise light segments formed into the cover. The light module may comprise a display panel formed into the cover. The light module may comprise light segments projecting in an angled section into a surface of the cover. The light module may comprise light segments projecting in an angled section into a surface of the cover and configured to reduce perceptible distortion of an image presented by illumination at the user interface. The component may comprise a device configured to facilitate interaction with the occupant for the user interface; the device may comprise at least one of (a) a sensor; (b) a device configured to sense input; (c) an input device; (d) a button; (e) a control; (f) a control for a vehicle system; (g) a connection to a network; (h) an illuminated device; (i) a control visible from the light module.

According to an exemplary embodiment as shown schematically in FIGS. 1C, 2, 3, 5A-5C, 7A-7D, 8A-8D, 9, 10, 11, 12, 13, 14, 15A-15B, 16A-16C, 18A-18D, 19A-19D, 20A-20D, 21A-21D, 22A-22D and 23A-23D, a component C/SW for a vehicle interior configured to present a user interface for interaction with an occupant of the vehicle comprising at illumination from at least one light source may comprise a composite structure comprising a cover and a module. The cover may comprise a surface. The module may comprise a light guide. The module may be integrated with the light guide of the module and configured to allow transmission of light from the at least one light source to the surface of the cover to present the user interface. The light guide of the module may be configured to present a light display for the user interface; the light source may be configured to provide illumination to the light display for the user interface. The user interface may comprise (1) a light display from at least one light source of the user interface system and (2) an input device connected to at least one sensor of the user interface system. The cover may be configured to cover the light guide. The cover may be molded on the module comprising the light guide. The module may comprise an injection molded polypropylene. The module may be formed from a generally transparent resin material. The module may comprise a projection PR and the cover may comprise a depression; the projection may extend into the depression. The cover may comprise an inner surface coupled to the projection of the module. The projection may comprise an angled surface. The projection may comprise a height and the cover may comprise a thickness; the thickness may be generally greater than the height. The module may comprise a body comprising a generally uniform thickness of between 1.5 mm and 2.5 mm; the projection may comprise a generally uniform height above the body of between 0.40 mm and 0.60 mm. The cover may comprise a thickness generally between 0.75 mm and 1.25 mm. The module may be integrally formed with the light guide. The component may comprise a cover assembly comprising the cover.

Referring to FIGS. 30A-30B, 31A-31B, 32A-32B and 33A-33C, a method/process for constructing/assembling the vehicle interior component with cover structure (e.g. composite structure with cover layer and/or cover base for the cover assembly) and module (e.g. light module, etc.) is shown schematically according to an exemplary embodiment. See also FIGS. 11, 12, 13, 14 and 17A-17F.

As indicated schematically in FIGS. 30A-30B, 31A-31B, 32A-32B and 33A-33C, the cover structure (with inner/outer cover provided by cover layer and/or cover base) of the component may be formed by a molding process (e.g. injection molding, overmolding, etc.) with the light module formed and the cover base formed onto the light module (with projected light guide/segments) and the cover layer formed/assembled with the module/connectivity in a production sequence (e.g. multi-shot molding process). As indicated schematically, the light module may comprise a light-transmissive material (such as polypropylene, etc. that may be formulated to provide a selected level of transparency/transmissibility, color, etc.); the outer cover/cover layer may comprise a polymer material (such as thermoplastic olefin/TPO, molded material, film/foil, etc.); the cover may comprise a polymer material (such as a thermoplastic elastomer/TPE, resin material, etc.); the housing/sections may comprise a material such as a polymer (e.g. acrylonitrile butadiene styrene/ABS, polycarbonate/PC, resin material, etc.). According to an exemplary embodiment the materials of the cover/composite structure/assembly and component may be selected for formation/assembly including by injection molding, etc.; according to an exemplary embodiment, a surface treatment (e.g. printing, painting, etc.) or other finishing/assembly steps may be performed to produce and complete the component configured to provide the user interface for the vehicle interior.

Exemplary Embodiments—D

Referring to FIGS. 1A and 1B, a vehicle V is shown schematically with an interior I comprising vehicle interior components C. See also FIG. 1C. As indicated schematically in FIGS. 1C and 5A-5C, a vehicle interior component C may comprise an operator control shown as steering wheel assembly SW providing members such as a base B and spokes SK. As indicated schematically in FIGS. 5A-5C, 7A-7D and 11-12, the steering wheel assembly SW may be configured with a composite structure configured to provide a user interface UI (e.g. on members such as base B and/or spokes SK) such as comprising at least one image/display region (shown as comprising a decorative region DR and an instrumentation region IR configured to be illuminated by a light source).

As indicated schematically in FIGS. 7A-7D and 8A-8D, the steering wheel assembly may be configured to present the user interface (e.g. display/illuminated sections and/or regions) that may be integrated with vehicle systems and/or or otherwise to a controller and/or data source or network (e.g. vehicle network, internet, other networks, etc.); a decorative region DR (e.g. configured to be illuminated by a light module/source) may be operated/controlled to present an image/display (such as a decorative effect); an instrumentation region IR (e.g. configured to be illuminated by a light source) may be operated/controlled to present and image/display (such as instrumentation, data, information, etc.).

As indicated schematically in FIGS. 5A-5C, 7A-7D, 8A-8D, 11 and 12, the user interface presented at the steering wheel assembly may be configured with or as an operator control (e.g. arrangement with sensor, button, touch pad, other functionality, etc.) to facilitate operation/interaction with one or more systems (e.g. vehicle systems, vehicle network, devices, systems, etc.). See also FIGS. 13, 14, 16A-16C, 19A-19D, 21A-21D and 23A-23D. As indicated schematically in FIGS. 7A-7D, the module for the steering wheel assembly may comprise electronics/control configured for interface with vehicle systems and/or for operation of the user interface (e.g. including presentation of image/display, illumination, display, data connectivity, network connection, sensors, etc.).

Figure 7A:
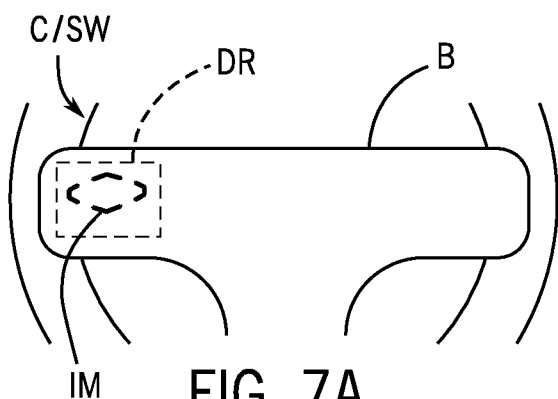
FIGS. 7A-7D are schematic partial plan views of a vehicle interior component according to an exemplary embodiment.
Figure 7B:
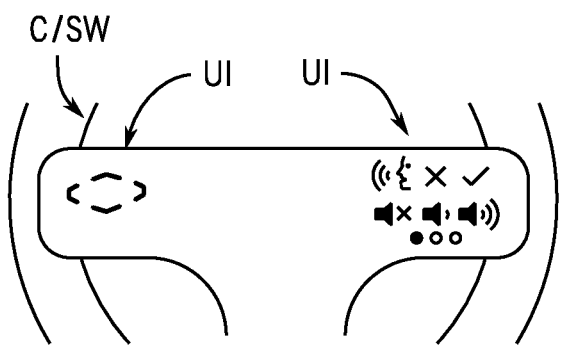
Figure 7C:
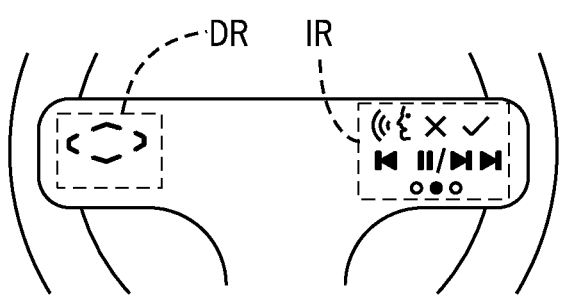
Figure 7D:
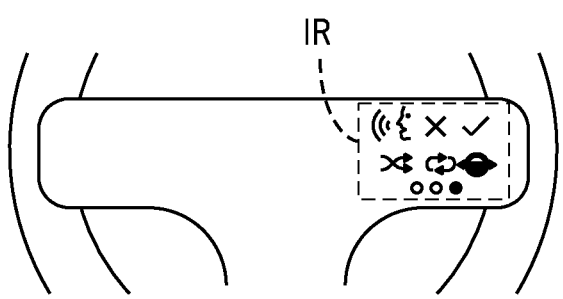
Figure 8A:
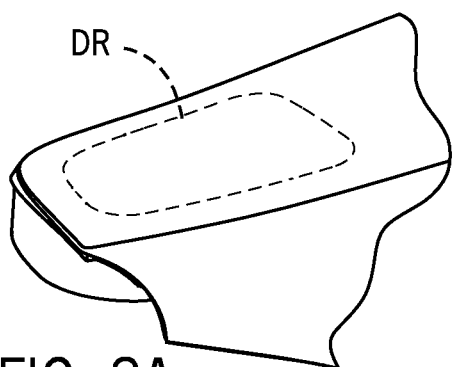
FIGS. 8A-8D are schematic partial perspective views of vehicle interior components according to an exemplary embodiment.
Figure 8B:
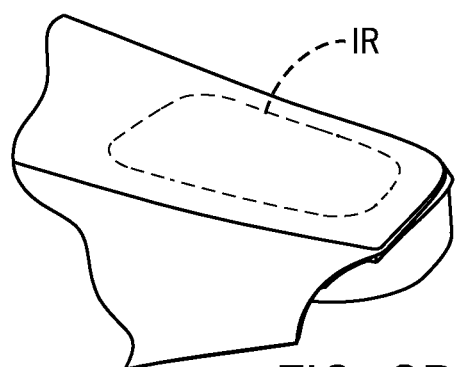
Figure 8C:
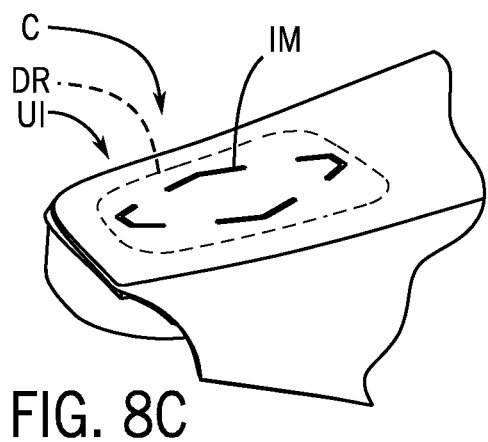
Figure 8D:
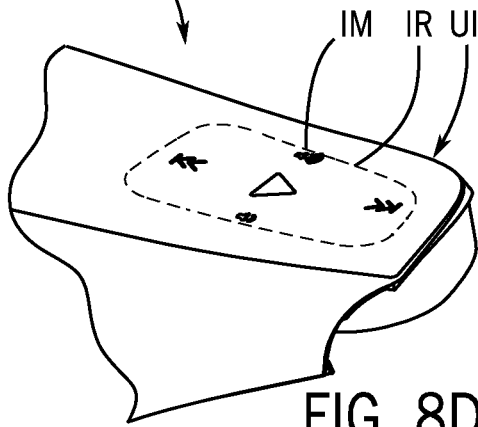
Figure 9:
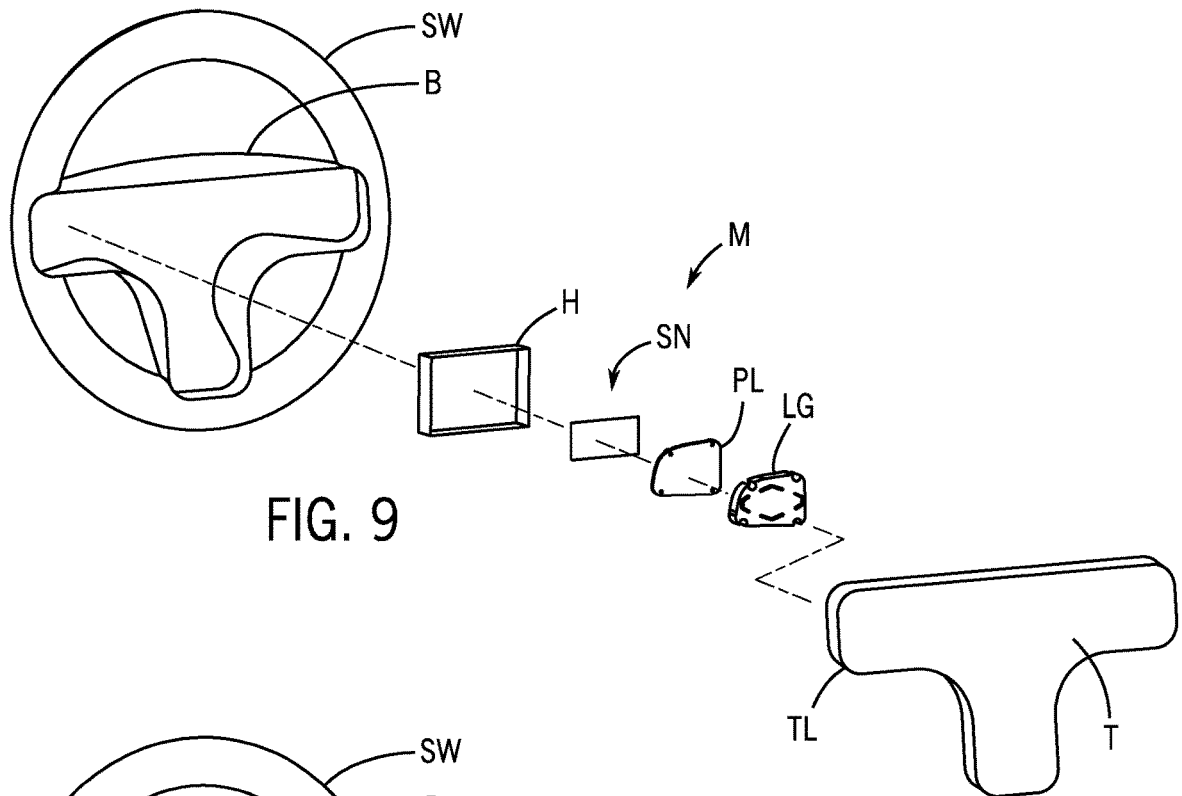
FIG. 9 is a schematic exploded perspective view of a vehicle interior component according to an exemplary embodiment.
Figure 10:
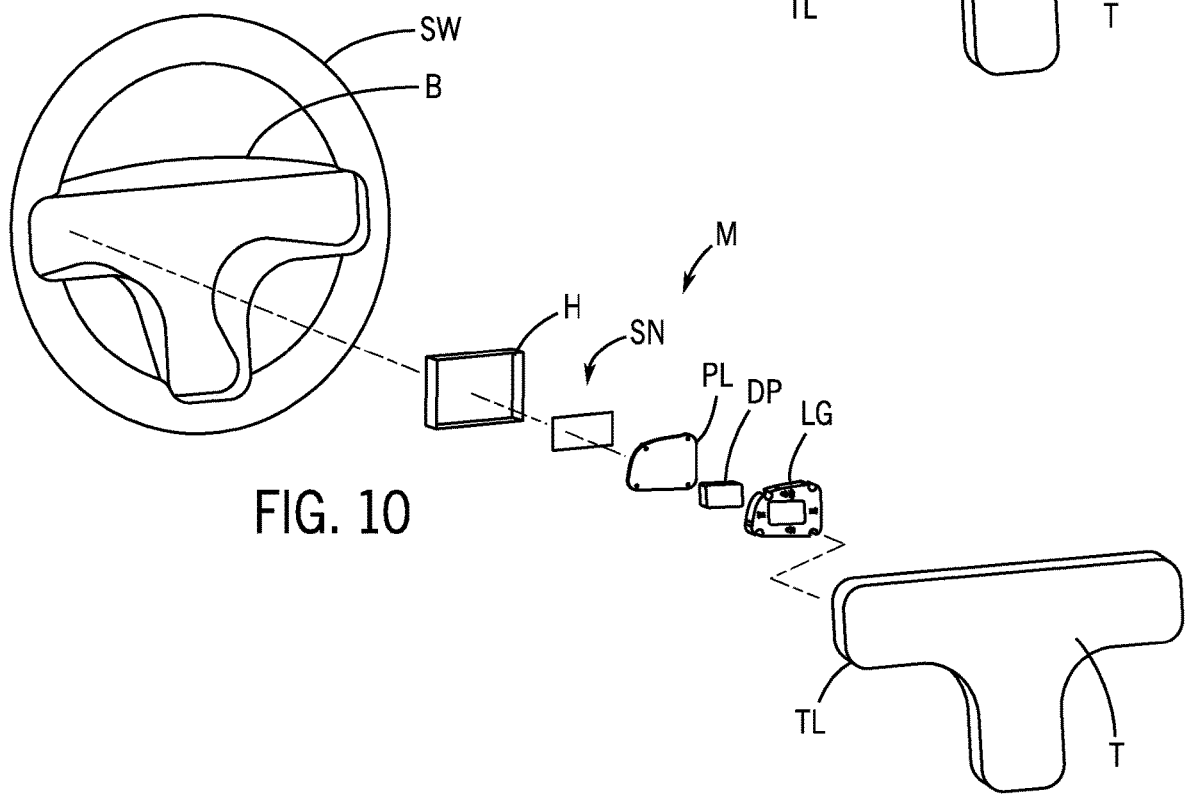
FIG. 10 is a schematic exploded perspective view of a vehicle interior component according to an exemplary embodiment.
Figure 11:
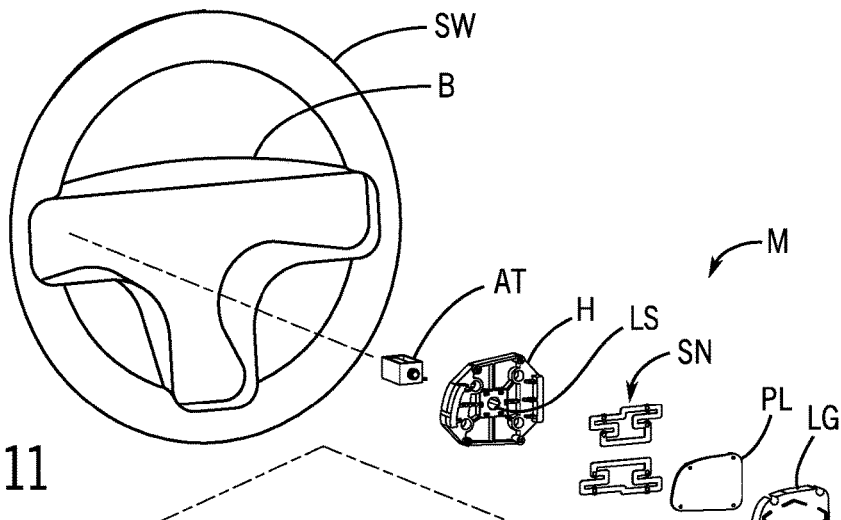
FIG. 11 is a schematic exploded perspective view of a vehicle interior component according to an exemplary embodiment.
Figure 12:
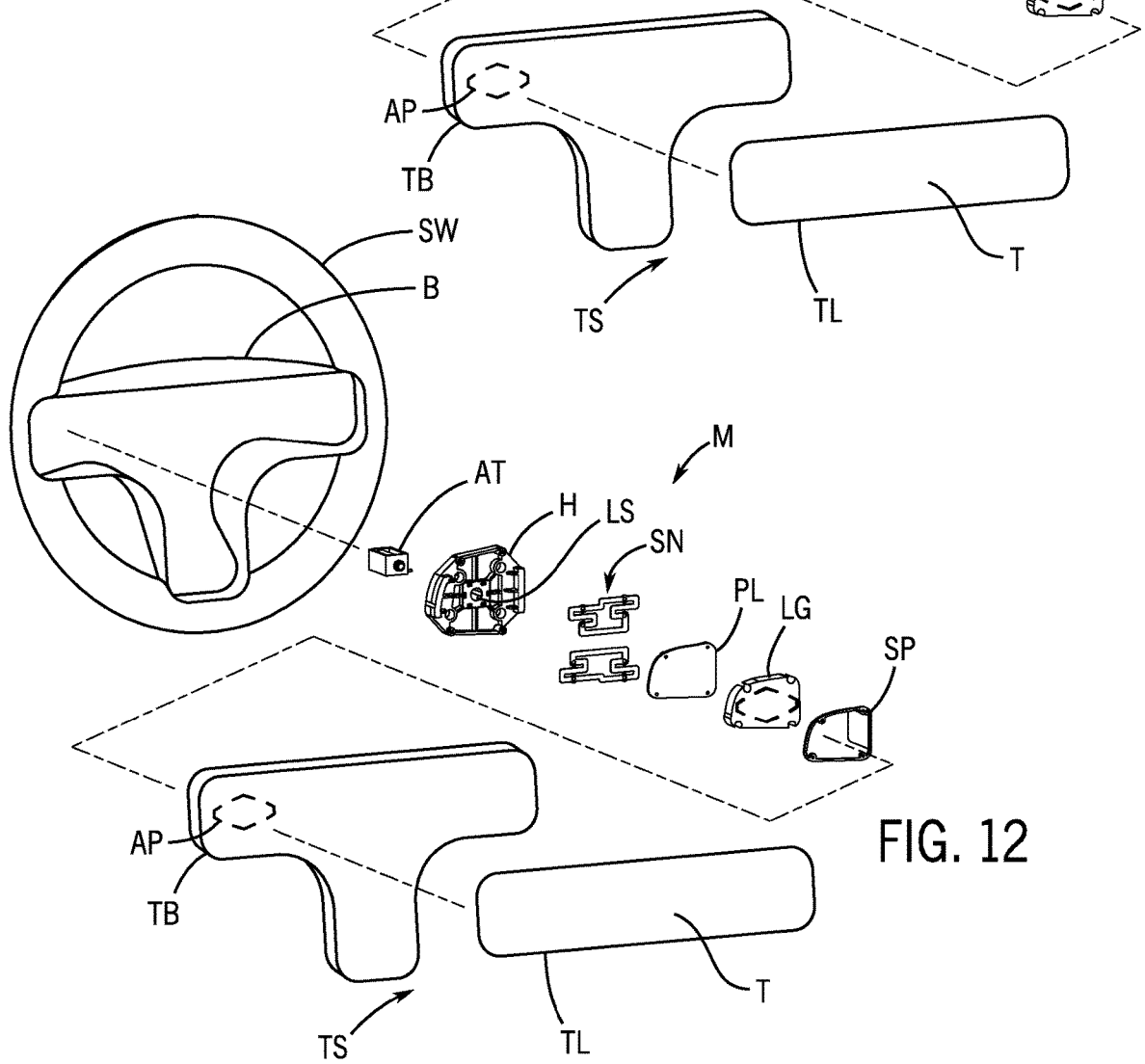
FIG. 12 is a schematic exploded perspective view of a vehicle interior component according to an exemplary embodiment.
Figure 15A:
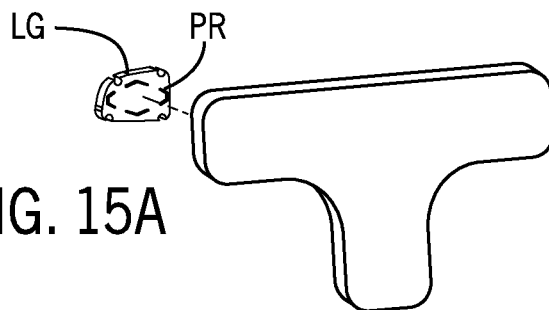
FIGS. 15A-15B are schematic exploded perspective views of a method for forming a vehicle interior component according to an exemplary embodiment.
Figure 15B:
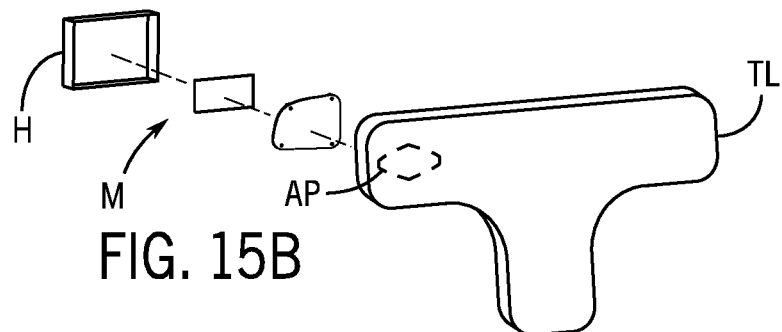
Figure 16A:
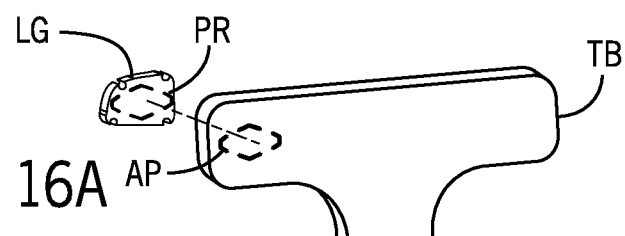
FIGS. 16A-16C are schematic exploded perspective views of a method for forming a vehicle interior component according to an exemplary embodiment.
Figure 16B:
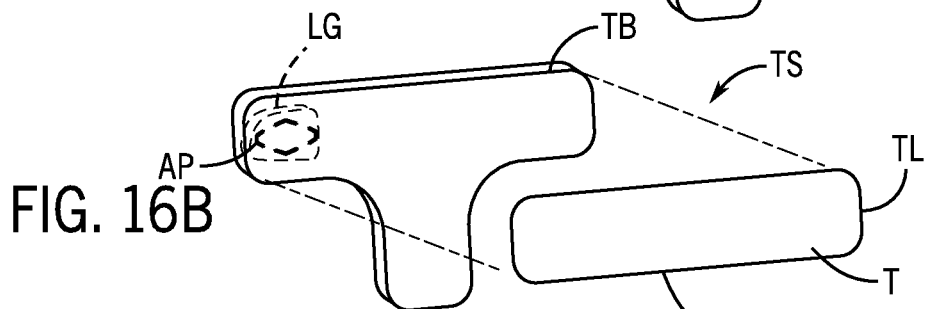
Figure 16C:
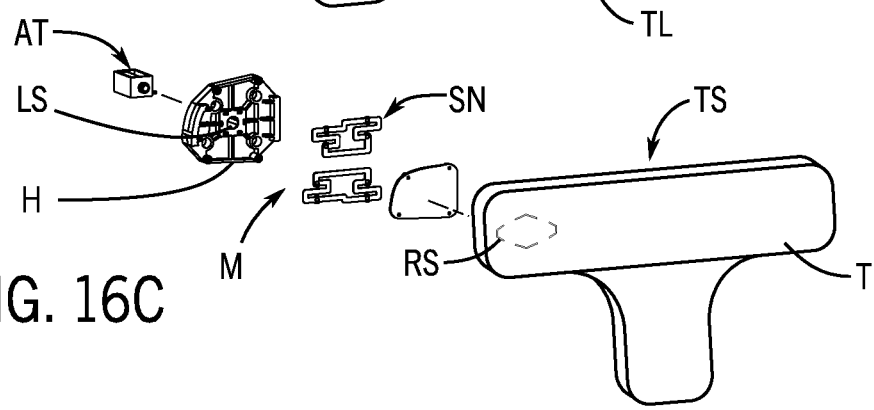
Figure 19A:
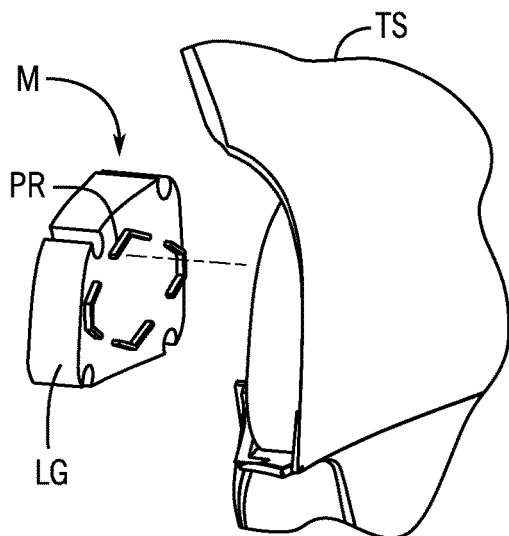
FIGS. 19A-19C are schematic exploded partial perspective views of a method for forming a vehicle interior component according to an exemplary embodiment.
Figure 19B:
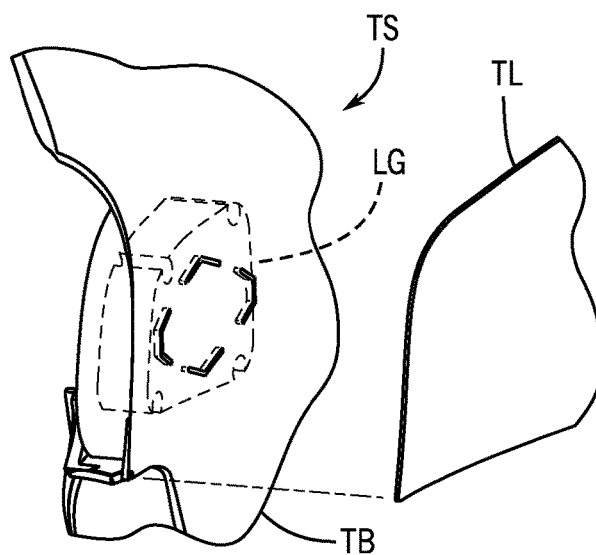
Figure 19C:
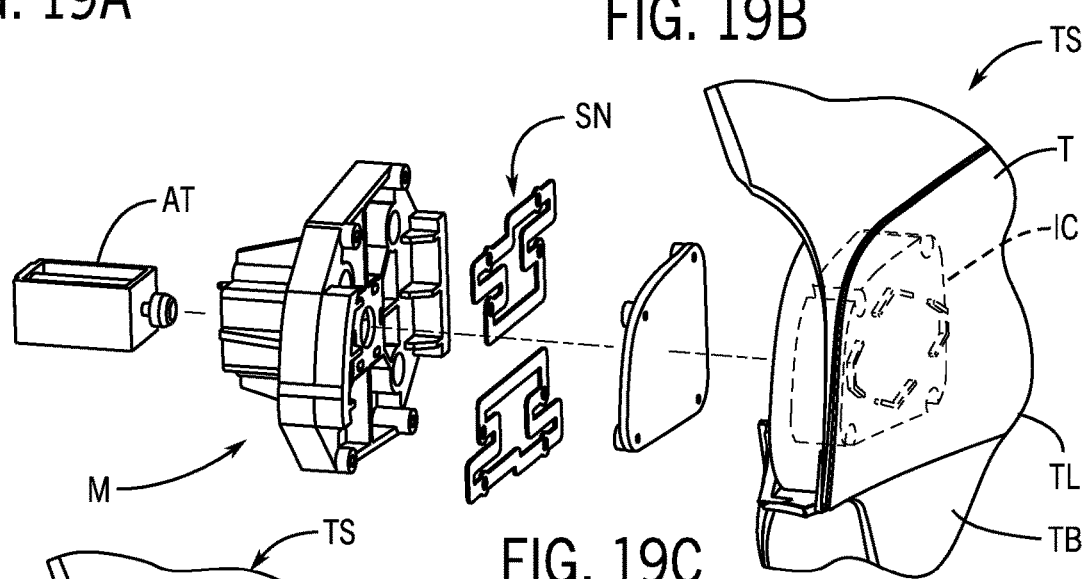
Figure 19D:
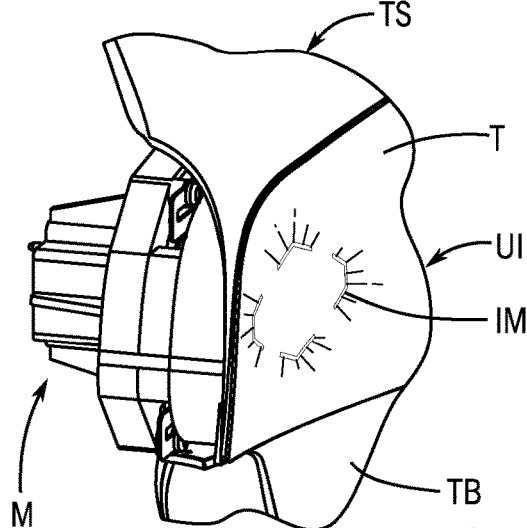
FIG. 19D is a schematic partial perspective view of a vehicle interior component according to an exemplary embodiment.
Figures 20A, 20B:
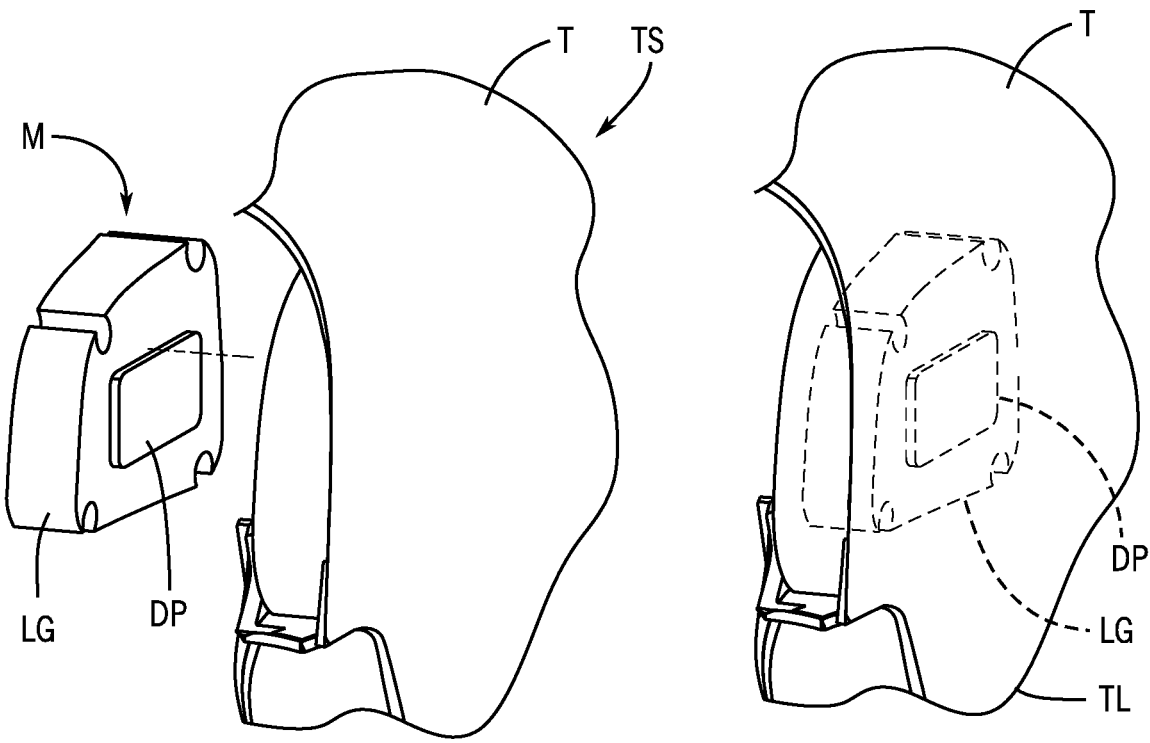
FIGS. 20A-20D are schematic exploded partial perspective views of a method for forming a vehicle interior component according to an exemplary embodiment.
Figures 20C, 20D:
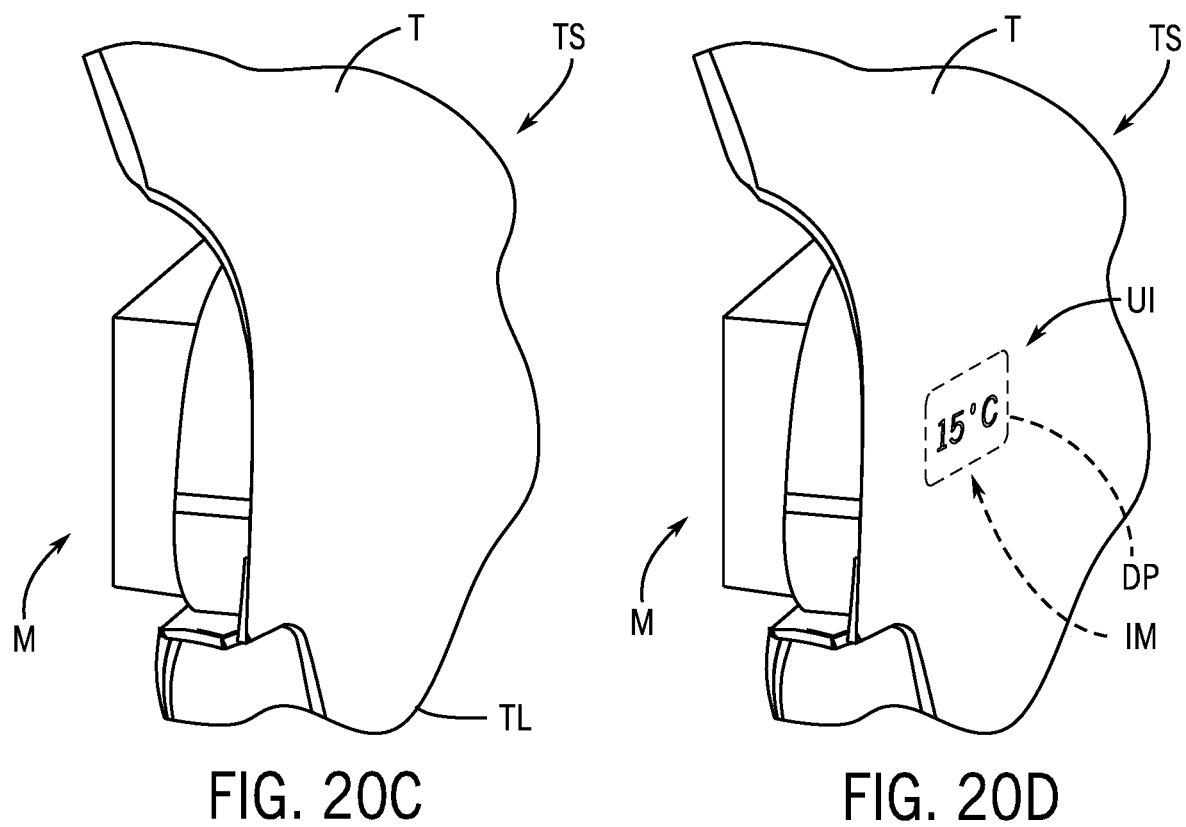
Figure 21A:
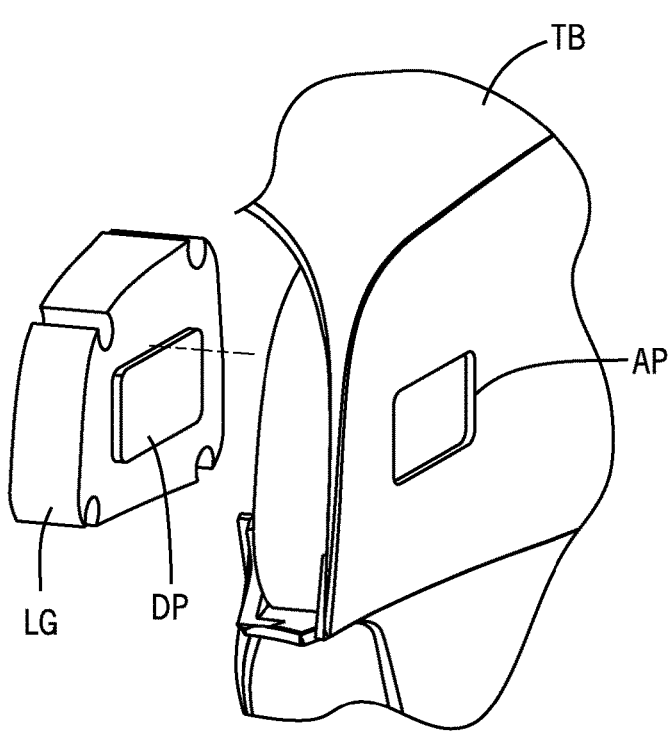
FIGS. 21A-21D are schematic exploded partial perspective views of a method for forming a vehicle interior component according to an exemplary embodiment.
Figure 21B:
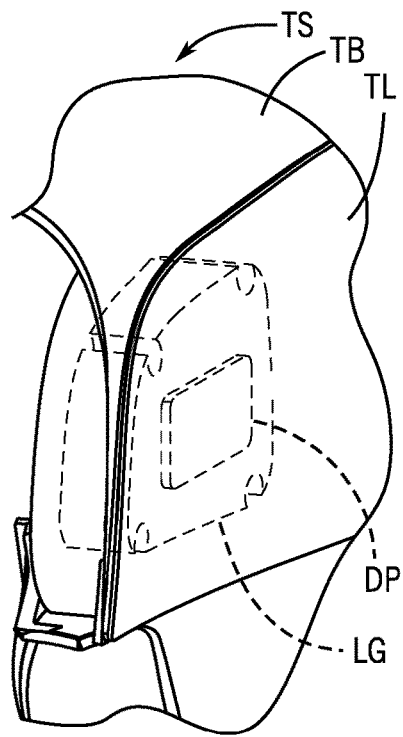
Figure 21C:
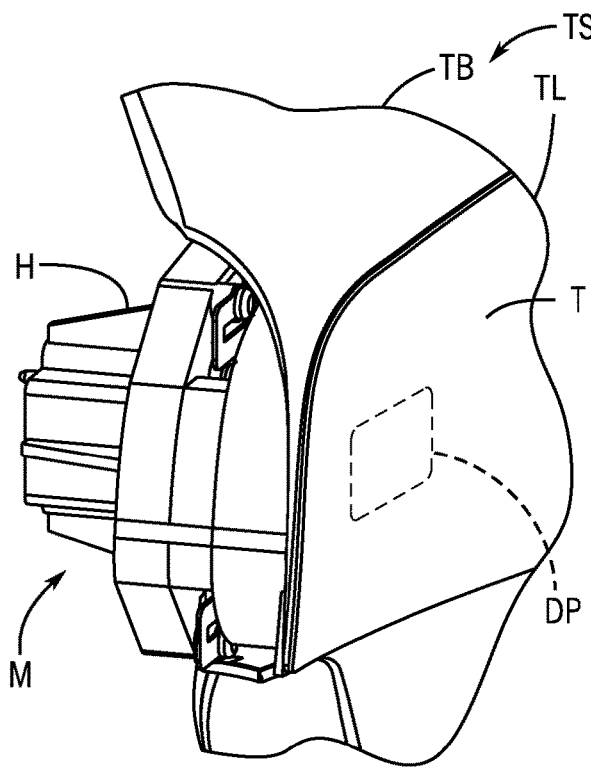
Figure 21D:
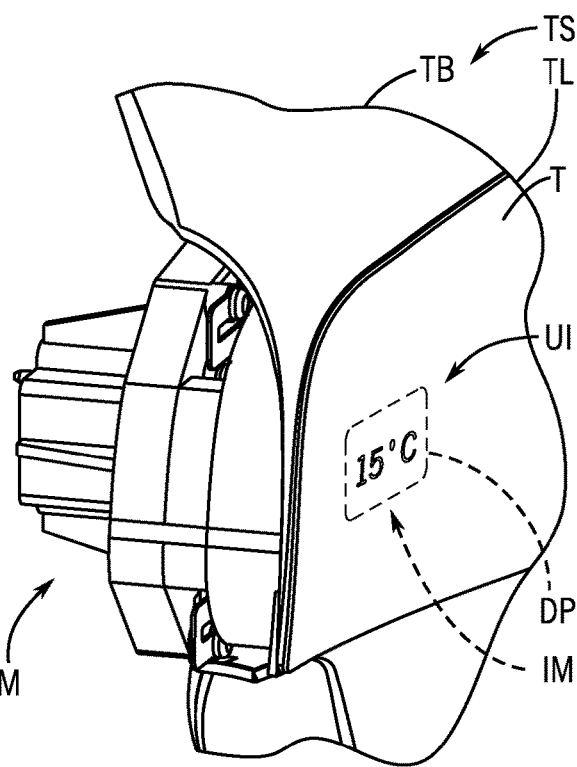
Figure 22A:
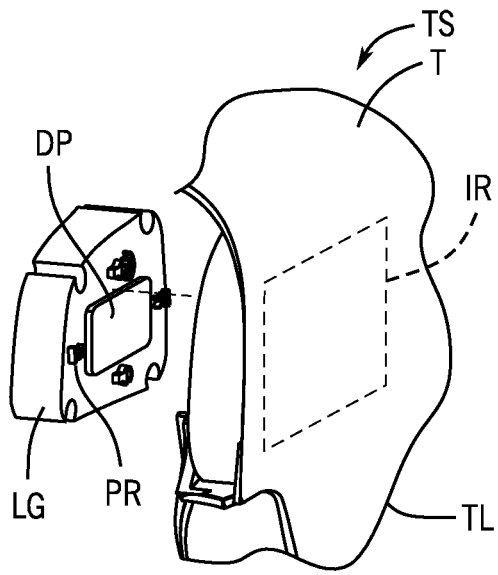
FIGS. 22A-22D are schematic exploded partial perspective views of a method for forming a vehicle interior component according to an exemplary embodiment.
Figure 22B:
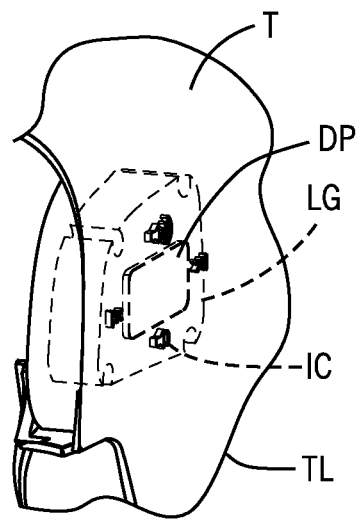
Figure 22C:
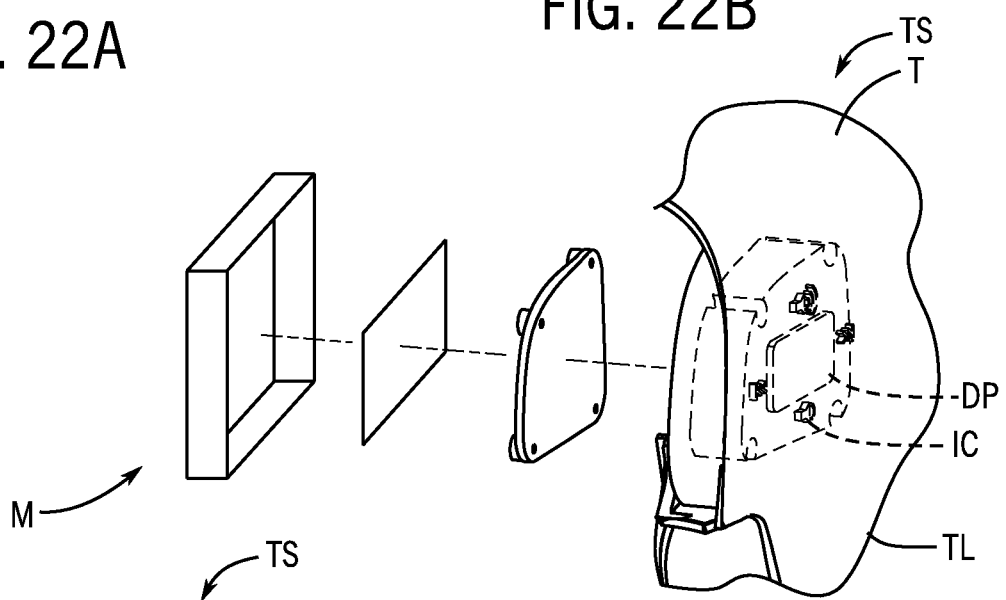
Figure 22D:
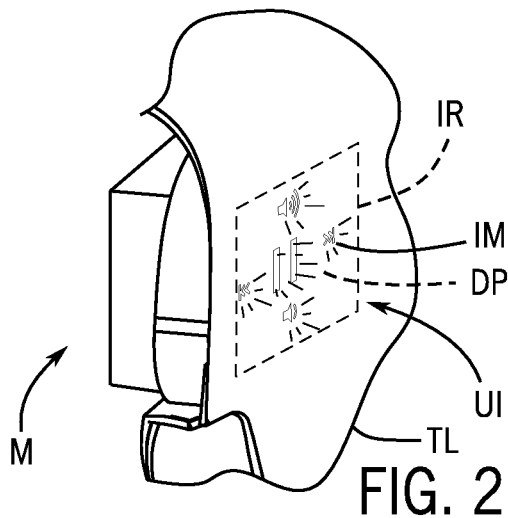
Figure 23A:
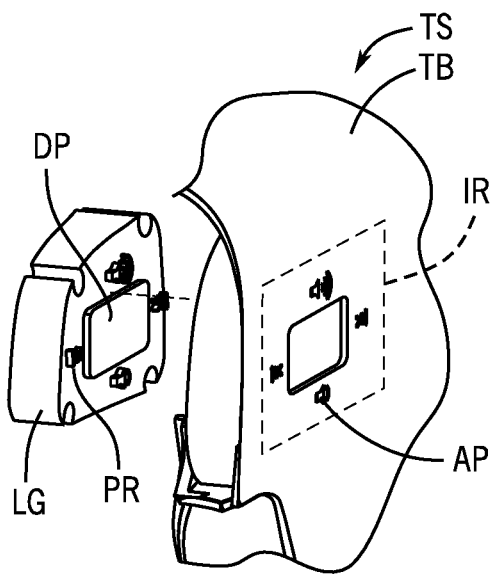
FIGS. 23A-23D are schematic exploded partial perspective views of a method for forming a vehicle interior component according to an exemplary embodiment.
Figure 23B:
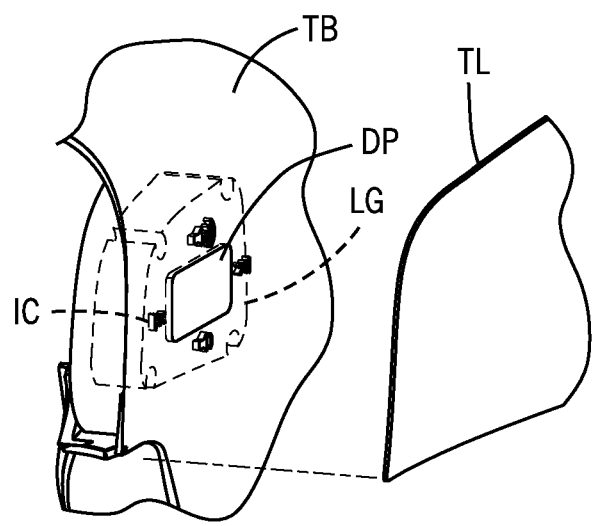
Figure 23C:
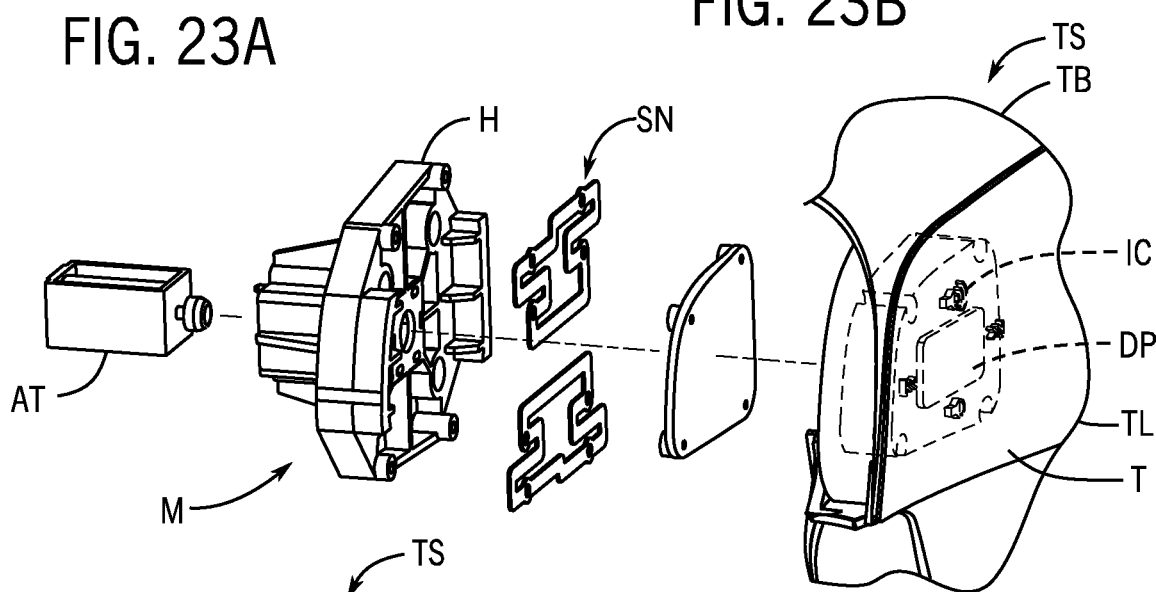
Figure 23D:
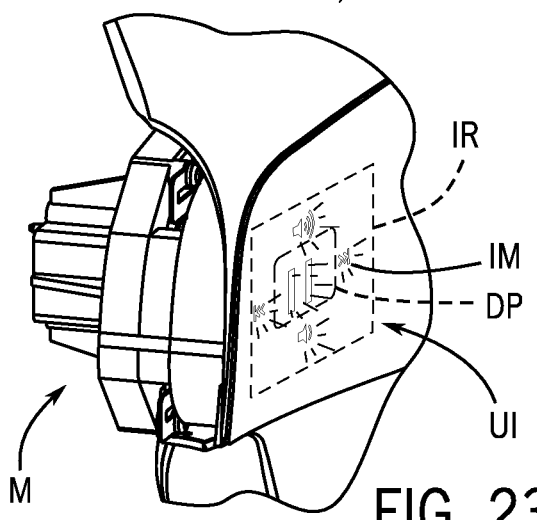
Figure 24A:
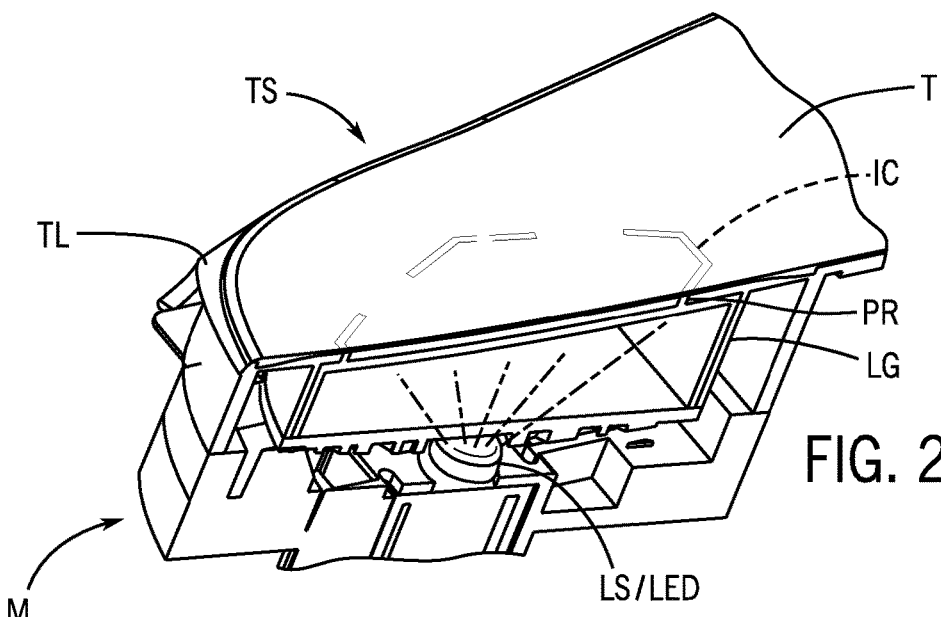
FIG. 24A is a schematic partial section perspective view of a vehicle interior component according to an exemplary embodiment.
Figure 24B:
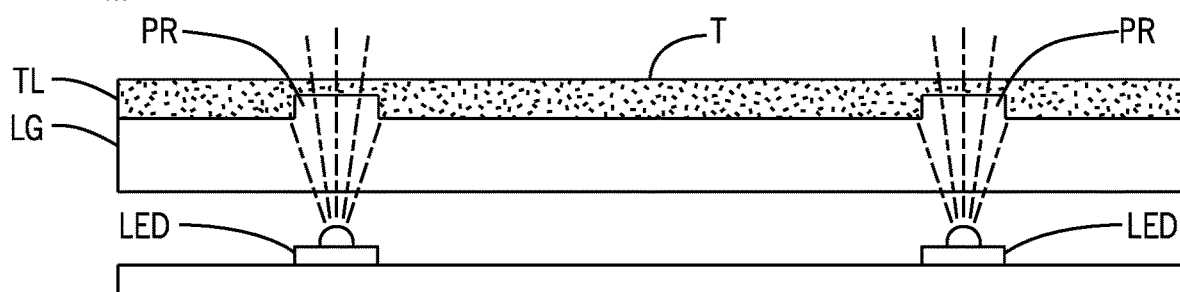
FIGS. 24B-24D are schematic partial section views of a vehicle interior component according to an exemplary embodiment.
Figure 24C:
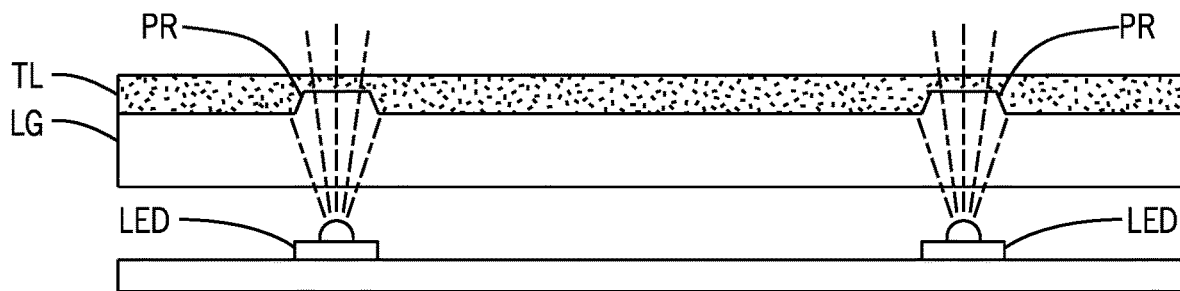
Figure 24D:
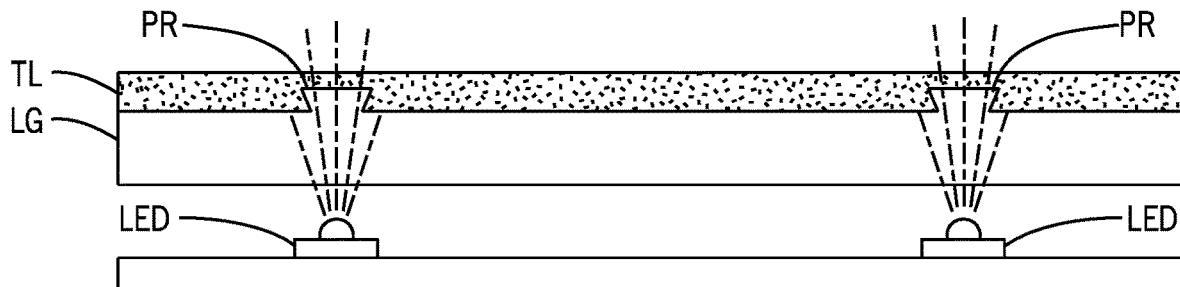

As indicated schematically in FIGS. 7A-7D and 8A-8D, the steering wheel assembly may be configured with a display/illuminated section providing a decorative region DR configured to present an image/display by illumination/lighting shown as through a light segment arrangement and/or a display/illuminated section providing an instrumentation region IR configured to present an image/display by illumination/lighting shown as through a light segment/display arrangement of indicators shown as illuminated icons/symbols (see FIGS. 7B-7D).

As indicated schematically in FIGS. 11, 12, 13 and 14, the steering wheel assembly SW may comprise the base B with cover structure TS and a light/display module M for the user interface. As indicated schematically in FIGS. 11 and 12, the module M may comprise a light module (providing light guide/segments) and a base plate PL with sensor arrangement SN in a housing H. As indicated schematically in FIGS. 11, 12, 13 and 14, the module M may comprise an actuator AT. The actuator may comprise a haptic actuator. The actuator may be configured to provide feedback to the vehicle occupant. See also FIGS. 16A-16C and 19A-19D. As indicated schematically in FIG. 12, the module M may comprise an absorber SP. The absorber may be configured to at least one of (a) absorb sound; (b) absorb vibration; (c) absorb assembly tolerance. The absorber may comprise at least one of (a) silicone; (b) TPU. As indicated schematically in FIGS. 13 and 14, the module M may comprise a display panel DP with a light module and a base plate PL with sensor arrangement SN in a housing H. See also FIGS. 21A-21D and 23A-23D. As indicated schematically according to an exemplary embodiment in FIGS. 11, 12, 13 and 14, the module M may comprise a fitted bezel arrangement of the light module (e.g. with light guide/projection segments and/or with display panel) and housing (with sensor, etc.) configured to present the image/display region of the user interface for the surface on the cover of the steering wheel assembly. See also FIGS. 7A-7D and 8A-8D.

As indicated schematically according to an exemplary embodiment in FIGS. 7A-7D, 11, 12, 13 and 14, the module configured to provide user interface UI at the surface of the cover structure TS of the for the steering wheel assembly SW may be configured to provide an image/display IM by illumination from a light source LS for the light module/guide such as an LED arrangement/panel (through light guide/segments projected at the surface) and/or a display panel DP (presented at the surface). See also FIGS. 8A-8D, 16A-16C, 19A-19D, 21A-21D and 23A-23D.

As indicated schematically according to an exemplary embodiment in FIGS. 25A-25D and 27A-27C, the component shown as steering wheel assembly with cover structure TS may comprise a composite structure formed to comprise the top cover layer TL, a cover base TB and the light module (providing projecting light segments/guide LG) to present the user interface. See also FIGS. 32A-32C (flow diagrams of construction/assembly of steering wheel assembly with composite structure). As indicated schematically in FIGS. 25A-25D, 27A-27C and 29A-29B, the composite structure of the steering wheel assembly formed with the light module/guide and cover base TB with top cover layer TL may be configured to present an image/display IM for a user interface provided by illumination from a light source LS shown as comprising an LED arrangement/array projected through a light segment of the light module/guide LG. See also FIGS. 5A-5C, 7A-7D, 8A-8D, 21A-21D and 23A-23D.

Figure 25A:
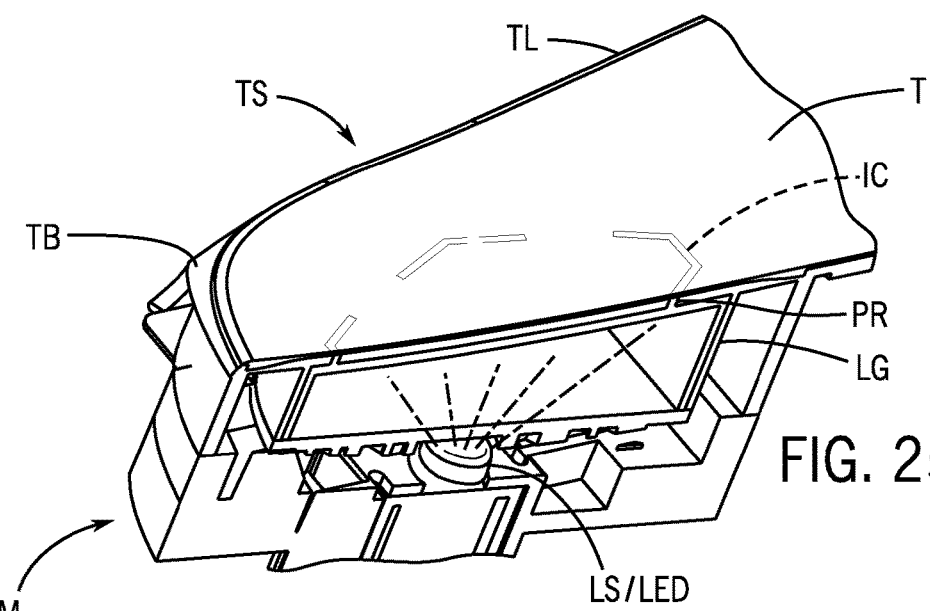
FIG. 25A is a schematic partial section perspective view of a vehicle interior component according to an exemplary embodiment.
Figure 25B:
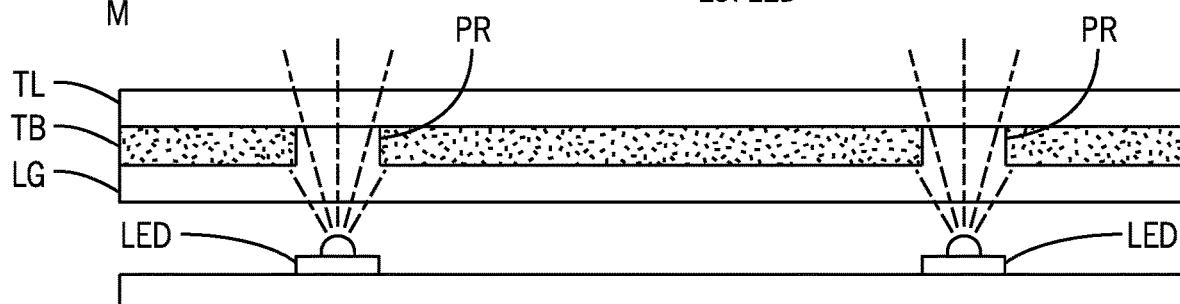
FIGS. 25B-25D are schematic partial section views of a vehicle interior component according to an exemplary embodiment.
Figure 25C:
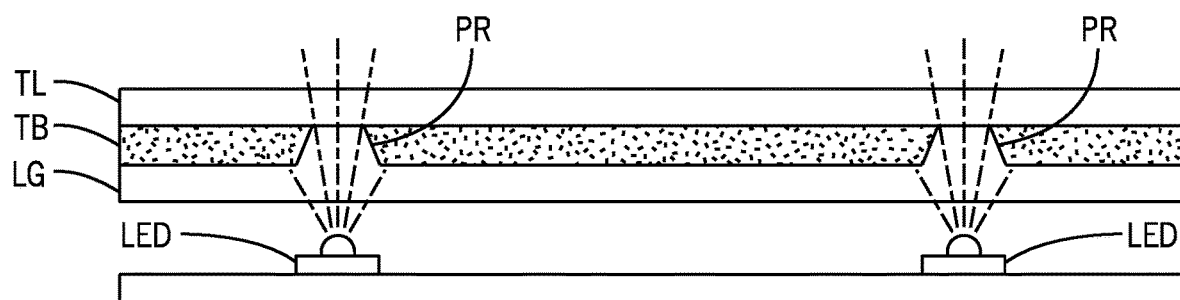
Figure 25D:
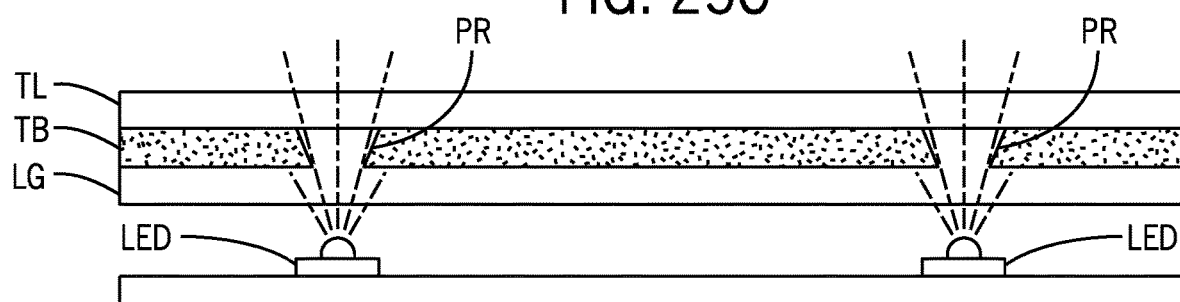
Figure 26A:
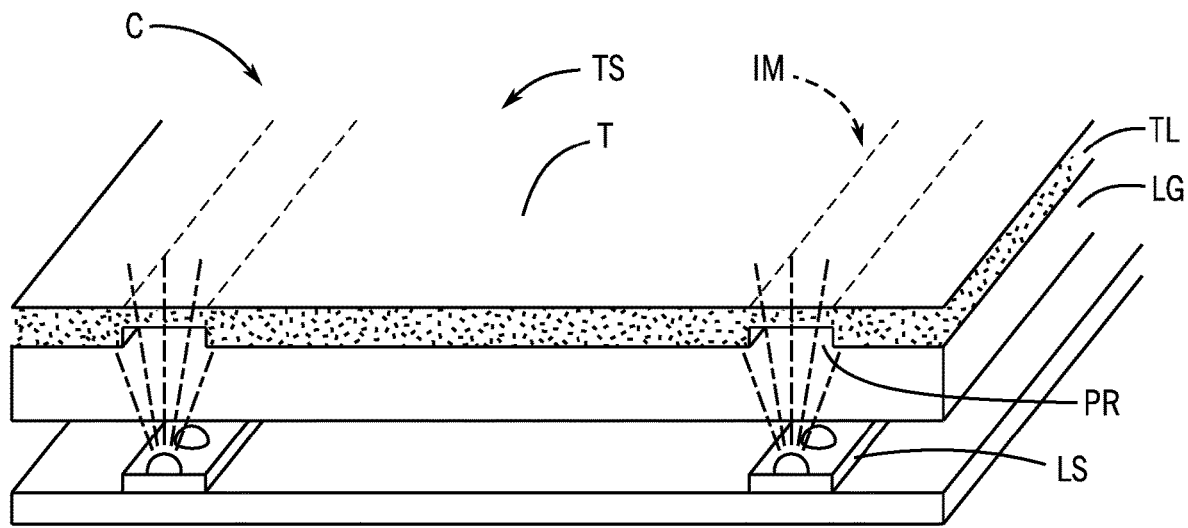
FIGS. 26A-26C are schematic partial section perspective views of a vehicle interior component according to an exemplary embodiment.
Figure 26B:
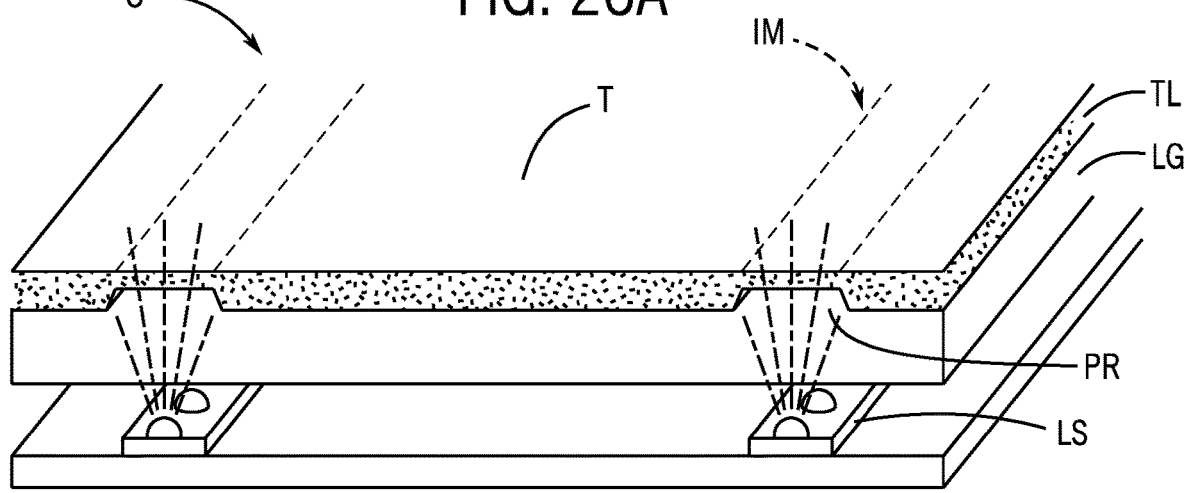
Figure 26C:
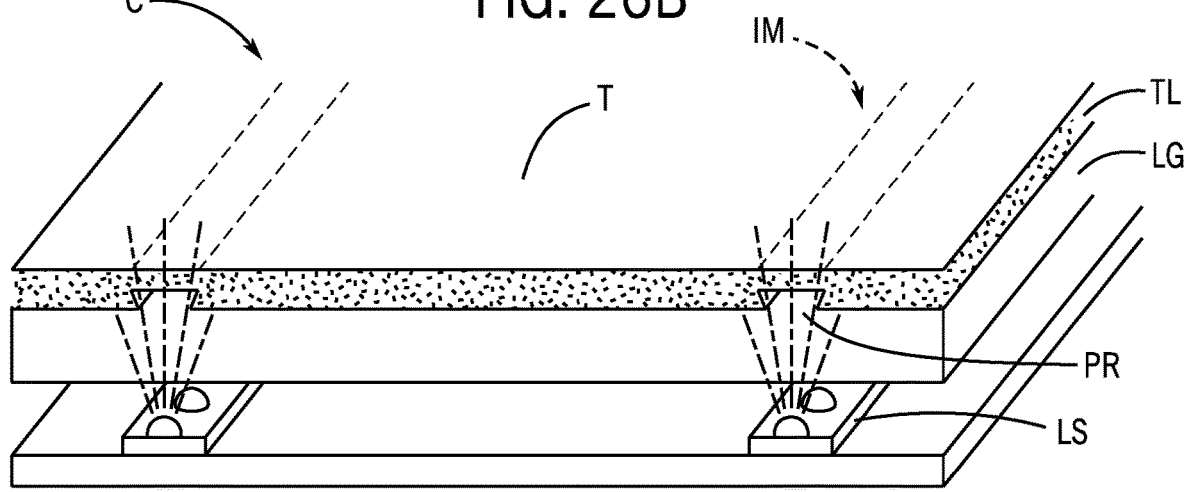
Figure 27A:
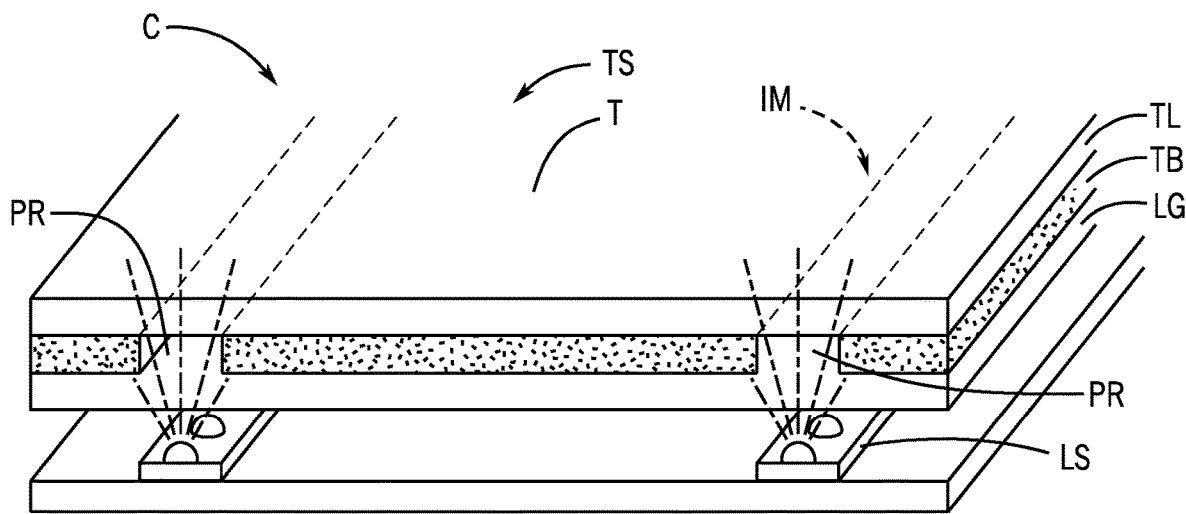
FIGS. 27A-27C are schematic partial section perspective views of a vehicle interior component according to an exemplary embodiment.
Figure 27B:
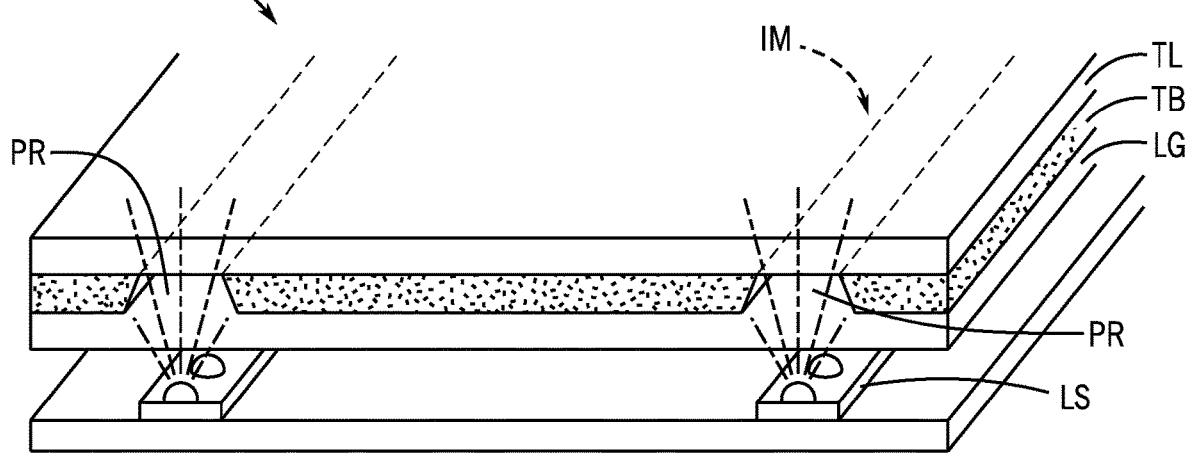
Figure 27C:
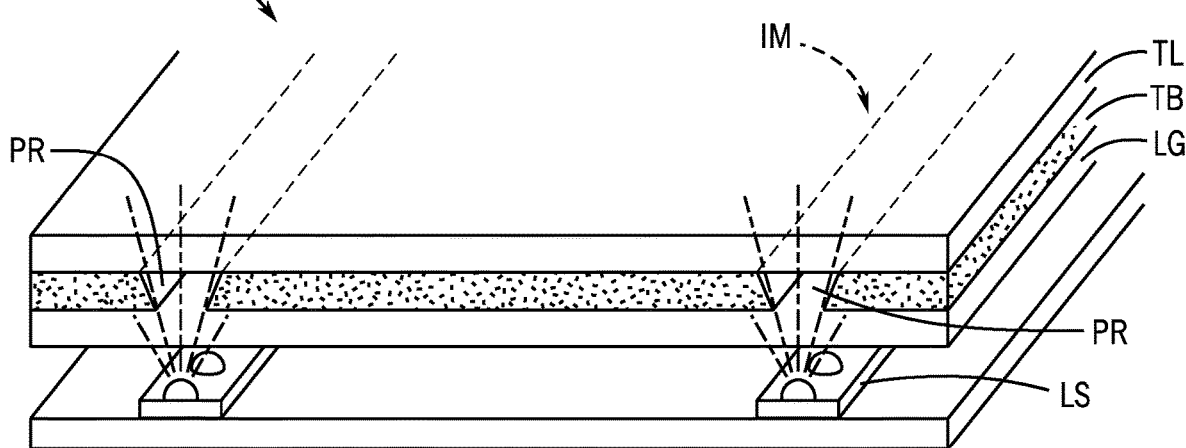

As indicated in FIGS. 29A and 29B, the configuration of the component C providing the composite structure for the cover assembly for the steering wheel assembly may be configured to provide a surface at cover layer TL and cover base TB for presentation of the image IM. See also FIGS. 5A-5C, 7A-7D, 25B-25D and 27A-27C. As indicated in FIGS. 25B and 29A, the cover assembly may comprise an interface between cover base TB and light segment of light module/guide LG projected through in a configuration that is generally uneven (such as with an uneven/interrupted surface, see FIG. 29A) such that a perceptible distortion of image IM as presented may appear. As indicated in FIGS. 25C and 29B, the cover assembly may comprise an interface between cover base TB and light segment of light module/guide LG projected through in an angled configuration such that the surface is generally even (such as with a generally flat/uninterrupted surface, see FIG. 29B) such that any perceptible distortion of image IM as presented may be reduced. See also FIGS. 25D, 27B and 27C.

According to an exemplary embodiment as shown schematically in FIGS. 5A-5C, 7A-7D and 29B, the component/composite structure of the cover structure TS for the steering wheel assembly (or other component) may be configured and formed to provide a generally flat/even surface (e.g. without substantial interruption, variations, etc.) such that any perceptible distortion of the image IM presented by illumination of the light/display module LG from light segments for user interface UI may be reduced (e.g. generally free of perceptible distortion at the display regions). See also FIGS. 25C, 25D, 27B and 27C.

Figure 32A:
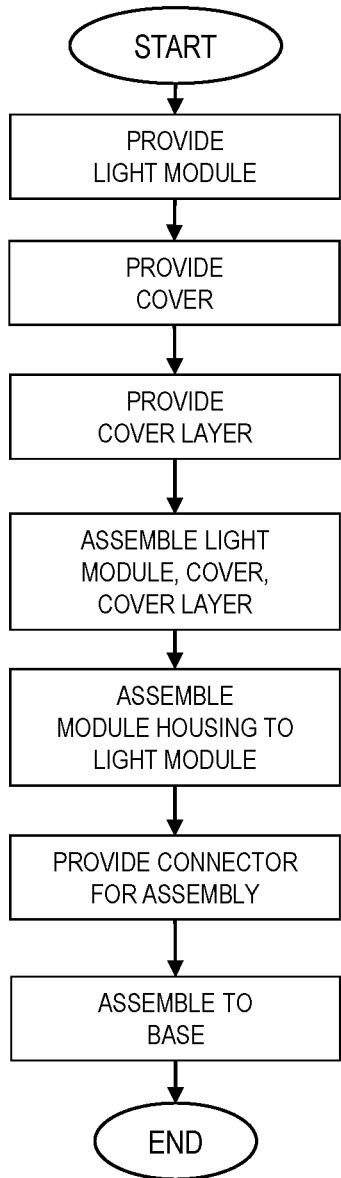
FIGS. 32A through 32C are schematic flow diagrams of a method of constructing/assembling a vehicle interior component according to an exemplary embodiment.
Figure 32B:
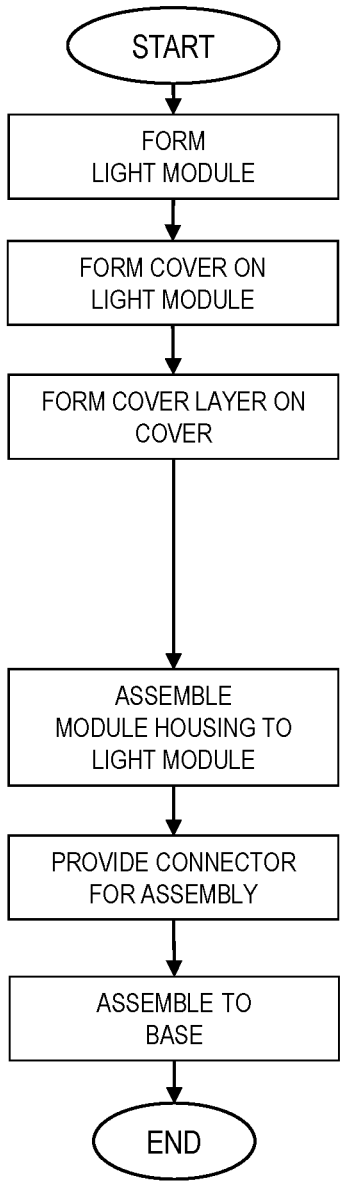
Figure 32C:
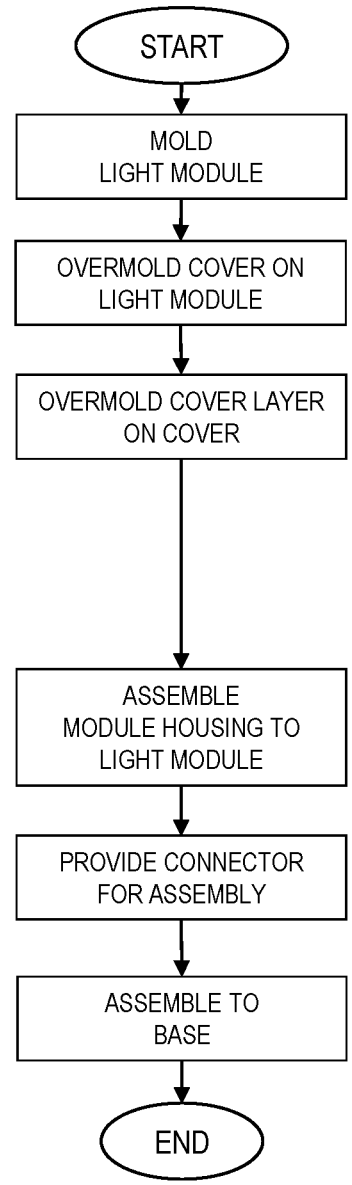
Figure 33A:
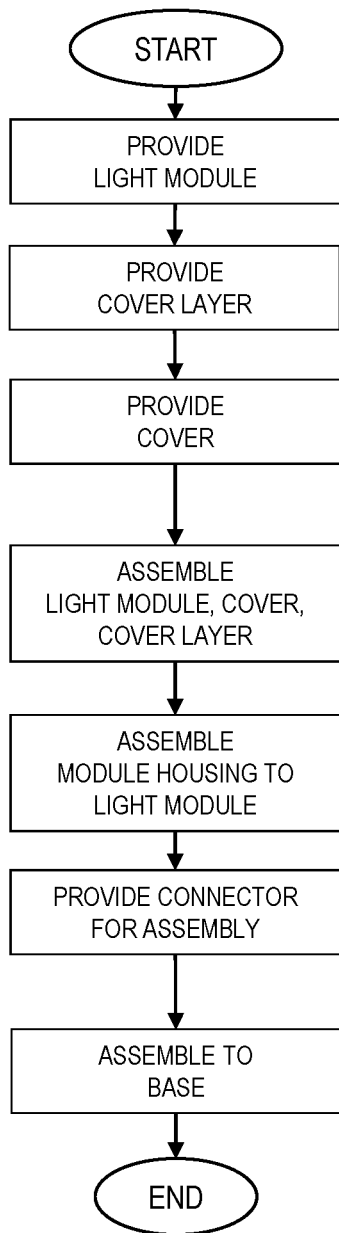
FIGS. 33A through 33C are schematic flow diagrams of a method of constructing/assembling a vehicle interior component according to an exemplary embodiment.
Figure 33B:
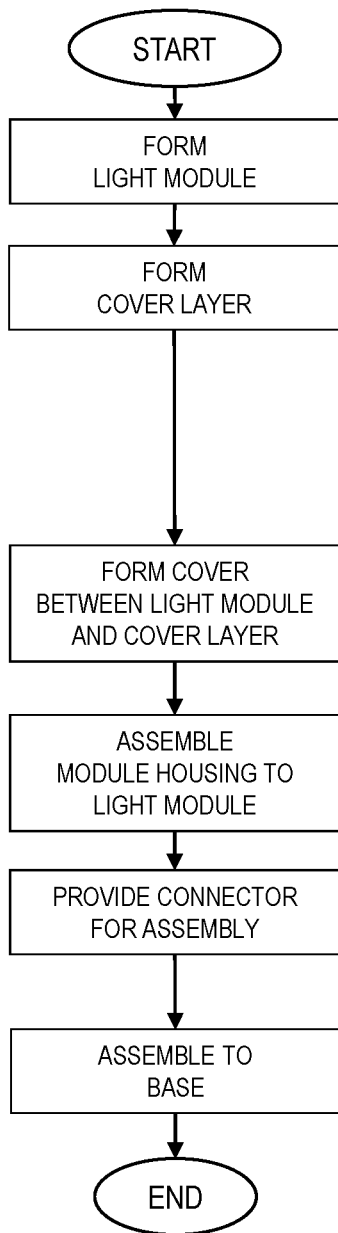
Figure 33C:
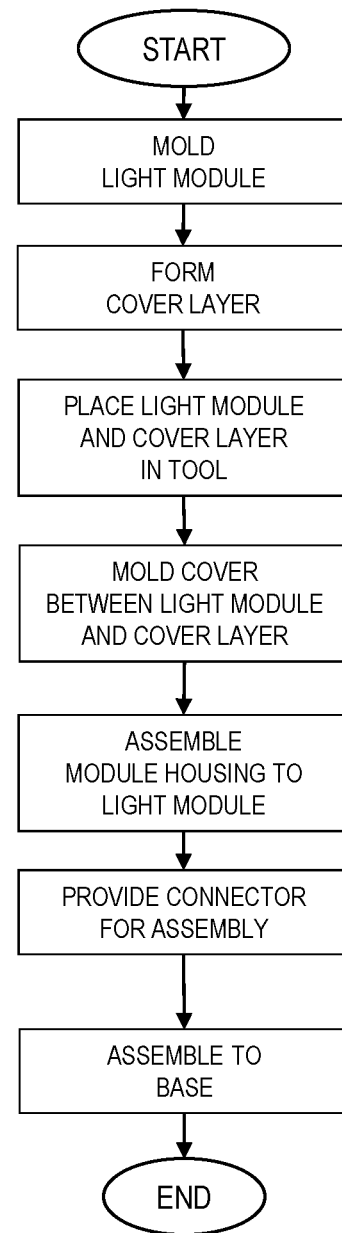
Figure 36A:
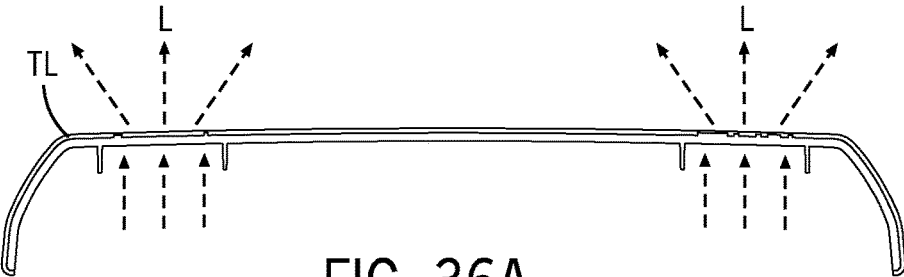
FIG. 36A is a schematic partial section view of a vehicle interior component according to an exemplary embodiment.
Figure 36B:
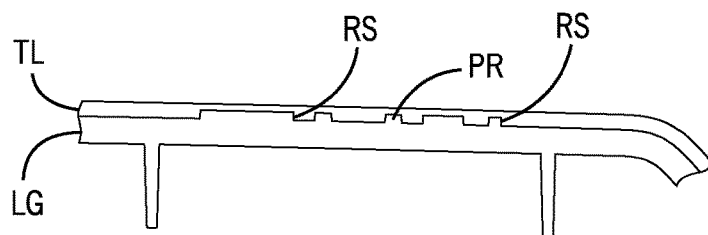
FIGS. 36B and 36C are schematic partial cutaway section views of a vehicle interior component according to an exemplary embodiment.
Figure 36C:
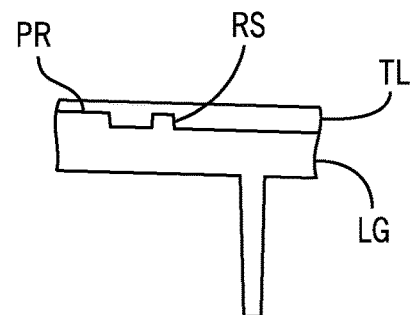
Figure 37A:
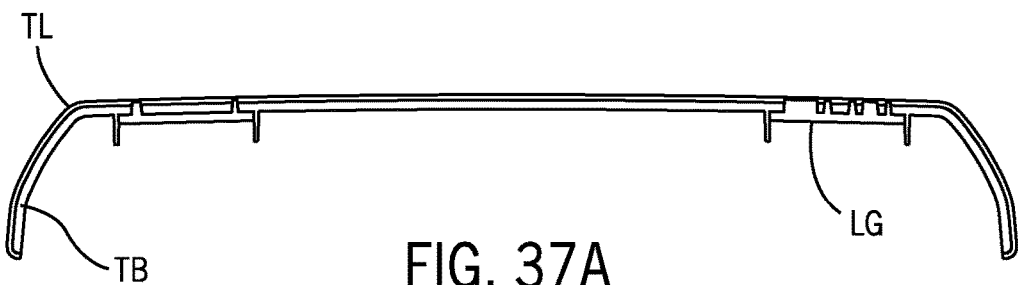
FIG. 37A is a schematic partial section view of a vehicle interior component according to an exemplary embodiment.
Figure 37B:
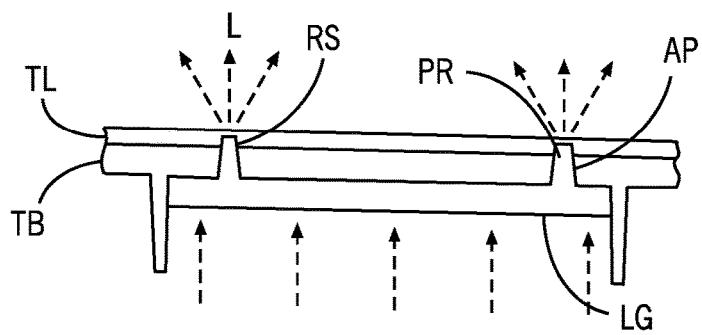
FIG. 37B is a schematic partial cutaway section view of a vehicle interior component according to an exemplary embodiment.
Figure 37C:
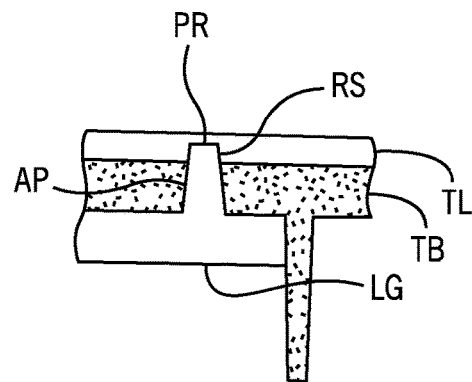
FIG. 37C is a schematic partial cutaway section view of a vehicle interior component according to an exemplary embodiment.

Referring to FIGS. 32A-32C, a method/process for constructing/assembling the steering wheel assembly with composite structure for the cover assembly is shown schematically according to an exemplary embodiment. As indicated schematically in FIGS. 32A-32B, the component shown as steering wheel assembly may be formed/constructed from providing (e.g. forming, molding, assembling, etc.) the light/display module (with projections/light guide segments) and the cover base and the cover layer with a module housing that may be assembled into the base. See also FIGS. 11, 12, 13, 14, 16A-16C, 19A-19D and 23A-23D.

As indicated schematically in FIGS. 32A-32C, the composite structure for the cover assembly of the steering wheel assembly may be formed by a molding process (e.g. injection molding, etc.) with the light module formed and the cover base formed onto the light module (with projected light guide/segments) and the top/cover layer formed/assembled with the module/connectivity in a production sequence (e.g. multi-shot molding process). See also FIGS. 16A-16C and 23A-23D. As indicated schematically according to an exemplary embodiment in FIGS. 11, 12, 13 and 14, the light module may comprise a light-transmissive material (such as polypropylene, etc. that may be formulated to provide a selected level of transparency/transmissibility, color, etc.); the cover layer may comprise a polymer material (such as thermoplastic olefin/TPO, molded material, film/foil, etc.); the cover may comprise a polymer material (such as a thermoplastic elastomer/TPE, resin material, etc.); the housing/sections may comprise a material such as a polymer (e.g. acrylonitrile butadiene styrene/ABS, polycarbonate/PC, resin material, etc.). See also FIGS. 32A-32C. According to an exemplary embodiment the materials of the composite structure and steering wheel assembly may be selected for formation/assembly including by injection molding, etc.; according to an exemplary embodiment, a surface treatment (e.g. printing, painting, etc.) or other finishing/assembly steps may be performed to produce and complete the steering wheel assembly configured to provide the user interface for the vehicle interior. See FIGS. 1B-1C, 5A-5C and 7A-7D.

As shown schematically in FIGS. 1C, 2, 3, 5A-5C, 7A-7D, 8A-8D, 9, 10, 11, 12, 13, 14, 15A-15B, 16A-16C, 18A-18D, 19A-19D, 20A-20D, 21A-21D, 22A-22D and 23A-23D, steering wheel assembly SW may comprise a base B with cover structure TS and a light/display module M for the user interface. As indicated schematically according to an exemplary embodiment, the module M may comprise a light module (providing light guide/segments) and a base plate PL with sensor arrangement SN in a housing H. As indicated schematically according to an exemplary embodiment, the module M may comprise a display panel DP with a light module/guide LG and a base plate PL with sensor arrangement SN in a housing H. As indicated schematically according to an exemplary embodiment, the module M may comprise a fitted bezel arrangement of the light module (e.g. with light guide/projection segments and/or with display panel) and housing (with sensor, etc.) configured to present the image/display region of the user interface for the surface on the cover of the steering wheel assembly.

Exemplary Embodiments—E

According to an exemplary embodiment as indicated schematically in FIGS. 1C-1D, 11, 12, 13, 14, 16C, 19C and 23C a component for a vehicle interior may be configured as a touch vibration feedback device applied to a steering wheel (or other component); the component may comprise a cover structure TS, a module/guide M, a base plate PL, a force sensor SN, a light/display module LG, an actuator AT and a housing H. The cover assembly may be connected to the opening of the upper part of the housing, the cover structure TS may comprise a user operation and control interface. A force sensor and an elastic sheet may be located in the housing. The force sensor may be located on an integrated circuit board. The bottom of the housing may be provided with an upwardly extending cavity for the actuator. The actuator may be fixed to the housing. The actuator may comprise at least one of an electromagnetic coil motor; a linear resonator; a speaker; an eccentric motor; a piezoelectric booster. When a detection value of the system reaches a preset value of the force sensor, the preset value may be the displacement amount or the capacitance threshold. An integrated circuit board may send a signal to the actuator to produce vibration with a certain amplitude and frequency. Vibration may be transmitted to the user interface of the cover, so that the occupant feels vibration.

According to an exemplary embodiment as indicated schematically in FIGS. 1C-1D, 5A-5C and 14, the component may be configured to provide a composite structure that prevents propagation of noise and vibration; the component may comprise an absorber SP. The absorber may comprise a sound insulation part provided at a connection between the inner cover and the cover base of the light module. The absorber may comprise silicone and/or TPU, etc. The absorber may be installed on the cover base of the light module. The absorber may be provided with a plurality of convex points for absorbing assembly tolerance and/or reducing transmission of vibration and noise. One side of the sound insulation part may extend to isolate propagation of vibration to the center of the steering wheel.

Exemplary Embodiments—F

Referring to FIGS. 1A and 1B, a vehicle V is shown schematically with an interior I comprising vehicle interior component C such as a console and/or a door panel DL comprising a user interface system UIS for an occupant of the vehicle. See also FIGS. 1C-1D, 2, 3, 4A, 4B, 6A-6C and 34A (user interface system operation with connectivity to vehicle systems/networks).

As indicated schematically in FIGS. 1B-1D, 6A-6C and 34A, component C may comprise a cover comprising a cover surface T and cover structure TS and user interface system UIS; user interface system UIS may be configured to provide a user interface UI at cover surface T comprising at least one light display presented in a display region (e.g. for output shown as comprising an image IM configured to be illuminated by light L from a light source LS) and at least one input device (for input shown as comprising an operator control/contact such as a switch/button function facilitating interaction through an interface module FN with a contact CT and interface shown as coupling CP with a sensor arrangement with sensor SN); user interface system UIS may be configured to connect to vehicle systems VS and/or a vehicle network N through a control module MC (e.g. powered and connected through connectors shown schematically as wires W). See FIGS. 3, 4A-4B, 34B and 35C.

As indicated schematically in FIGS. 1C, 2, 3, 4A-4B, 6A-6C and 34A, user interface system UIS of the component may connect or comprise electronics/control such as a control module MC configured for interface with vehicle systems and/or for operation of the user interface (e.g. including presentation of image/display, illumination, display, data connectivity, network connection, function of an operator control/interaction, connection to sensors, sensor data, etc.).

As indicated schematically according to an exemplary embodiment in FIGS. 1C, 2, 3, 4A, 4B and 6A-6C, component C with user interface system UIS may be configured to present user interface UI with the light display (e.g. display, illuminated sections and/or regions, etc.) integrated with vehicle systems VS and/or or otherwise to a controller and/or data source or network N (e.g. vehicle network, internet, other networks, etc.) to provide information, indicators, instrumentation, etc. (in a region configured to be illuminated by a light source); in operation the light display may be operated/controlled to present an image IM (such as instrumentation, data, information, etc. presented through an illuminated icon IC) for the occupant of the vehicle at the user interface on the cover surface T of the cover structure TS. See FIGS. 1C, 6A-6C, 35A, 35B, 37A-37C and 38B.

As indicated schematically according to an exemplary embodiment in FIGS. 2, 3, 6B-6C and 36A, component C with user interface system UIS may be configured to present user interface UI with the input device such as an operator control (e.g. arrangement providing a button, touch pad, sensor contact, other functionality, etc.) to facilitate operation/interaction by the occupant of the vehicle with one or more systems (e.g. vehicle systems, vehicle network, etc. and other networks, devices, systems, etc.); in operation the input device may be operated/controlled for interaction through transmit a signal (such as instrumentation, data, information, haptics, etc.) from the occupant of the vehicle at the user interface on the cover surface T of the cover structure TS. See FIGS. 1C, 6A-6C, 35A, 35B, 37A-37C and 38B.

As indicated schematically in FIGS. 6A-6C and 34A, the component C with user interface system UIS may be configured with a user interface on the cover surface T with the light display as an illuminated section with light L providing a display/illuminated image IM (e.g. a light segment/display arrangement of indicators shown as illuminated icons/symbols) and with the input device as a contact area/button (e.g. a section with a mechanical coupling through interface CP with sensor SN).

Exemplary Embodiments—G

As shown schematically in FIGS. 1A and 1B, a vehicle V with a vehicle interior I is shown with a component C such as a console comprising a user interface system UIS. As shown schematically according to an exemplary embodiment in FIGS. 1B-1D, 3, 4A, 4B and 6A-6C, user interface system UIS may be configured to present a user interface UI for interaction by a vehicle operator with vehicle systems VS and/or network N (e.g. including the vehicle network, local network, internet, etc.). As shown schematically in FIGS. 1B-1D, 2, 3, 4A, 4B, 6A-6C, 34B and 35C, the user interface system UIS for component C may be configured to present user interface UI for the vehicle occupant by interaction with a light display and/or an input device connected/powered through a control module MC to vehicle systems VS and/or networks N.

As shown schematically according to an exemplary embodiment in FIGS. 1B, 6A-6C and 35C, user interface system UIS for component C may comprise a housing/base H and a cover shown as comprising a cover structure TS (shown as a composite structure) with a cover base TB and cover layer TL and cover surface T (e.g. exterior surface) where user interface UI is presented. See also FIGS. 34A and 34B (component C with cover structure TS with cover layer TL and cover surface T). As indicated schematically according to an exemplary embodiment in FIGS. 34B, 35B, 35C and 38A, user interface system UIS may comprise a set of structural members each shown as an interface module FM with an enclosure/structure EN (e.g. hollow tube, box, member, assembly, etc.) configured with a light guide LG and a light source (e.g. LED, light panel, etc. for an illuminable icon/display) and with a mechanical interface shown as comprising a contact CT and coupling CP in registration with a sensor arrangement comprising a set of sensors SN (e.g. force sensor, force-sensitive resistor, etc.) configured and connected by connectors W to a control module MC to operate as an operator control (e.g. selector, button, switch, etc. at an illuminable icon/display) at the cover surface T of the cover structure TS. See also FIGS. 6A-6C, 36A-36C, 39A-39B, 40A-40B, 41A-41B, 42A-42B, 43A-43B, 44A-44B, 45A-45B, 46A-46B, 47A-47B, 48A-48B, 49A-49B, 50A-50C and 51A-MB.

As shown schematically according to an exemplary embodiment in FIGS. 35B, 37A-37C and 38A-38B, each interface module FM of the user interface system with structure/enclosure EN may comprise the light guide LG (and light source) with at least one illuminable icon IC (e.g. light-transmitting projection in a shape/form to present the image/display) and the contact/interface CT/CP for engagement with the sensor SN of the sensor arrangement (e.g. a mechanical interface/coupling to facilitate contact with the sensor arrangement/pad). See also FIGS. 4A-4B. As shown schematically in FIGS. 6A-6C, 34A, 34B, 35B and 35C, the component C with user interface system UIS may comprise a set of interface modules FM arranged to present the user interface with light display (e.g. through image/illuminable icons) and with input device (e.g. in contact with sensor arrangement) in any of a variety of arrangements (e.g. installed/assembled within the housing/base and under the cover/surface of the component). See also FIGS. 4A and 4B. (As indicated schematically, the control module for the user interface system may comprise/connect a proximity sensor or other device configured selectively to illuminate the light display with the image for the input device/operator control for a vehicle occupant at the user interface on the surface of the cover, see FIG. 6C.)

As shown schematically according to an exemplary embodiment in FIGS. 6A-6C, the component C may comprise a user interface UI presented at the exterior surface of the cover by user interface system UIS that may be configured to remain "hidden" in an ordinary/default condition (see FIG. 6A) and for a use condition with a light display configured to become illuminated (see FIG. 6B) and with an input device configured to be actuated by a vehicle operator (see FIG. 6C). As indicated schematically in FIGS. 6A-6C, user interface UI presented by user interface system UIS at the surface of the cover in the use condition may comprise the light display illuminated with light L for an image IM transmitted through the light guide LG from the light source LS associated with each operator control/button (see FIG. 6B) and the input device to operate as the operator control at the exterior surface of the cover upon physical actuation by a vehicle occupant through the interface module FM in contact with the sensor arrangement through the interface/coupling CP (see FIG. 6C). See also FIGS. 45A-45B, 46A-46B, 47A-47B and 34A. As indicated schematically according to an exemplary embodiment in FIGS. 6C and 34A, the input device of the user interface system may be configured to operate as a "button" (e.g. push button operator control) through the interface module/structure and contact/interface layer with the sensor arrangement. See also FIGS. 45A-45B, 46A-46B, 47A-47B and 48A-48B. As indicated schematically in FIGS. 4A-4B, 6A-6C, 34A, 34B and 35B, one set or multiple sets of the interface module (with input device and/or light display) providing the user interface at the surface of the cover may be provided for the user interface system of the component.

As shown schematically in FIGS. 34B, 35B and 35C, the light display of user interface system UIS for each interface module FM may comprise a light guide LG on the structure EN with light source LW configured to provide light L (e.g. connected to/actuated by the control module MC); each light guide LG may comprise a projection PR configured to fit within a recess RS and/or aperture AP in cover layer TL of the cover to provide an illuminable image IM visible at/through the exterior surface of the cover when illuminated with light L from light source LS. See also FIGS. 37A, 45A-45B, 46A-46B, 47A-47B, 48A-48B, 49A-49B, 50A-50C and MA-51B. As indicated schematically in FIGS. 34B, 35B, 35C, 37A-37C and 38A-38B, the projection PR for light guide LG may comprise icon IC providing the form/shape for the image to be displayed at the light display of the user interface (e.g. as with each illuminable icon/projection as a light display element configured to be illuminated to present the image for the user interface). See also FIGS. 6A-6C and 34A. As indicated schematically in FIGS. 3, 4A, 4B and 6A-6C, the user interface system UIS for component C with each light display element of the user interface (with associated image/icon and input device) may be connected through the user interface system and control module with a vehicle system and/or network for interaction and/or information presentation for the vehicle operator.

As shown schematically in FIGS. 34B, 35B, 35C and 38A, the input device of user interface system UIS for each interface module FM may comprise a feature shown as a contact CT on the structure EN with an interface layer/coupling CP configured to engage/contact the active area of a sensor SN for the sensor arrangement (and connected to the control module MC); each feature/contact CT may be configured to engage the sensor SN through the interface coupling CP to provide proper operation of an operator control at an input device element (e.g. in a position associated with a light display element) at/through the cover surface T of the cover structure TS. See also FIGS. 6B-6C, 37A, 39A-39B, 40A-40B, 41A-41B, 42A-42B, 43A-43B, 44A-44B, 45A-45B, 46A-46B, 47A-47B, 48A-48B, 49A-49B, 50A-50C and MA-MB. As indicated schematically in FIGS. 3, 4A, 4B and 6A-6C, each input device element of the user interface (with associated light display and sensor contact) may be connected through the user interface system and control module with a vehicle system and/or network for interaction and/or operation presentation for the vehicle operator.

As shown schematically in FIG. 38A, the input device of the user interface system may be configured and constructed to provide intended engagement with the sensor arrangement (e.g. with features, patterns, etc. on the contact and/or interface coupling layer). As indicated schematically in FIGS. 4A, 4B, 38A, 39A-39B, 40A-40B, 41A-41B, 42A-42B, 43A-43B and 44A-44B, the contact/interface CT/CP of the input device may be configured and constructed with a form/shape and pattern/materials intended to optimize the performance (e.g. adjusted/tuned for intended sensitivity, responsiveness, interactivity, efficiency, cost, manufacturability, etc.) of the operator control through the sensor SN (e.g. connected to the control module, vehicle systems, etc.) in operation for the vehicle. As indicated schematically in FIGS. 38A, 39A-39B, 40A-40B, 41A-41B, 42A-42B, 43A-43B and 44A-44B, to provide intended engagement with the sensor arrangement any of a wide variety of configurations/constructions of the contact CT and interface CP of the input device through the interface module to the sensor SN may be employed (e.g. elements CT and/or CP may be formed with a variety of shapes, sizes, patterns and materials); selection of any of a variety of types and shapes/forms of sensor arrangement may also be employed (e.g. with contact/interface surface tuned/calibrated to the sensor configuration, to optimize performance, reduce the number of sensors, improve sensitivity, etc.). As indicated schematically according to an exemplary embodiment, the sensor arrangement and/or housing may comprise a shape/form configured to provide intended engagement with the input device (e.g. with contact/interface surface tuned/calibrated to the sensor configuration). Compare FIG. 35C (sensor arrangement with multi-pad sensors) with FIG. 34B (sensor arrangement with single-pad sensors).

Figure 39A:
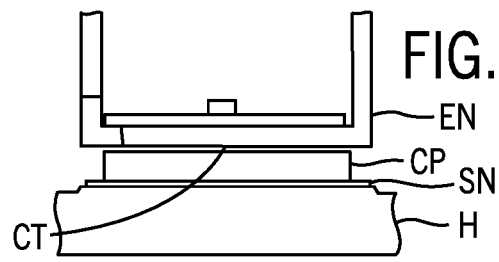
FIG. 39A is schematic cutaway section view of a vehicle interior component according to an exemplary embodiment.
Figure 39B:
FIG. 39B is a schematic partial exploded perspective view of a vehicle interior according to an exemplary embodiment.
Figure 40A:
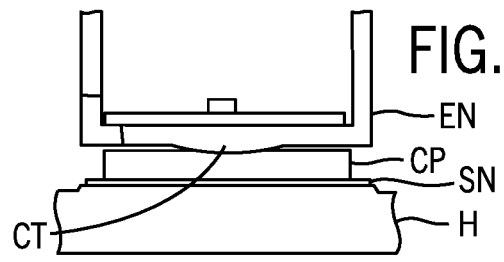
FIG. 40A is schematic cutaway section view of a vehicle interior component according to an exemplary embodiment.
Figure 40B:
FIG. 40B is a schematic partial exploded perspective view of a vehicle interior according to an exemplary embodiment.
Figure 41A:
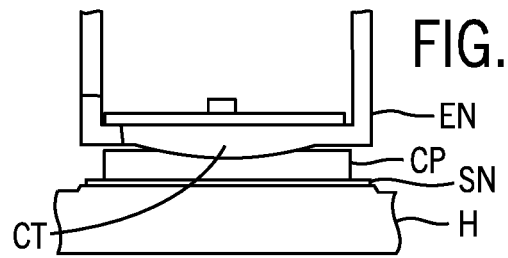
FIG. 41A is schematic cutaway section view of a vehicle interior component according to an exemplary embodiment.
Figure 41B:
FIG. 41B is a schematic partial exploded perspective view of a vehicle interior according to an exemplary embodiment.

As shown schematically in FIGS. 39A-39B, the contact CT may comprise a generally flat surface and the interface layer CP may comprise a generally flat surface to provide contact with the sensor arrangement (e.g. generally even contact); as indicated schematically, the contact CT and/or the interface layer CP may be formed with a pattern on the surface or surfaces (e.g. grid, geometric shape, ridges, etc.) to provide intended engagement with the sensor arrangement.

As shown schematically in FIGS. 40A-40B and 41A-41B, the contact CT may comprise a projection shown as a small curved projection/bump (see FIGS. 40A-40B) or a larger rounded projection/bump (see FIGS. 41A-41B) and the interface layer CP may comprise a generally flat surface to provide contact with the sensor arrangement. See also FIGS. 45A-45B, 47A-47B, 48A-48B and 49A-49B. As indicated schematically in FIGS. 47A-47C and 48A-48C, the contact CT and/or the interface layer CP may be formed with materials of different compressibility/rigidity (e.g. the contact may be formed from a generally rigid plastic material or composite structure and the interface layer may be formed from a generally compressible/foam material or composite structure) to provide intended engagement with the sensor arrangement. As indicated schematically in FIGS. 48A-48C, the interface layer CP may comprise a composite structure with a top layer CPT of a first material (e.g. compressibility and other material properties) and a bottom layer CPB of a second material (e.g. compressibility and other material properties); the materials and form/shape of the composite structure of the interface layer may be configured/selected to provide intended engagement with the sensor arrangement.

Figure 42A:
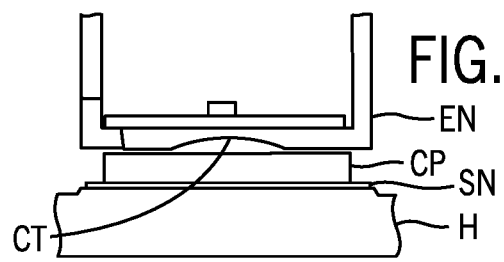
FIG. 42A is schematic cutaway section view of a vehicle interior component according to an exemplary embodiment.
Figure 42B:
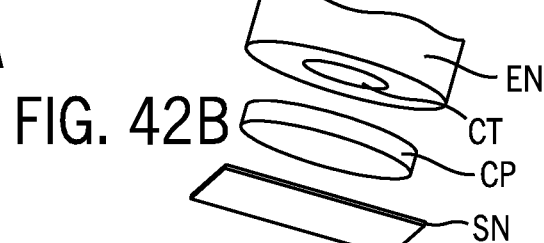
FIG. 42B is a schematic partial exploded perspective view of a vehicle interior according to an exemplary embodiment.

As shown schematically in FIGS. 42A-42B, the contact CT may comprise an indentation pattern shown as a small curved indentation and the interface layer CP may comprise a generally flat surface to provide contact with the sensor arrangement; as indicated schematically, form/shape and construction of the indentation pattern on the contact CT and/or the interface layer CP may be configured to provide intended engagement with the sensor arrangement.

Figure 43A:
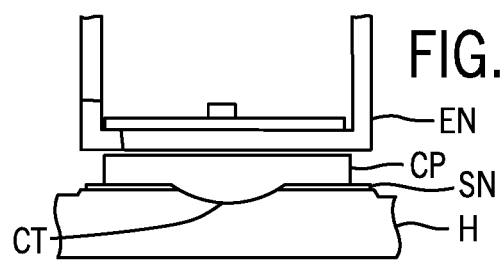
FIG. 43A is schematic cutaway section view of a vehicle interior component according to an exemplary embodiment.
Figure 43B:
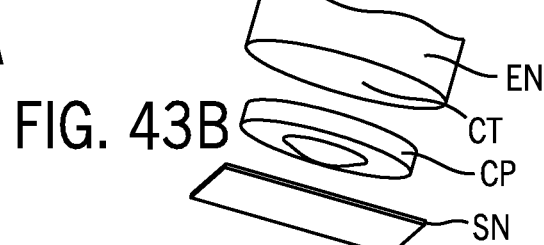
FIG. 43B is a schematic partial exploded perspective view of a vehicle interior according to an exemplary embodiment.

As shown schematically in FIGS. 43A-43B, the contact CT may comprise a generally flat surface and the interface layer CP may comprise a projection shown as a small curved projection/bump and to provide contact with the sensor arrangement; as indicated schematically, the contact CT and/or the interface layer CP may be formed with materials of different compressibility/rigidity (e.g. the interface layer may be formed from a generally rigid plastic material and the contact may be formed from a generally compressible material) to provide intended engagement with the sensor arrangement.

Figure 44A:
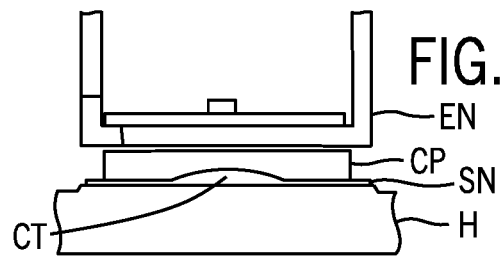
FIG. 44A is schematic cutaway section view of a vehicle interior component according to an exemplary embodiment.
Figure 44B:
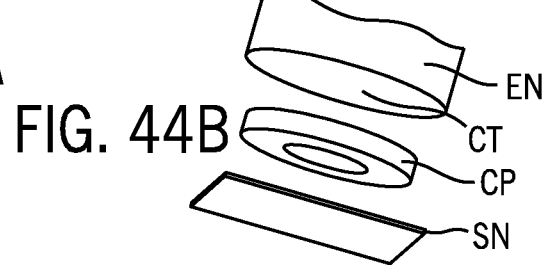
FIG. 44B is a schematic partial exploded perspective view of a vehicle interior according to an exemplary embodiment.
Figure 45A:
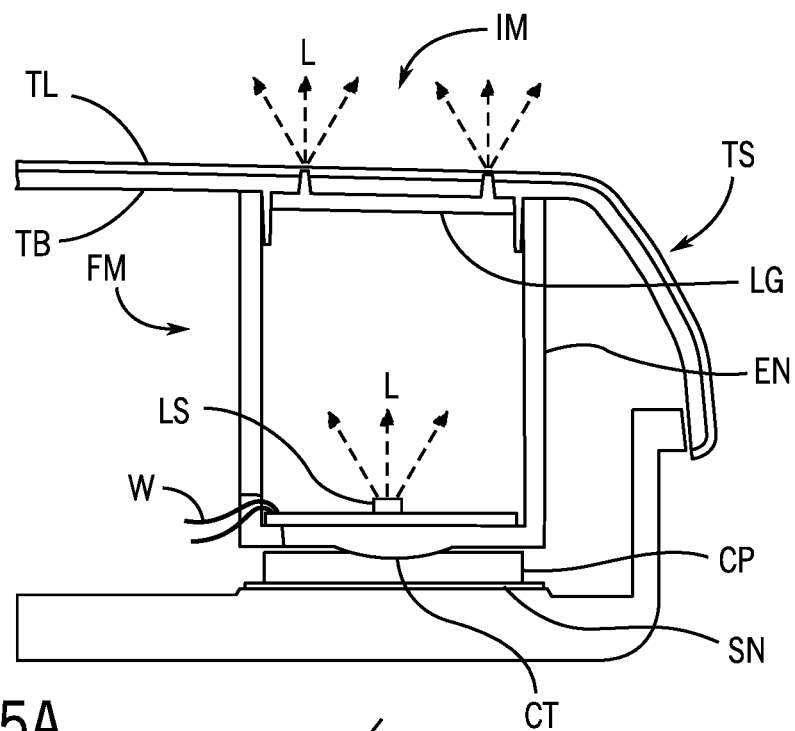
FIGS. 45A and 45B are schematic cutaway section views of a vehicle interior component according to an exemplary embodiment.
Figure 45B:
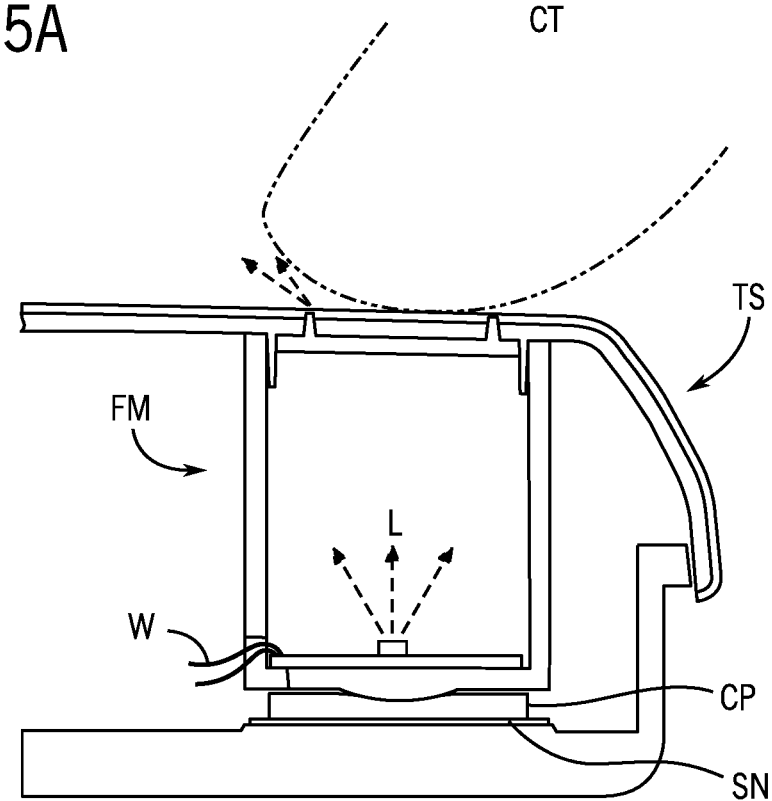
Figure 46A:
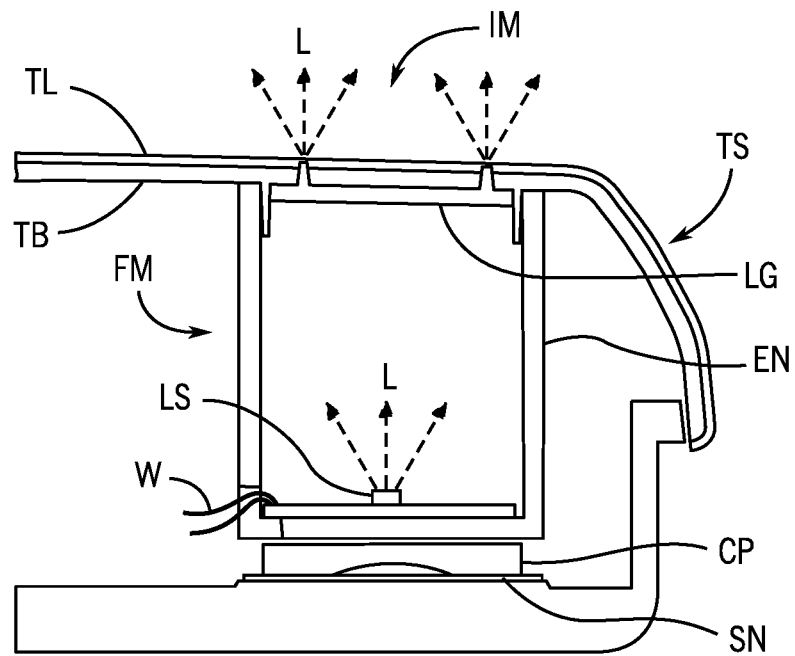
FIGS. 46A and 46B are schematic cutaway section views of a vehicle interior component according to an exemplary embodiment.
Figure 46B:
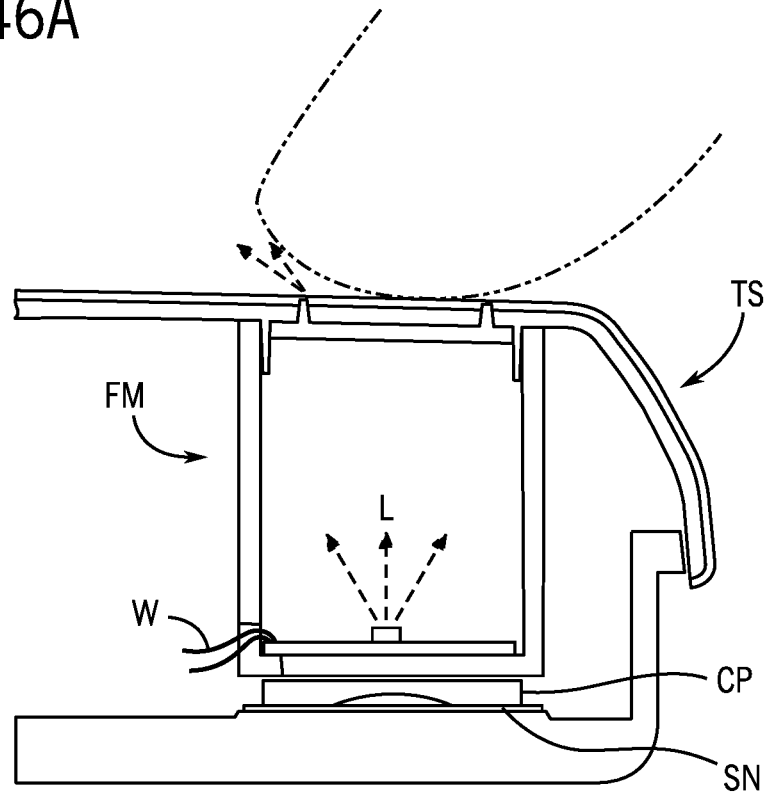
Figure 47A:
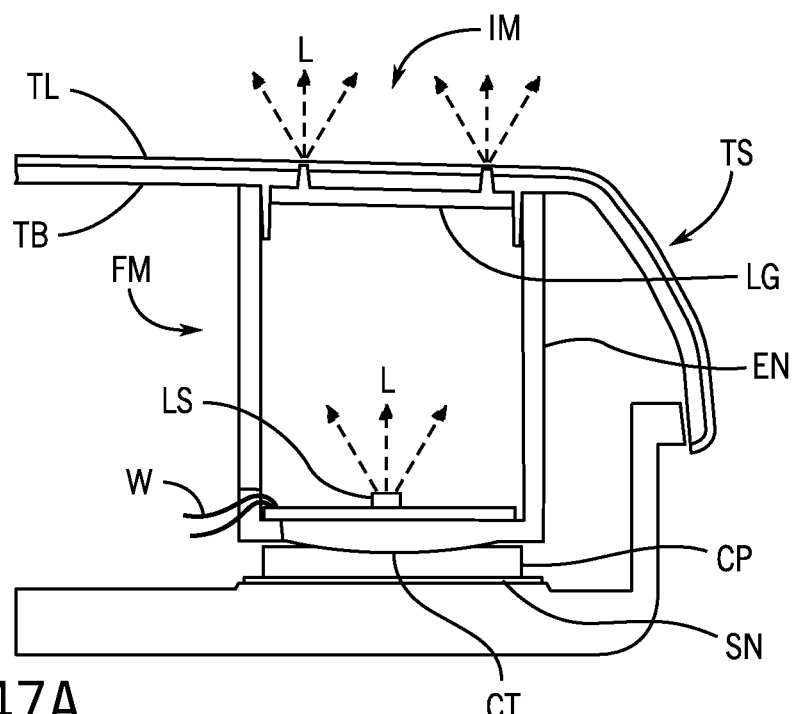
FIGS. 47A and 47B are schematic cutaway section views of a vehicle interior component according to an exemplary embodiment.
Figure 47C:
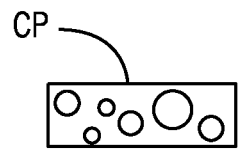
FIG. 47C is a schematic partial cutaway section view of a vehicle interior component according to an exemplary embodiment.
Figure 47B:
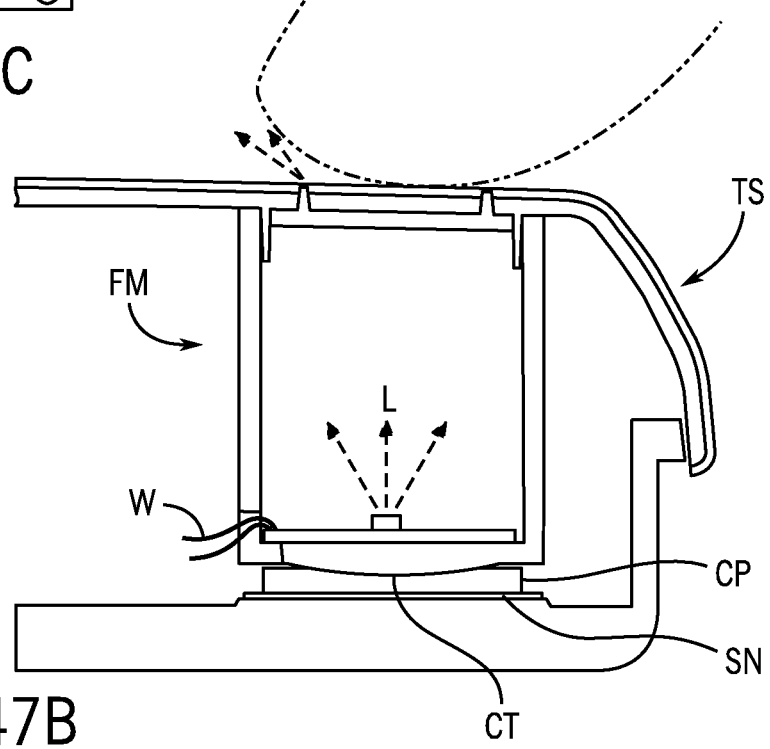

As shown schematically in FIGS. 44A-44B, the contact CT may comprise a generally flat surface and the interface layer CP may comprise an indentation pattern shown as a small curved indentation to provide contact with the sensor arrangement; as indicated schematically, form/shape and construction of the indentation pattern on the interface layer CP and/or the contact CT may be configured to provide intended engagement with the sensor arrangement. See also FIGS. 46A-46B.

As shown schematically according to an exemplary embodiment in FIGS. 45A-45B, 46A-46B, 47A-47B, 48A-48B and 49A-49B, the user interface system presenting the user interface at the cover of the component operates through interface module FM with structure EN to provide the light display to present an image IM at/through the cover surface T (with light L from light source LS through light guide LG) and to provide the input device as an operator control/button for the vehicle operator (with contact/interface CT/CP to engaging the sensor arrangement). See also FIGS. 3, 4A, 4B, 6A-6C and 34A (system connectivity/network). As indicated schematically according to an exemplary embodiment in FIGS. 34A-34B, 35B-35C, 36A-36C, 37A-37C, 45A-45B, 46A-46B, 47A-47B, 48A-48B, 49A-49B, 50A-50C and MA-MB, the light guide LG may comprise a light-transmissive material such as a translucent/transparent plastic material (or the like) to transmit light from the light source LS through the cover to the exterior surface as light L for the light display providing image IM (e.g. perceptible/visible to the vehicle occupant). See also FIGS. 6B-6C.

As shown schematically in FIGS. 34A, 35B, 36A-36C, 37A-37C, 45A-45B, 46A-46B, 47A-47B and 48A-48B, the light display may comprise the light guide LG with projections PR fit into apertures AP and/or recesses RS in the cover layer TL to present light L for the image IM at the exterior surface of the cover (with variations in material selection and/or thickness and/or size to adjust relative visibility of the light). As indicated schematically in FIGS. 49A-49B, 50A-50C and 51A-51B, the light display may comprise a mask comprising a mask layer MK (e.g. opaque/light-absorbing/blocking material, film, coating, application, deposited material, surface treatment, etc.) intended to adjust or enhance the visibility (e.g. contrast, intensity, relative amplitude, etc.) of the image/icon provided by light L at the exterior surface of the cover. As indicated schematically in FIGS. 49A-49B, 50A and 51A, the mask layer MK may be applied on the underside of the light guide LG. As indicated schematically in FIGS. 50B and 51B, the mask layer MK may be applied on the top side of the light guide LG. As indicated schematically in FIGS. 50B and 51B, the mask layer MK may be applied on the top side of the light guide LG. As indicated schematically in FIG. 50C, the mask layer MK may be applied within the cover structure TS of the cover (e.g. on the cover layer TL). As indicated schematically in FIGS. 49A-49B, 50A-50C and 51A-51B, the mask may be applied in a pattern (e.g. with openings, etc.) intended to correspond to the configuration of projections and recesses/apertures for the light display or otherwise to enhance the presentation of the light display comprising the light transmitted through the cover structure for the icon/image on the surface of the cover.

Exemplary Embodiments—Process/Method of Assembly of Component

As shown schematically according to an exemplary embodiment in FIGS. 52A-52C and 53A-53C, a process/method may comprise the assembly of the vehicle interior component comprising a user interface system with light guide and interface module into a housing/base with a cover comprising a cover structure with cover surface and cover layer and/or cover base. See also FIGS. 34B and 35C.

Figures 52A, 52B, 52C:
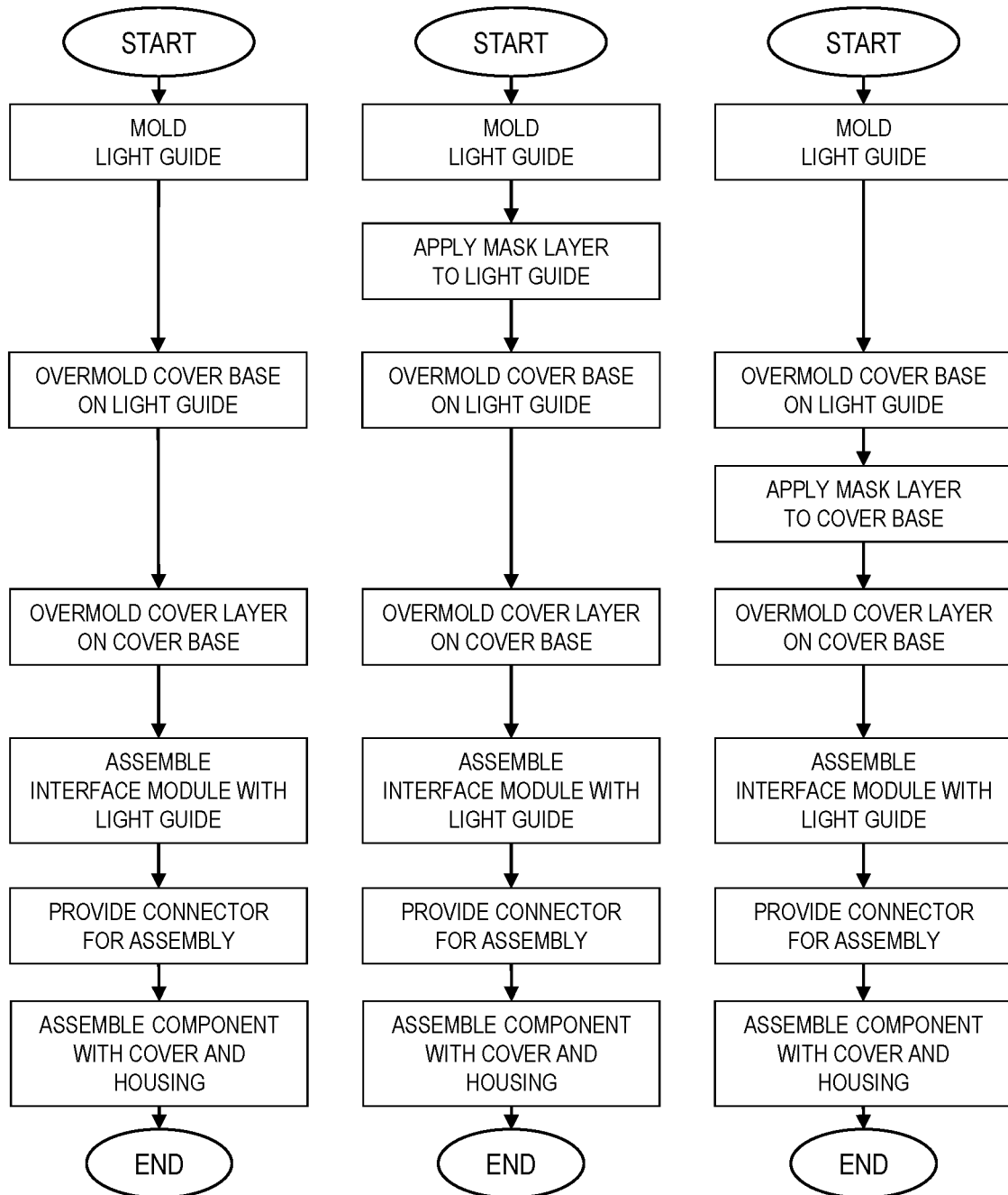
FIGS. 52A through 52C are schematic flow diagrams of a method of constructing/assembling a vehicle interior component according to an exemplary embodiment.

Referring to FIG. 52A, a process for producing a vehicle interior component is shown schematically as comprising a series of steps according to an exemplary embodiment. The process may comprise molding a light guide, overmolding a cover base on the light guide, overmolding a cover layer on the cover base, assembling an interface module to the light guide, providing a connector and assembling the component with base/housing and cover.

Referring to FIG. 52B, a process for producing a component is shown schematically as comprising a series of steps according to an exemplary embodiment. The process may comprise molding a light guide, applying a mask layer on the light guide, overmolding a cover base on the light guide, overmolding a cover layer on the cover base, assembling an interface module to the light guide, providing a connector and assembling the component with base/housing and cover.

Referring to FIG. 52C, a process for producing a vehicle interior component is shown schematically as comprising a series of steps according to an exemplary embodiment. The process may comprise molding a light guide, overmolding a cover base on the light guide, the cover; overmolding a cover layer on the cover base, assembling an interface module to the light guide, providing a connector and assembling the component with base/housing and cover.

Figure 53A:
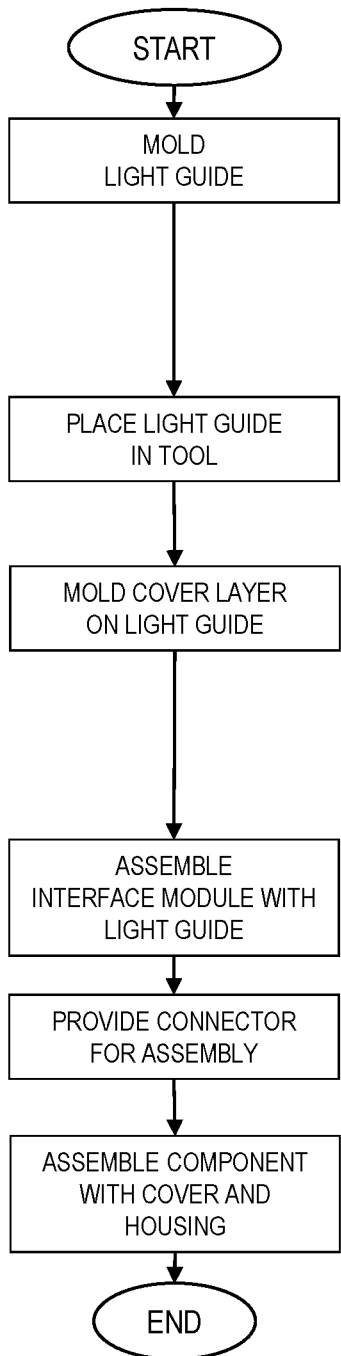
FIGS. 53A through 53C are schematic flow diagrams of a method of constructing/assembling a vehicle interior component according to an exemplary embodiment.

Referring to FIG. 53A, a process for producing a vehicle interior component is shown schematically as comprising a series of steps according to an exemplary embodiment. The process may comprise molding a light guide, placing the light guide in tool, molding a cover layer on the light guide, assembling an interface module to the light guide, providing a connector and assembling the component with base/housing and cover.

Figure 53B:
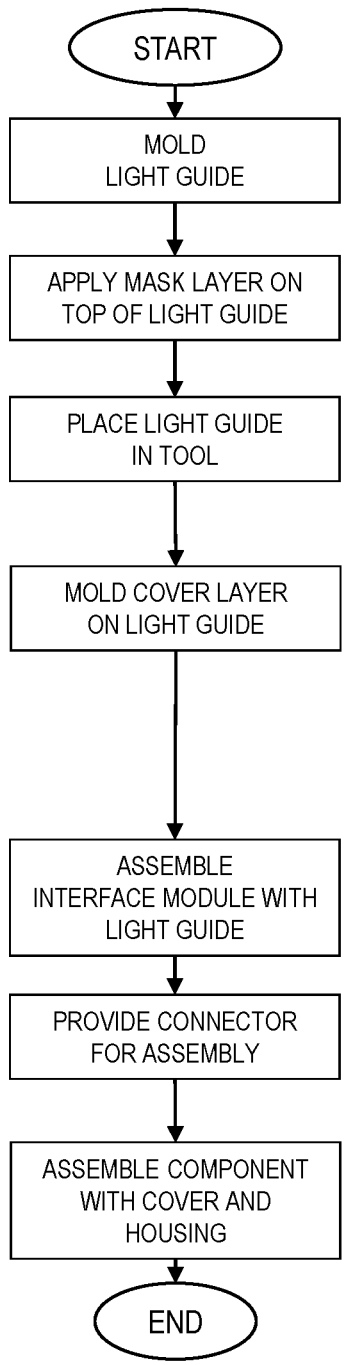

Referring to FIG. 53B, a process for producing a vehicle interior component is shown schematically as comprising a series of steps according to an exemplary embodiment. The process may comprise molding a light guide, applying a mask layer on a top side of the light guide, placing the light guide in tool, molding a cover layer on the light guide, assembling an interface module to the light guide, providing a connector and assembling the component with base/housing and cover.

Figure 53C:
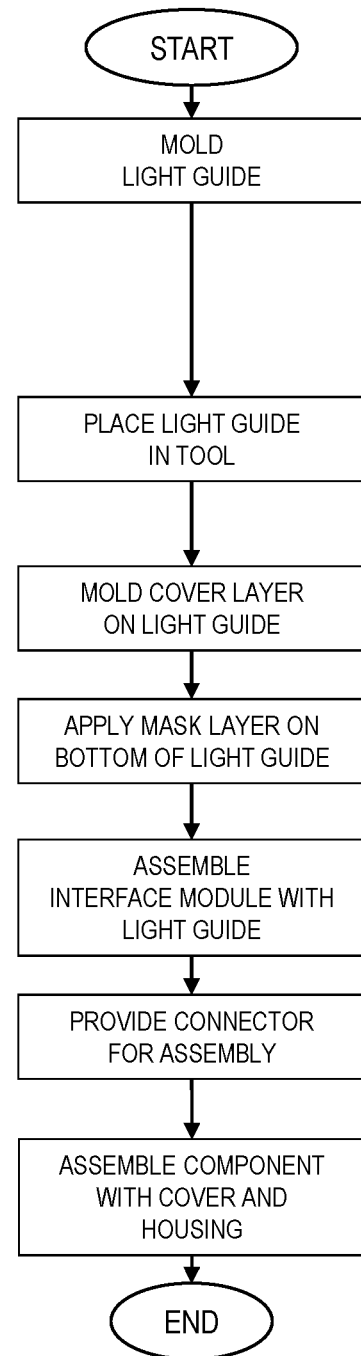

Referring to FIG. 53C, a process for producing a vehicle interior component is shown schematically as comprising a series of steps according to an exemplary embodiment. The process may comprise molding a light guide, placing the light guide in tool, molding a cover layer on the light guide, applying a mask layer on a bottom side of the light guide, assembling an interface module to the light guide, providing a connector and assembling the component with base/housing and cover.

TABLE

REFERENCE SYMBOL LIST

| ELEMENT, PART OR COMPONENT | REFERENCE SYMBOL |
|---|---|
| Vehicle | V |
| Interior | I |
| vehicle interior component | C |
| vehicle systems | VS |
| network/vehicle network | N |
| door panel | DL |
| floor console | FC |
| instrument panel | IP |
| arm rest | AR |
| steering wheel | SW |
| Spokes | SK |
| Base | B |
| Housing | H |
| control module | MC |
| Module | M |
| connector | W |
| user interface system | UIS |
| user interface | UI |
| interface module | FM |
| Image | IM |
| instrumentation region | IR |

TABLE-continued

REFERENCE SYMBOL LIST

| ELEMENT, PART OR COMPONENT | REFERENCE SYMBOL |
|---|---|
| decorative region | DR |
| display panel | DP |
| absorber | SP |
| Icon | IC |
| cover structure | TS |
| cover surface | T |
| cover layer | TL |
| cover base | TB |
| mask layer | MK |
| light guide | LG |
| Light source | LS |
| LED/LED array | LED |
| projection | PR |
| depression recess | RS |
| Aperture | AP |
| Actuator/transducer | AT |
| interface module | FM |
| Contact | CT |
| Coupling layer | CP |
| top layer | CPT |
| bottom layer | CPB |
| Sensor/sensor arrangement | SN |
| Plate | PL |

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

The invention claimed is:

1. A vehicle interior component configured to provide a user interface system comprising at least one sensor and at least one light source and configured to provide a user interface for interaction with a vehicle occupant in a vehicle providing at least one vehicle system comprising:
   (a) a cover configured to present the user interface for the vehicle occupant;
   (b) a sensor configured to detect input from the vehicle occupant at or adjacent to the cover;
   (c) a mechanical coupling; and
   (d) an interface module comprising an enclosure; and
   (e) a light guide formed from a resin material;
   wherein the light guide comprises a projection configured to fit within a recess in an inner surface of the cover;
   wherein the projection of the light guide comprises an icon configured to be illuminated by the at least one light source;
   wherein the enclosure is configured to enclose and support a light source for the user interface;
   wherein the mechanical coupling is configured to transmit force at the user interface to the sensor;
   wherein the user interface for the vehicle occupant comprises (1) a light display from at least one light source of the user interface system and (2) an input device connected to at least one sensor of the user interface system;
   wherein the mechanical coupling comprises a compressible material configured to compress in response to force at the user interface;
   wherein the input device of the user interface is configured to be actuated though the enclosure of the interface module when force is provided to press the mechanical coupling to transmit force to the sensor; and
   wherein the cover is configured so that the input device of the user interface is to remain hidden under the cover unless illuminated by the at least one light source.

2. The component of claim 1 wherein the cover comprises a polymer material; wherein the projection of the light guide is configured to be illuminated to become visible through the cover when the at least one light source is turned on.

3. The component of claim 1 further comprising an interface configured to move from a default position to a depressed position to compress the mechanical coupling.

4. The component of claim 1 wherein the mechanical coupling comprises at least one of (a) urethane; (b) silicone; (c) foam; (d) a top layer; (e) a bottom layer; (f) a top layer and a bottom layer.

5. The component of claim 1 wherein the cover is configured to prevent visibility of the icon when the at least one light source is turned off.

6. A vehicle interior component configured to provide a user interface system comprising at least one light source and configured to provide a user interface for interaction with a vehicle occupant in a vehicle providing at least one vehicle system comprising:
- (a) a cover configured to present the user interface for the vehicle occupant;
- (b) a light guide configured to allow transmission of light from the at least one light source to the light display for the user interface wherein the user interface for the vehicle occupant comprises (1) a light display from at least one light source of the user interface system and (2) an input device connected to at least one sensor of the user interface system;

wherein the cover is configured to cover the light guide;

wherein the light guide comprises a projection and the cover comprises a recess;

wherein the recess comprises a depression in an inner surface of the cover; and wherein the projection of the light guide comprises a light-transmissive resin material that extends into the depression of the recess in the inner surface of the cover;

wherein the projection of the light guide is configured to fit within the recess in the inner surface of the cover;

wherein the projection of the light guide comprises an icon configured (a) to be presented at the user interface when illuminated by the at least one light source; and (b) to be hidden by the cover when the at least one light source is turned off.

7. The component of claim 6 wherein the cover is molded on the light guide.

8. The component of claim 6 wherein the inner surface of the cover is coupled to the projection of the light guide.

9. The component of claim 6 wherein the projection of the light guide is configured to present an image comprising the icon when illuminated by the at least one light source.

10. The component of claim 6 wherein the cover comprises an injection molded thermoplastic elastomer.

11. The component of claim 6 further comprising a button; wherein the cover is configured to prevent visibility of the button when the at least one light source is off.

12. The component of claim 11 wherein the light guide with the projection is configured to present an image for the button comprising an icon configured to be illuminated when the at least one light source is turned on.

13. A component for a vehicle interior configured to present a user interface comprising an input device for interaction with an occupant of the vehicle comprising at illumination from at least one light source comprising:
- a composite structure comprising a cover and a module;
- wherein the cover comprises a surface;
- wherein the module comprises an integrated light guide;
- wherein the light guide of the module is configured to allow transmission of light from the at least one light source to the surface of the cover to present the user interface;
- wherein the light guide of the module is configured to present a light display for the user interface;
- wherein the light source is configured to provide illumination to the light display for the user interface;
- wherein the module comprises a projection and the cover comprises a recess;
- wherein the recess comprises a depression in an inner surface of the cover;
- wherein the projection of the module comprises a light-transmissive resin material that extends into the depression in the inner surface of the cover;
- wherein the projection of the module comprises an icon configured to fit within the recess in the inner surface of the cover;
- wherein the icon is configured (a) to be presented at the user interface when illuminated by the at least one light source; and (b) to be hidden by the cover when the at least one light source is turned off.

14. The component of claim 13 wherein the light guide is formed from a resin material.

15. The component of claim 13 wherein the cover is configured to cover the light guide of the module; wherein the cover is configured to prevent visibility of the icon at the surface of the cover until the light guide is illuminated by the at least one light source.

16. The component of claim 13 further comprising a cover assembly comprising the cover.

17. The component of claim 13 wherein the projection comprises a height and the cover comprises a thickness; wherein the thickness is generally greater than the height.

18. The component of claim 13 wherein the module comprises a light module.

19. The component of claim 13 wherein the module is integrally formed with the light guide.

20. The component of claim 13 wherein the module comprises an absorber configured to at least one of (a) absorb sound; (b) absorb vibration; and/or (c) absorb assembly tolerance.

* * * * *